(12) United States Patent
Takahashi

(10) Patent No.: US 7,030,965 B2
(45) Date of Patent: Apr. 18, 2006

(54) CATADIOPTRIC SYSTEM AND EXPOSURE DEVICE HAVING THIS SYSTEM

(75) Inventor: Tomowaki Takahashi, Yokohama (JP)

(73) Assignee: Nikon Corporation, Tokyo (JP)

( * ) Notice: Subject to any disclaimer, the term of this patent is extended or adjusted under 35 U.S.C. 154(b) by 73 days.

(21) Appl. No.: 10/399,716

(22) PCT Filed: Oct. 23, 2001

(86) PCT No.: PCT/JP01/09266

§ 371 (c)(1),
(2), (4) Date: Jun. 12, 2003

(87) PCT Pub. No.: WO02/35273

PCT Pub. Date: May 2, 2002

(65) Prior Publication Data

US 2004/0130806 A1 Jul. 8, 2004

(30) Foreign Application Priority Data

Oct. 23, 2000 (JP) ........................... 2000-322068
Jan. 11, 2001 (JP) ........................... 2001-003200
Oct. 5, 2001 (JP) ........................... 2001-309516

(51) Int. Cl.
G03B 27/54 (2006.01)
G02B 17/00 (2006.01)

(52) U.S. Cl. ..................... 355/67; 355/366; 355/726

(58) Field of Classification Search .......... 359/366, 359/726, 730, 733, 754, 784, 838, 850, 861; 355/67
See application file for complete search history.

(56) References Cited

U.S. PATENT DOCUMENTS

| | | | |
|---|---|---|---|
| 4,861,148 A | 8/1989 | Sato et al. | |
| 5,515,207 A | 5/1996 | Foo | |
| 5,559,338 A | 9/1996 | Elliott et al. | |
| 5,636,066 A | 6/1997 | Takahashi | |
| 5,717,518 A | 2/1998 | Shafer et al. | |
| 5,805,334 A | 9/1998 | Takahashi | |
| 5,815,310 A | 9/1998 | Williamson | |
| 5,861,997 A | 1/1999 | Takahashi | |
| 5,999,310 A | 12/1999 | Shafer et al. | |
| 6,097,537 A | 8/2000 | Takahashi et al. | |
| 6,157,498 A | 12/2000 | Takahashi | |
| 6,169,627 B1 | 1/2001 | Schuster | |
| 6,172,825 B1 | 1/2001 | Takahashi | |
| 6,213,610 B1 | 4/2001 | Takahashi et al. | |
| 6,302,548 B1 | 10/2001 | Takahashi et al. | |
| 6,512,631 B1 | 1/2003 | Shafer et al. | |

(Continued)

FOREIGN PATENT DOCUMENTS

| | | |
|---|---|---|
| EP | 0 452 963 A2 | 10/1991 |
| EP | 0 779 528 A2 | 6/1997 |
| EP | 1 035 445 A2 | 9/2000 |
| EP | 1 059 550 A1 | 12/2000 |
| EP | 1 098 215 A1 | 5/2001 |
| EP | 1 069 448 B1 | 3/2003 |
| JP | A 2001-228401 | 8/2001 |

Primary Examiner—Rodney Fuller
(74) Attorney, Agent, or Firm—Oliff & Berridge PLC

(57) ABSTRACT

A catadioptric system includes: a first image forming optical system that includes at least two reflecting mirrors and forms a first intermediate image of a first plane with light originating from the first plane; a second image forming optical system that includes at least two reflecting mirrors and forms a second intermediate image of the first plane with light having traveled via the first image forming optical system; and a refractive type of third image forming optical system that forms a final image of the first plane onto a second plane with light having traveled via the second image forming optical system, and optical members constituting the first image forming optical system, the second image forming optical system and the third image forming optical system are all disposed along a single linear optical axis.

34 Claims, 27 Drawing Sheets

U.S. PATENT DOCUMENTS

| | | |
|---|---|---|
| 6,600,608 B1 | 7/2003 | Shafer et al. |
| 6,636,350 B1 * | 10/2003 | Shafer et al. ............... 359/366 |
| 6,842,298 B1 | 1/2005 | Shafer et al. |
| 2001/0002155 A1 | 5/2001 | Takahashi et al. |
| 2002/0012100 A1 * | 1/2002 | Shafer ........................ 353/30 |
| 2002/0024741 A1 * | 2/2002 | Terasawa et al. ........... 359/627 |
| 2002/0176063 A1 | 11/2002 | Omura |
| 2003/0197922 A1 * | 10/2003 | Hudyma .................... 359/359 |

* cited by examiner

FIG. 5
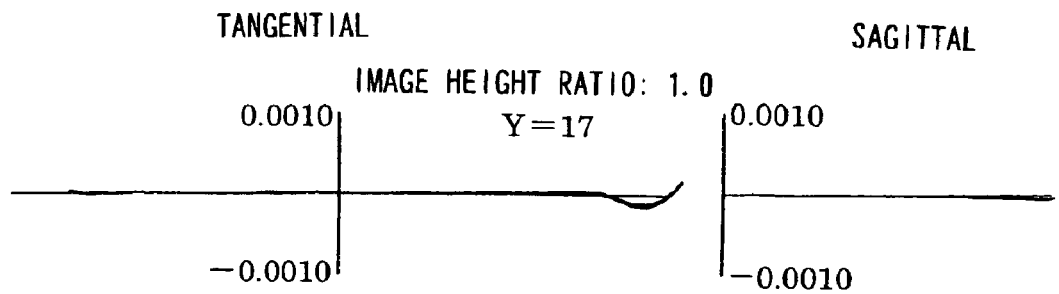
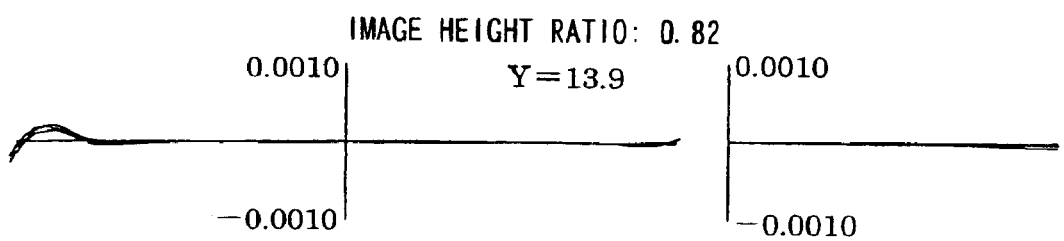
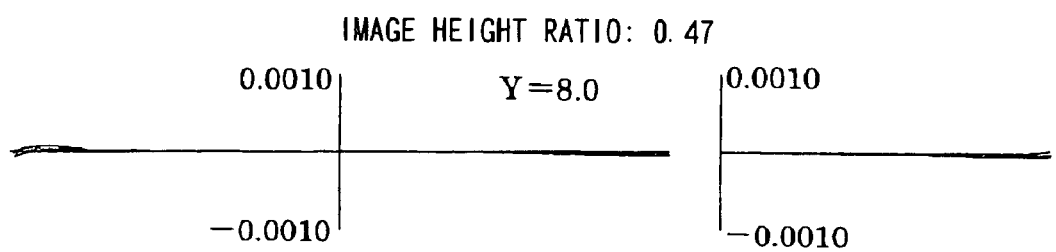
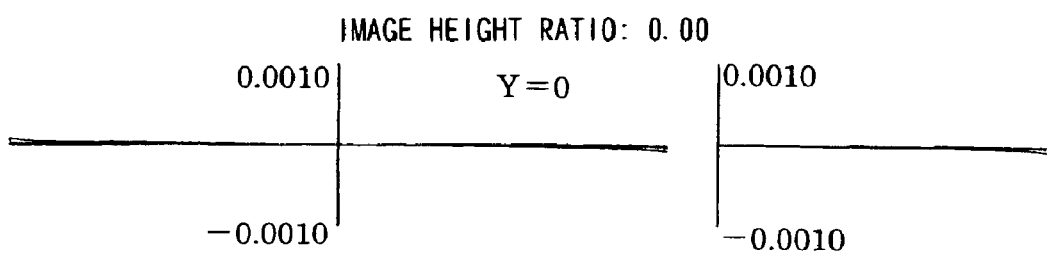

FIG. 9
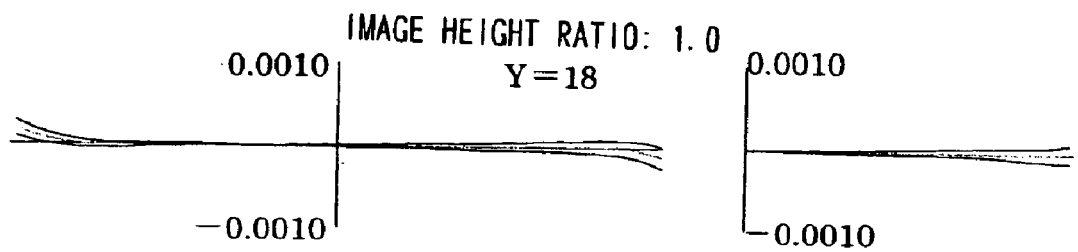
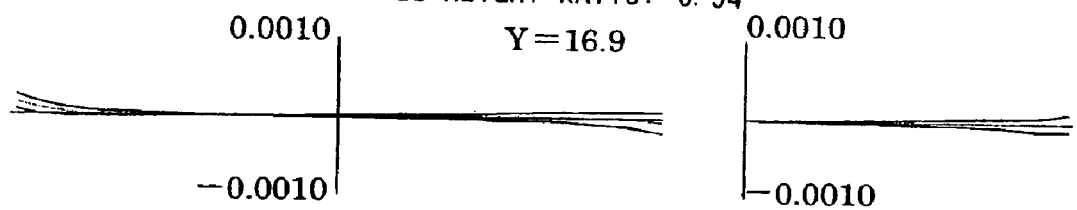
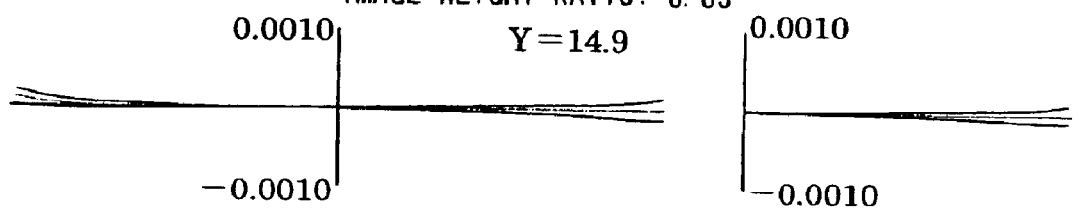
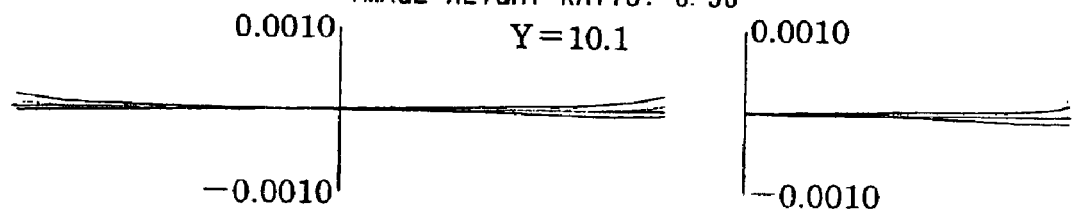

FIG. 16

TANGENTIAL　　　　　　　　　　　　　　　SAGITTAL

IMAGE HEIGHT RATIO: 1.0
Y=18

IMAGE HEIGHT RATIO: 0.98
Y=17.6

IMAGE HEIGHT RATIO: 0.94
Y=16.9

IMAGE HEIGHT RATIO: 0.83
Y=14.9

——————— 157.6003nm
——————— 157.6nm
——————— 157.5997nm

CATADIOPTRIC SYSTEM AND EXPOSURE DEVICE HAVING THIS SYSTEM

The disclosures of the following priority applications are herein incorporated by reference: Japanese Patent Application No. 2000-322068 filed Oct. 23, 2000; Japanese Patent Application No. 2001-003200 filed Jan. 11, 2001; and Japanese Patent Application No. 2001-309516 filed Oct. 5, 2001.

TECHNICAL FIELD

The present invention relates to a catadioptric system and an exposure apparatus having this catadioptric system and, more specifically, it relates to a high resolution catadioptric type projection optical system ideal in an application in an exposure apparatus which is employed when manufacturing semiconductor elements or the like through a photolithography process.

BACKGROUND ART

As further miniaturization is pursued with increasing vigor in the field of semiconductor production and semiconductor chip substrate production today, the projection optical system in an exposure apparatus that prints patterns needs to achieve higher resolution. The wavelength of the exposure light must be reduced and the NA (numerical aperture at the projection optical system) must be increased to raise the resolution. However, since light absorption becomes a factor that needs to be taken into consideration, only limited types of optical glass can be utilized in practical application in conjunction with exposure light with small wavelengths. For instance, if the wavelength is 180 nm or less, only fluor can be utilized as glass material in practical application.

In such a situation, if the projection optical system is constituted by using refractive optical members (lenses, plane parallel plates, etc.) alone, it is impossible to correct any chromatic aberration with the refractive projection optical system. In other words, it is extremely difficult to constitute a projection optical system achieving the required resolution with refractive optical members alone. In response, attempts have been made to constitute a projection optical system with reflective optical members, i.e., reflecting mirrors, alone.

However, the reflective projection optical system achieved by using reflective optical members alone is bound to become large. In addition, aspherical reflecting surfaces must be formed. It is to be noted that it is extremely difficult to form a high precision aspherical reflecting surface in the actual manufacturing process. Accordingly, various so-called catadioptric reducing optical systems achieved by using refractive optical members constituted of both optical glass that can be used in conjunction with exposure light with small wavelengths and reflecting mirrors, have been proposed.

Among these catadioptric systems, there is a type of catadioptric system that forms an intermediate image only once by using a single concave reflecting mirror. In such a catadioptric system, the optical system portion for reciprocal paths, of which the concave reflecting mirror is a component, only includes negative lenses and does not have any refractive optical member with positive power. As a result, light enters the concave reflecting mirror as a wide light flux, which requires that the concave reflecting mirror have a large diameter.

In particular, when the optical system portion for reciprocal paths having the concave reflecting mirror adopts a completely symmetrical configuration, the onus of the aberration correction imposed on the refractive optical system portion at the succeeding stage is reduced by minimizing the occurrence of aberration at the optical system portion for reciprocal paths. However, a sufficient working distance cannot be readily assured in the vicinity of the first plane in the symmetrical optical system for reciprocal paths. In addition, a half prism must be used to branch the optical path.

Furthermore, if a concave reflecting mirror is used at a secondary image forming optical system provided to the rear of the position at which the intermediate image is formed, the light needs to enter the concave reflecting mirror as a wide light flux in order to assure the degree of brightness required by the optical system. As a result, it is difficult to miniaturize the concave reflecting mirror whose diameter tends to be necessarily large.

There is also a type of catadioptric system that forms an intermediate image only once by using a plurality of reflecting mirrors. In this type of catadioptric optical system, the number of lenses required to constitute the refractive optical system portion can be reduced. However, the following problems must be addressed with regard to such catadioptric systems.

In the catadioptric system having the optical system portion for reciprocal paths adopting the structure described above provided toward the second plane on the reduction side, other restrictions imposed with regard to the reduction factor make it impossible to assure a sufficiently long distance to the second plane (the wafer surface) over which the light travels after it is reflected at the reflecting mirror. For this reason, a large number of lenses cannot be inserted in this optical path and the level of brightness achieved at the optical system is bound to be limited. In addition, even if an optical system with a large numerical aperture is achieved, numerous refractive optical members must be provided in the optical path with a limited length, and thus, it is not possible to assure a sufficiently long distance between the wafer surface at the second plane and the surface of the lens toward the second plane, i.e., the so-called working distance WD cannot be set to a sufficiently long value.

Since the optical path has to be bent, the catadioptric system in the related art is bound to have a plurality of optical axes (an optical axis is a line extending through the center of the curvature of a refractive curved surface or a reflective curved surface constituting an optical system). As a result, a plurality of lens barrels must be included in the optical system configuration, which makes it extremely difficult to adjust the individual optical axes relative to one another and, ultimately, to achieve a high precision optical system. It is to be noted that a catadioptric system having all the optical members provided along a single linear optical axis may be achieved by using a pair of reflecting mirrors each having an opening (a light transmission portion) at the center. However, in this type of catadioptric system, the central light flux must be blocked, i.e., central shielding must be achieved, in order to block off unnecessary light which advances along the optical axis without being reflected at the reflecting mirrors. As a result, a problem arises in that the contrast becomes lowered in a specific frequency pattern due to the central shielding.

In addition, positions at which an effective field stop and an effective aperture stop should be installed can not be assured in the catadioptric systems in the related art. Also, as explained above, a sufficient working distance cannot be assured in the catadioptric systems in the related art. Furthermore concave reflecting mirrors tend to become large in the catadioptric systems in the related art, as described above, making it impossible to miniaturize the optical systems.

While the catadioptric system disclosed in EP1069448A1 achieves advantages in that a sufficient working distance is assured toward the second plane (on the wafer-side) and in that the system is configured along a single optical axis, it still has a problem in that a sufficiently long working distance cannot be assured toward the first plane (on the mask side) (the distance between the mask surface at the first plane and the surface of the lens closest to the first plane). In addition, the catadioptric system disclosed in WO 01/51979A2 poses a problem in that the diameter of the reflecting mirror is too large and thus, a sufficiently large numerical aperture cannot be achieved. Likewise, the diameter of the reflecting mirror is too large and, as a result, a sufficiently large numerical aperture cannot be achieved in the catadioptric system disclosed in Japanese Laid-open Patent Publication No. 2001-228401.

DISCLOSURE OF THE INVENTION

An object of the present invention, which has been achieved by addressing the problems discussed above, is to provide a catadioptric system that facilitates adjustment and high precision production of the optical system and is capable of achieving a high resolution of 0.1 µm or less by using light in a vacuum ultraviolet wavelength range of, for instance, 180 nm or smaller.

Another object of the present invention is to provide a catadioptric system that assures positions at which an effective field stop and an effective aperture stop should be installed and is capable of achieving a high resolution of 0.1 µm or less by using light in a vacuum ultraviolet wavelength range of, for instance, 180 nm or smaller.

Yet another object of the present invention is to provide a catadioptric system that assures a sufficiently long working distance and is capable of achieving a high resolution of 0.1 µm or less by using light in a vacuum ultraviolet wavelength range of, for instance, 180 nm or smaller.

A further object of the present invention is to provide a catadioptric system that achieves miniaturization of the optical system by keeping down the size of concave reflecting mirrors and is also capable of achieving a high resolution of 0.1 µm or less by using light in a vacuum ultraviolet wavelength range of, for instance, 180 nm or smaller.

A still further object of the present invention is to provide a catadioptric system that assures a sufficiently long working distance on the first plane side, achieves a satisfactorily large numerical aperture by keeping down the diameter of reflecting mirrors and is capable of achieving a high resolution of 0.1 µm or less by using light in a vacuum ultraviolet wavelength range of, for instance, 180 nm or smaller.

A still further object of the present invention is to provide an exposure apparatus that utilizes the catadioptric system according to the present invention as a projection optical system and is capable of achieving good projection exposure with a high resolution of 0.1 µm or less by using exposure light with a wavelength of, for instance, 180 nm or smaller.

A still further project of the present invention is to provide a micro device manufacturing method through which a high precision micro device can be manufactured by executing good projection exposure with a high resolution of, for instance, 0.1 µm or less with the exposure apparatus according to the present invention.

In order to attain the above objects, a catadioptric system according to the present invention comprises: a first image forming optical system that includes at least two reflecting mirrors and forms a first intermediate image of a first plane with light originating from the first plane; a second image forming optical system that includes at least two reflecting mirrors and forms a second intermediate image of the first plane with light having traveled via the first image forming optical system; and a refractive type of third image forming optical system that forms a final image of the first plane onto a second plane with light having traveled via the second image forming optical system, and optical members constituting the first image forming optical system, the second image forming optical system and the third image forming optical system are all disposed along a single linear optical axis.

In this catadioptric system, it is preferred that a field lens is provided in an optical path between the first image forming optical system and the second image forming optical system.

Also, it is preferred that the first image forming optical system includes the two reflecting mirrors and at least one lens element.

In these cases, it is preferred that a combined optical system comprising the first image forming optical system and the field lens achieves telecentricity toward the first plane and toward the second plane.

In each of the above catadioptric systems, it is preferred that the first image forming optical system includes at least one negative lens element provided in an optical path between the two reflecting mirrors.

Also, it is preferred that the second image forming optical system includes at least one negative lens element provided in an optical path between the two reflecting mirrors.

Another catadioptric system according to the present invention comprises a plurality of optical members that form two intermediate images of a first plane in an optical path between the first plane and a second plane and form a third intermediate image of the first plane onto the second plane as a final image, and the plurality of optical members are disposed along a single linear optical axis.

In this catadioptric system, it is preferred that the intermediate images are formed at positions off the optical axis.

Another catadioptric system according to the present invention comprises a plurality of reflecting mirrors disposed along a single linear optical axis, and an image over a rectangular area away from the optical axis on a first plane is formed onto a second plane.

In this catadioptric system, it is preferred that a field stop that defines an image area formed at the catadioptric system and an aperture stop that defines a numerical aperture of the catadioptric system, are further provided.

Another catadioptric system according to the present invention comprises: a first image forming optical system that includes at least a first reflecting mirror and a second reflecting mirror and forms a first intermediate image of a first plane with light originating from the first plane; a second image forming optical system that includes at least a third reflecting mirror and a fourth reflecting mirror and forms a second intermediate image of the first plane with light having traveled via the first image forming optical system; and a refractive type of third image forming optical system that forms a final image of the first plane onto a second plane with light having traveled via the second image forming optical system, and: optical members constituting the first image forming optical system, the second image forming optical system and the third image forming optical system are all disposed along a single linear optical axis; and at least one negative lens is provided immediately before each of two reflecting mirrors among the first reflecting mirror, the second reflecting mirror, the third reflecting mirror and the fourth reflecting mirrors on a reflecting surface side.

In this catadioptric system, it is preferred that: a magnification factor chromatic aberration is corrected by providing at least one negative lens immediately before each of the two reflecting mirrors on the reflecting surface side; and a magnification factor chromatic aberration coefficient LAT satisfies a condition expressed as $|LAT|<5\times10^{-6}$. In this case or in the above catadioptric system, it is preferred that: an on-axis chromatic aberration is corrected by providing at least one negative lens immediately before each of the two reflecting mirrors on the reflecting surface side; and an on-axis chromatic aberration coefficient AX satisfies a condition expressed as $|AX|<2\times10^{-4}$.

An exposure apparatus according to the present invention comprises: an illumination system that illuminates a mask; and a projection optical system that forms an image of a pattern formed at the mask onto a photosensitive substrate, and: the projection optical systems comprises a catadioptric system according to any one of claims 1 through 13; and the mask corresponds to the first plane in the catadioptric system and the photosensitive substrate corresponds to the second plane in the catadioptric system.

In this exposure apparatus, it is preferred that a drive system that causes the mask and the photosensitive substrate to move relative to the catadioptric system in order to scan the pattern of the mask to expose onto the photosensitive. substrate, is further provided.

A micro device manufacturing method according to the present invention comprises: an exposure step in which the pattern of the mask is exposed onto the photosensitive substrate with the above exposure apparatus; and a development step in which the photosensitive substrate having undergone the exposure step is developed.

BRIEF DESCRIPTION OF THE DRAWINGS

FIG. 5 shows the lateral aberration manifesting at the catadioptric system in the first embodiment;

FIG. 9 shows the lateral aberration manifesting at the catadioptric system in the third embodiment;

FIG. 16 shows the lateral aberration manifesting at the catadioptric system in the sixth embodiment;

BEST MODE FOR CARRYING OUT THE INVENTION

Figure 1:
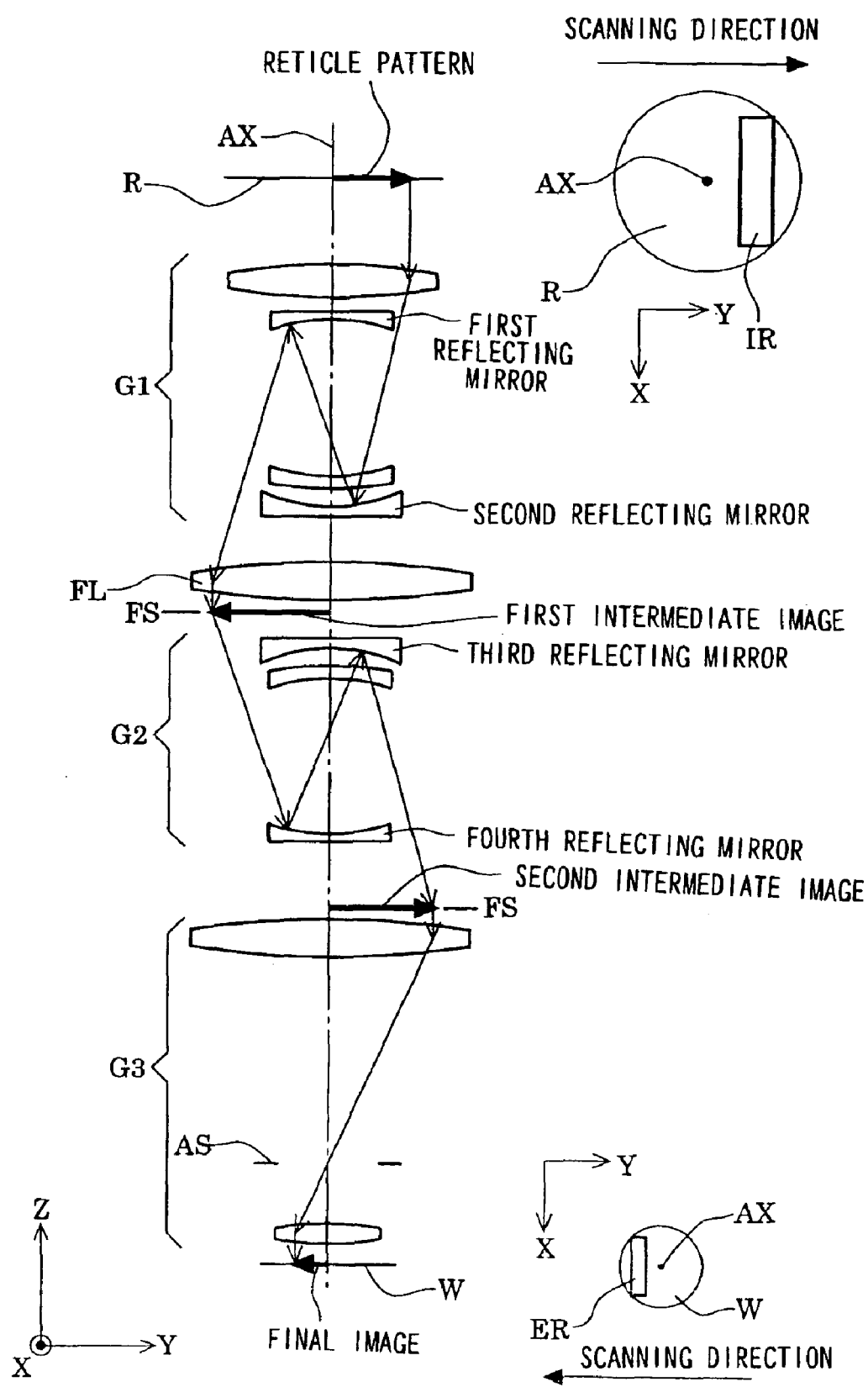
FIG. 1 illustrates the basic structure of a catadioptric system according to the present invention.

FIG. 1 illustrates the basic structure adopted in a catadioptric system according to the present invention. It is to be noted that in FIG. 1, the catadioptric system according to the present invention is utilized as a projection optical system in an exposure apparatus that performs scanning exposure. As shown in FIG. 1, the catadioptric system according to the present invention includes a first image forming optical system G1 for forming a first intermediate image of the pattern at a reticle R constituting a projection original which is set at a first plane. It is to be noted that the first image forming optical system G1 includes at least two reflecting mirrors i.e., a first reflecting mirror and a second reflecting mirror.

Light having traveled through the first image forming optical system G1 then forms a second intermediate image of the pattern at the reticle R via a second image forming optical system G2 having at least two reflecting mirrors, i.e., a third reflecting mirror and a fourth reflecting mirror. The light having traveled through the second image forming optical system G2 forms a final image of the pattern at the reticle R onto a wafer W constituting a photosensitive substrate which is set at a second plane via a refractive third image forming optical system G3 having refractive optical members alone with no reflecting mirror. All the optical members constituting the first image forming optical system G1, the second image forming optical system G2 and the third image forming optical system G3 are disposed along a single linear optical axis AX.

In a more specific mode of the embodiment, a field lens FL is provided in the optical path between the first image forming optical system G1 and the second image forming optical system G2. The field lens FL has a function of matching and connecting the first image forming optical system G1 and the second image forming optical system G2 without actively contributing to the formation of the first intermediate image. In addition, the first image forming optical system G1 includes at least one lens element as well as the two reflecting mirrors. Thus, the combined optical system constituted of the first image forming optical system G1 and the field lens FL achieves telecentricity toward the reticle (toward the first plane) and toward the wafer (toward the second plane). It is to be noted that a field lens may also be provided as necessary in the optical path between the second image forming optical system G2 and the third image forming optical system G3.

In the specific mode of the embodiment, it is desirable to provide at least one negative lens element (L13 or L21) in the optical path between the two reflecting mirrors at, at least either the first image forming optical system G1 or the second image forming optical system G2. This structure makes it possible to correct any chromatic aberration in a desirable manner even if the refractive optical members (lens elements) are formed with a single type of optical material.

A field stop FS that defines an area over which the image is formed at the catadioptric system may be provided near the field lens FL between the first image forming optical system G1 and the second image forming optical system G2 or near a field lens set between the second image forming optical system G2 and the third image forming optical system G3. In this case, the need to provide a field stop in the illumination optical system is eliminated. In addition, an aperture stop AS may be provided in the optical path at the third image forming optical system G3.

As described above, all the optical members are disposed along the single optical axis AX in the catadioptric system according to the present invention, unlike in catadioptric systems in the related art having a plurality of optical axes. Since this allows the optical system to be achieved without a plurality of lens barrels, the adjustment of the optical axes relative to one another becomes unnecessary and any tilting or misalignment of the individual optical members set along the single optical axis AX can be optically detected with ease, which, ultimately makes it possible to manufacture a high precision optical system. In addition, by aligning the single optical axis AX along the direction in which the gravitational force works (along the vertical direction) in this structure, the flexure of any lens caused by gravity can be made to achieve rotational symmetry and, as a result, the deterioration in the image forming performance can be minimized through an optical adjustment.

In particular, by utilizing the catadioptric system adopted in the projection optical system of the exposure apparatus in an upright attitude along the single optical axis AX, the reticle R and the wafer W can be set parallel to each other along a plane perpendicular to the direction of the gravitational force (i.e., along a horizontal plane) and all the lenses constituting the projection optical system can be set horizontally along the single optical axis AX extending along the direction of the gravitational force. As a result, the reticle R, the wafer W and all the lenses constituting the projection optical system are held level without becoming asymmetrically deformed due to their own weight, which is extremely advantageous in facilitating optical adjustment and mechanical design and in assuring high resolution.

In addition, the Petzval's sum, which tends to be a positive value due to the positive refracting power of the refractive optical system portion of the third image forming optical system G3, can be canceled out with the negative Petzval's sum at the concave reflecting mirror portion of the first image forming optical system G1 and the second image forming optical system G2 and, as a result, the overall Petzval's sum can be kept at exactly 0.

It is to be noted that the specific setting of the optical path of the reflecting mirrors is a crucial issue in a structure achieved by providing all the optical members including the reflecting mirrors along a single optical axis. As a solution, an opening (light transmission portion) may be formed at the center of each reflecting mirror as described earlier, to set the optical path via the central opening. However, this prior art solution necessitates the formation of central shielding over the entrance pupil area and such central shielding may lead to poorer optical image forming performance.

In contrast, the light flux from the reticle pattern travels around the outside of the first reflecting mirror and then enters the second reflecting mirror at the first image forming optical system G1. After the light flux having been reflected at the second reflecting mirror is reflected at the first reflecting mirror, the light flux travels around the outside of the second reflecting mirror and forms the first intermediate image. In addition, the light flux from the first intermediate image travels around the outside of the third reflecting mirror and enters the fourth reflecting mirror at the second image forming optical system G2. After the light flux having been reflected at the fourth reflecting mirror is reflected at the third reflecting mirror, the light flux travels around the outside of the fourth reflecting mirror and forms the second intermediate image. According to the present invention, the first image forming optical system G1 and the second image forming optical system G2 are set substantially symmetrical with respect to each other relative to the position at which the first intermediate image is formed. As a result, a large working distance (the distance between the optical surface closest to the reticle and the reticle along the optical axis) can be assured on the reticle side. In other words, by setting the position of the second intermediate image formed via the second image forming optical system G2 further away from the third reflecting mirror, a larger working distance is assured on the reticle side. According to Schupmann's principal of achromatism, "An achromat of the Schupmann (refer to R. Kingstake, "Lens Design Fundamentals", Academic Press, 1978, page 89)", it is difficult to achieve color correction if the difference between the distances from the negative lens to conjugate images (the reticle R and the intermediate image) (=a+b−c, with c representing the distance from the reticle R to the second reflecting mirror, b representing the distance from the second reflecting mirror to the first reflecting mirror and a representing the distance from the first reflecting mirror to the intermediate image in FIG. 1) is large. The present invention, in which the first image forming optical system G1 and the second image forming optical system G2 are set substantially symmetrical to each other relative to the position at which the first intermediate image is formed, allows the difference between the distances from the negative lens at the image forming optical system G1 to the conjugate images manifesting to be canceled out at the second the image forming optical system G2, providing an advantage in the chromatic aberration correction as well.

By adopting the structure described above, central shielding at the entrance pupil can be eliminated and, ultimately, the optical image forming characteristics are not lowered because of central shielding. It is to be noted that the optical path can be set so as to run around the outside of the individual reflecting mirrors by selecting an appropriate image forming magnification factor for the entire catadioptric system. As a result, the final image of the reticle pattern formed over a relatively large rectangular illumination area IR, which is decentered from the optical axis AX in the reticle field, can be formed onto a relatively large rectangular effective exposure area ER, which is decentered from the optical axis AX at the wafer field, as shown in FIG. 1. In correspondence, the first intermediate image and the second intermediate image of the reticle pattern are formed at positions away from the optical axis AX.

The exposure apparatus having the catadioptric system according to the present invention mounted as its projection optical system as described above is capable of performing scanning exposure based upon the rectangular illumination area IR and the rectangular effective exposure area ER by moving the reticle R and the wafer W along a specific direction (scanning direction). In contrast, in an exposure apparatus in the related art having a catadioptric system with all its optical members disposed along a single optical axis mounted as the projection optical system, a relatively large rectangular illumination area and effective exposure area cannot be assured and, as a result, the exposure apparatus performs scanning exposure based upon a thin arch-shaped illumination area and effective exposure area.

In such an exposure apparatus in the related art having thin arch-shaped effective exposure area, it is difficult to adjust the tilt of the wafer stage so as to contain the effective exposure area within the focal depth of the projection optical system at all times during the scanning exposure operation. In addition, in the exposure apparatus in the related art having the thin arch-shaped effective exposure area, the reticle R and the wafer W need to move over a great distance along the scanning direction, i.e., the scanning width is bound to be large. According to the present invention, in which a relatively large rectangular effective exposure area is achieved, the tilt of the wafer stage can be adjusted with ease so as to contain the effective exposure area within the focal depth of the projection optical system at all times during the scanning exposure and thus, a smaller scanning width is achieved.

(Embodiments)

The following is an explanation of embodiments of the present invention, given in reference to the attached drawings.

Figure 2:
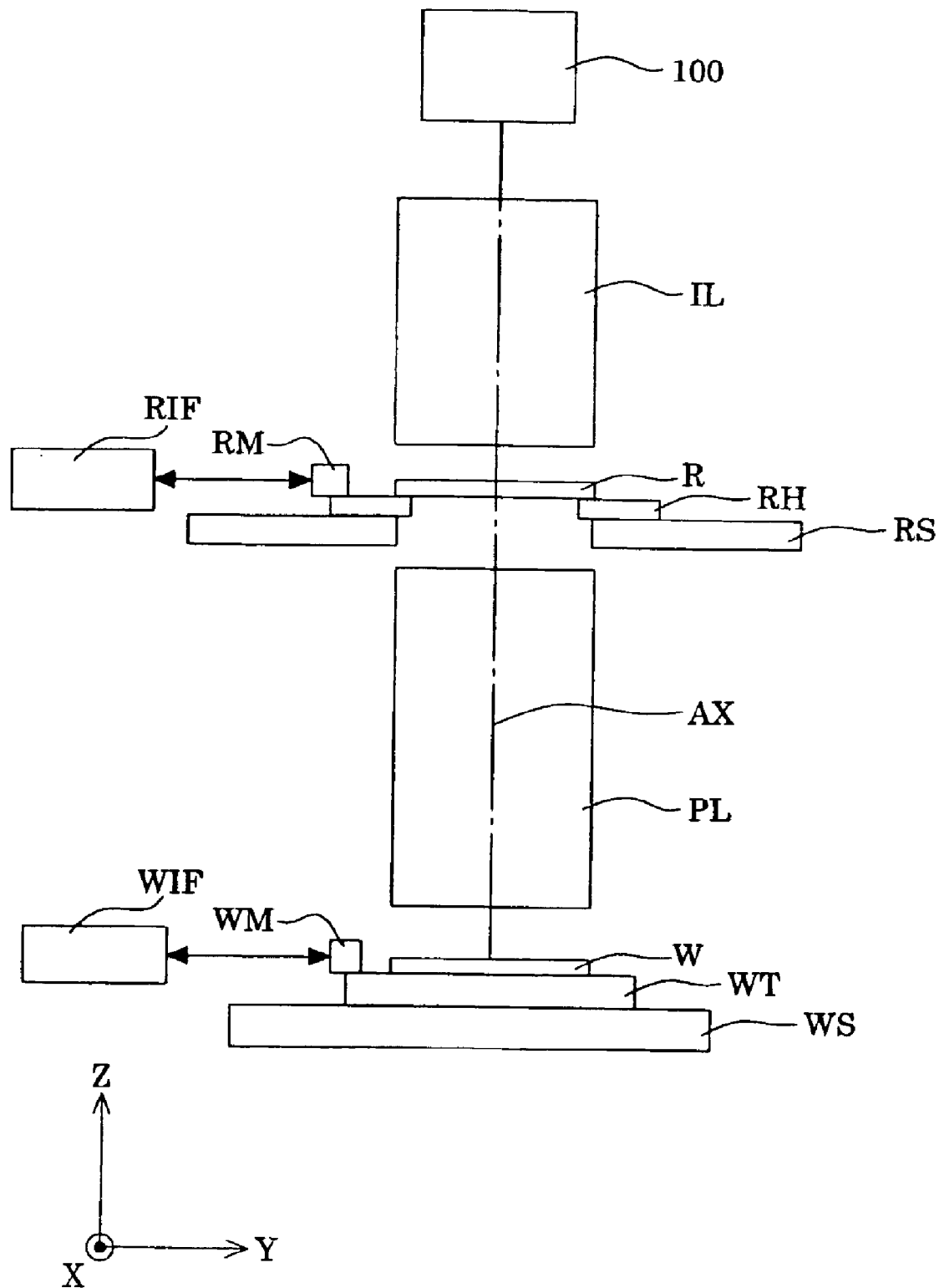
FIG. 2 schematically illustrates the overall structure of an exposure apparatus having the catadioptric system achieved in any of the embodiments of the present invention provided as a projection optical system.

FIG. 2 schematically illustrates the overall structure of an exposure apparatus having the catadioptric system achieved in any of the embodiments of the present invention as its projection optical system. It is to be noted that in FIG. 2, the Z axis is set parallel to a reference optical axis AX of the catadioptric system constituting a projection optical system PL, the Y axis is set parallel to the drawing sheet of FIG. 2 and the X axis is set perpendicular to the drawing sheet within a plane perpendicular to the optical axis AX.

The exposure apparatus in the figure includes a light source 100 constituted of an $F_2$ laser light source (with an oscillation central wavelength of 157.6 nm) to supply illuminating light in the ultraviolet range. Light emitted from the light source 100 uniformly illuminates the reticle (mask) R having a specific pattern formed therein via an illumination optical system IL. It is to be noted that the optical path between the light source 100 and the illumination optical system IL is sealed with a casing (not shown), and the atmosphere in the space extending from the light source 100 to the optical member in the illumination optical system IL, which is the closest to the reticle, is replaced with an inert gas such as helium or nitrogen with a low exposure light absorption coefficient, or the space is sustained in a substantially vacuum state.

The reticle R is held parallel to the X Y plane on a reticle stage RS via a reticle holder RH. A pattern to be transferred is formed at the reticle R, and a rectangular area within the overall pattern, with its long side extending along the X direction and its short side extending along the Y direction is illuminated. The reticle stage RS can be made to move two-dimensionally along the reticle surface (i.e., the X Y plane) by a drive system (not shown), and the position of the reticle stage RS is controlled by measuring its positional coordinates with an interferometer RIF, which utilizes a reticle movement mirror RM.

Light from the pattern formed at the reticle R forms a reticle pattern image on the wafer W, which is a photosensitive substrate, via the catadioptric projection optical system PL. The wafer W is held parallel to the X Y plane on the wafer stage WS via a wafer table (wafer holder) WT. The pattern image is formed over a rectangular exposure area of the wafer W, with its long side extending along the X direction and its short side and extending along the Y direction to optically match the rectangular illumination area on the reticle R. The wafer stage WS can be made to move two-dimensionally along the wafer surface (i.e., the X Y plane) by a drive system (not shown) and the position of the wafer stage WS is controlled by measuring its positional coordinates with an interferometer WIF which employs the wafer movement mirror WM.

Figure 3:
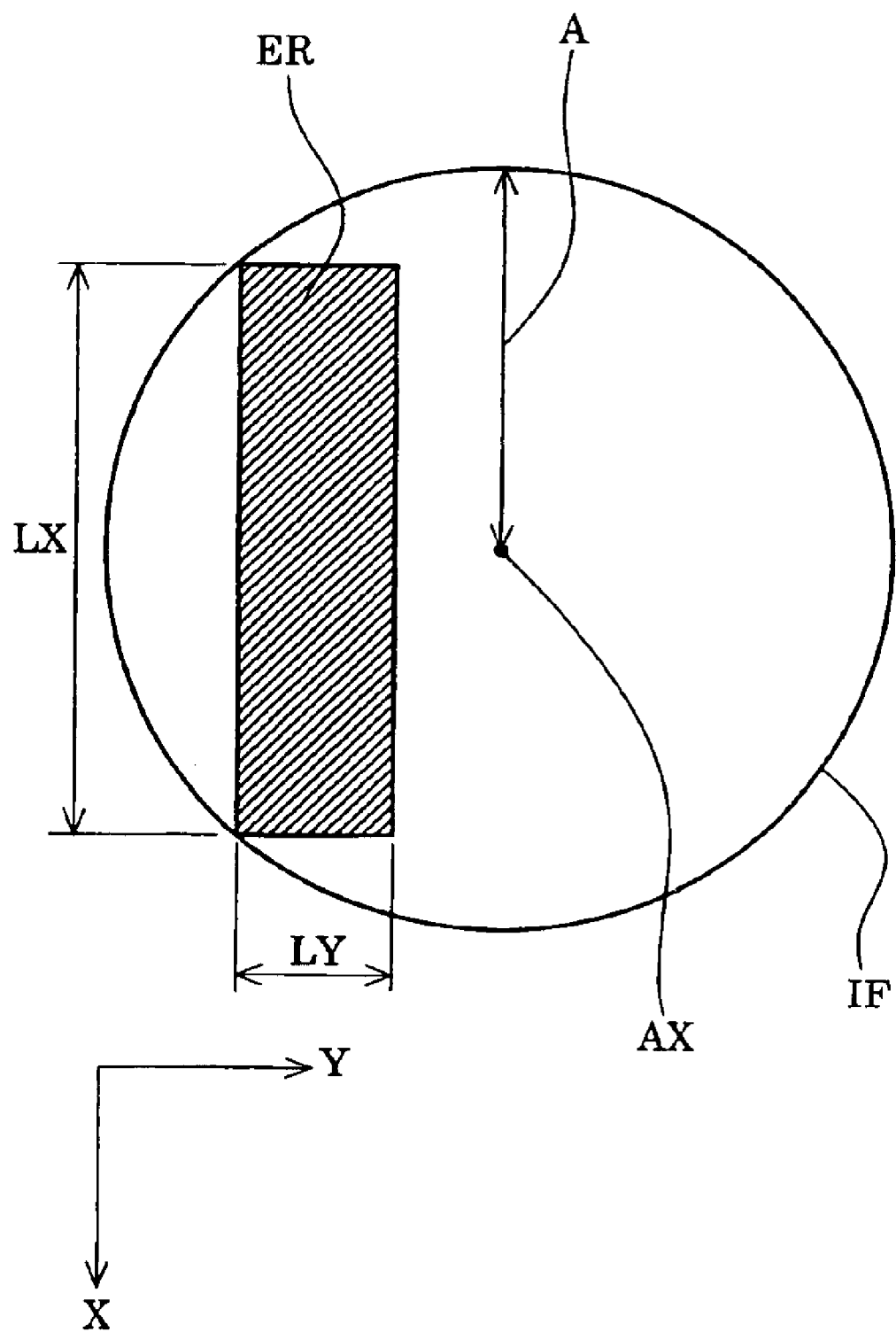
FIG. 3 shows positional relationship between the rectangular exposure area (i.e., the effective exposure area) formed on the wafer and the reference optical axis.

FIG. 3 shows the positional relationships between the rectangular exposure area (i.e., the effective exposure area) formed on the wafer and the reference optical axis. As shown in FIG. 3, a rectangular effective exposure area ER in a desired size is set at a position off the reference optical axis AX along the -Y direction within a circular area (image circle) IF with a radius A (which corresponds to the maximum image height) centered around the reference optical axis AX in all the embodiments except for the sixth embodiment. The effective exposure area ER measures LX along the X direction and measures LY along the Y direction.

Thus, the rectangular illumination area IR with a size and shape corresponding to those of the effective exposure area ER is formed on the reticle R at a position off the reference optical axis AX along the +Y direction as shown in FIG. 1. Namely, the rectangular illumination area IR with a desired size is set at a position off the reference optical axis AX along the +Y direction within a circular area having a radius B (which corresponds to the maximum object height) centering around the reference optical axis AX.

In addition, the space inside the projection optical system PL between the optical member set closest to the reticle (the lens L11 in the embodiments) and the optical member set closest to the wafer (the lens L38 in the first and second embodiments, the lens L312 in the third embodiment, the lens L39 in the fourth embodiment, the lens L315 in the fifth, sixth and ninth embodiments and the lens L317 in the seventh and eighth embodiments) among the optical members constituting the projection optical system PL is sustained in an airtight state in the exposure apparatus shown in the figure, with the atmosphere inside the projection optical system PL replaced with an inert gas such as helium gas or nitrogen gas, or sustained in the substantially vacuum state.

While the reticle R, the reticle stage RS and the like are provided at the narrow optical path between the illumination optical system IL and the projection optical system PL, the casing (not shown) which seals and encloses the reticle R and the reticle stage RS is filled with an inert gas such as nitrogen gas or helium gas or the space within the casing is sustained in a substantially vacuum state.

While the wafer W, the wafer stage WS and the like are provided at the narrow optical path between the projection optical system PL and the wafer W, the casing (not shown) which seals and encloses the reticle R and the wafer stage WS is filled with an inert gas such as nitrogen gas or helium gas or the space within the casing is sustained in a substantially vacuum state. Thus, an atmosphere into which the exposure light is hardly absorbed is formed over the entire optical path extending from the light source 100 to the wafer W.

As described earlier, the illumination area on the reticle R and the exposure area (i.e., the effective exposure area ER) on the wafer W defined by the projection optical system PL both have a rectangular shape with the short side extending along the Y direction. Thus, by synchronously moving (scanning) the reticle stage RS and the wafer stage WS, i.e., the reticle R and the wafer W, along opposite directions (toward opposite directions) in the direction in which the short sides of the rectangular exposure area and illumination area extend, i.e., in the Y direction, while controlling the positions of the reticle R and the wafer W with the drive systems and the interferometers (RIS and WIS), scanning exposure of the reticle pattern onto an area on the wafer W over an area having a width equal to the long side of the exposure area and a length corresponding to the distance over which the wafer W is scanned (the distance over which the wafer W moves) is achieved.

In each embodiment, the projection optical system PL constituted of the catadioptric system according to the present invention includes a catadioptric first image forming optical system G1 for forming a first intermediate image of the pattern at the reticle R set on the first plane, a catadioptric second image forming optical system G2 for forming a second intermediate image of the pattern at the reticle R by using the light traveling to the second image forming optical system G2 via the first image forming optical system G1 and a refractive third image forming optical system G3 for forming a final image of the reticle pattern (a reduced image of the reticle pattern) onto the wafer set on the second plane by using the light traveling to the third image forming optical system G3 via the second image forming optical system G2.

It is to be noted that in each of the embodiments, all the optical members constituting the first image forming optical system G1, the second image forming optical system G2 and the third image forming optical system G3 are disposed along a single linear optical axis AX. In addition, a first field lens is provided in the optical path between the first image forming optical system G1 and the second image forming optical system G2. A second field lens is provided in the optical path between the second image forming optical system G2 and the third image forming optical system G3. It is to be noted that the reference optical axis AX is positioned along the direction of gravitational force (i.e., along the vertical direction). As a result, the reticle R and the wafer W are set parallel to each other along a plane perpendicular to the direction of gravitational force, i.e., along a horizontal plane. In addition, all the optical members (lenses and reflecting mirrors) constituting the projection optical system PL are disposed along the horizontal plane on the reference optical axis AX.

In each embodiment, all the refractive optical members (lens elements) constituting the projection optical system PL are formed by using fluorite ($CaF_2$ crystal). In addition, the oscillations central wavelength of $F_2$ laser light used as the exposure light is 157.6 nm, and the change rate of the refractive index of $CaF_2$ in the vicinity of 157.6 nm is $-2 \times 10^{-6}$ relative to a +1 pm change in the wavelength and is $+2 \times 10^{-6}$ relative to a $-1$ pm change in the wavelength. In other words, the variance ($dn/d\lambda$) of the refractive index of $CaF_2$ in the vicinity of 157.6 nm is $2 \times 10^{-6}$/pm.

Accordingly, the refractive index of $CaF_2$ corresponding to the central wavelength of 157.6 nm is 1.560000 in all the embodiments. In addition, in the first, second and fourth embodiments, the refractive index of $CaF_2$ corresponding to 157.6 nm+0.5 pm=157.6005 nm is 1.559999 and the refractive index of $CaF_2$ corresponding to 157.6 nm−0.5 pm=157.5995 nm is 1.560001. In the third, fifth and sixth embodiments, the refractive index of $CaF_2$ corresponding to 157.6 nm+0.3 pm=157.6003 nm is 1.5599994 and the refractive index of $CaF_2$ corresponding to 157.6 nm−0.3 pm=157.5997 nm is 1.5600006. In the seventh~ninth embodiments, the refractive index of $CaF_2$ corresponding to 157.6 nm+0.4 pm=157.6004 nm is 1.5599992 and the refractive index of $CaF_2$ corresponding to 157.6 nm−0.4 pm=157.5996 nm is 1.5600008.

In addition, in all the embodiments, an aspherical surface is expressed as in a mathematical expression (a) below, with y representing the height along a direction perpendicular to the optical axis, z representing the distance from the tangential plane at the vertex of the aspherical surface to the position on the aspherical surface corresponding to the height y measured along the optical axis (the quantity of sag), r representing the radius of curvature at the vertex, k representing the circular cone coefficient and Cn representing the aspherical coefficient of the nth degree.

$$z=(y^2/r)/[1+\{1-(1+k)\cdot y^2/r^2\}^{1/2}]+C_4\cdot y^4+C_6\cdot y^6+C_8\cdot y^8+C_{10}\cdot y^{10} \quad (a)$$

In each embodiment, * is attached to the right side of the surface number assigned to a lens surface formed in an aspherical shape.

(First Embodiment)

Figure 4:
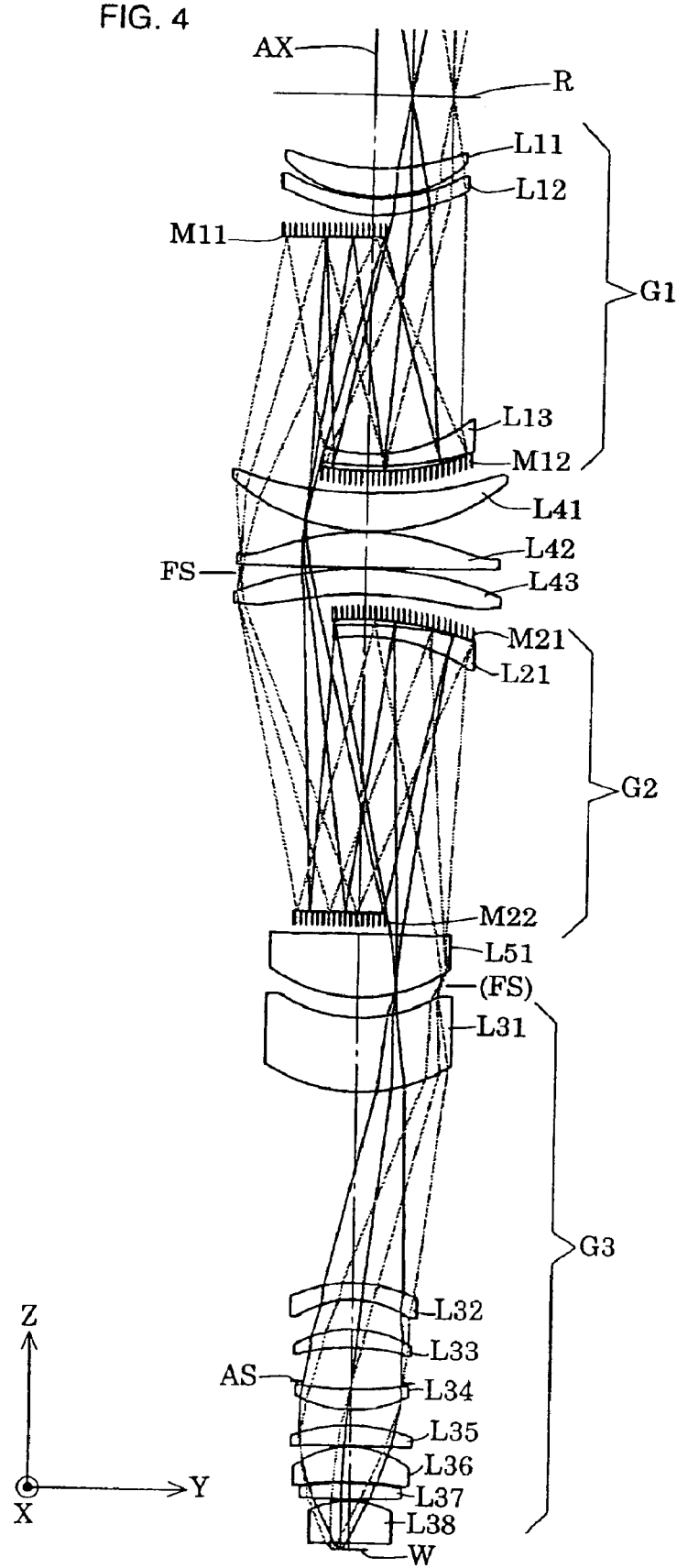
FIG. 4 shows the lens configuration of the catadioptric system achieved in a first embodiment.

FIG. 4 shows the lens configuration adopted in the catadioptric system (projection optical system PL) in the first embodiment. In the catadioptric system in FIG. 4, the first image forming optical system G1 is constituted with, starting on the reticle side, a positive meniscus lens L11 having an aspherical convex surface set facing toward the wafer, a positive meniscus lens L12 having an aspherical convex surface set facing toward the wafer, a concave reflecting mirror M11 having an almost flat concave surface set facing toward the wafer, a negative meniscus lens L13 having a concave surface set facing toward the reticle and a concave reflecting mirror M12 having a concave surface set facing toward the reticle.

In addition, the second image forming optical system G2 is constituted with, starting on the reticle side, a concave reflecting mirror M21 having a concave surface set facing toward the wafer, a negative meniscus lens L21 having a convex surface set facing toward the reticle and a concave reflecting mirror M22 having an almost flat concave surface set facing toward the reticle.

The third image forming optical system G3 is constituted with, starting on the reticle side, a negative meniscus lens L31 having an aspherical convex surface set facing toward the wafer, a negative meniscus lens L32 having an aspherical convex surface set facing toward the reticle, a positive meniscus lens L33 having an aspherical concave surface set facing toward the wafer, an aperture stop AS, a positive meniscus lens L34 having an aspherical concave surface set facing toward the reticle, a positive meniscus lens L35 having an aspherical concave surface set facing toward the wafer, a positive meniscus lens L36 having an aspherical lens with its concavity set facing toward the wafer, a biconvex lens L37 and a biconvex lens L38 having an aspherical convex surface set facing toward the wafer.

It is to be noted that a first field lens constituted with, starting on the reticle side, a positive meniscus lens L41 having an aspherical concave surface set facing toward the reticle, a biconvex lens L42 having an aspherical convex surface set facing toward the reticle and a positive meniscus lens L43 having an aspherical concave surface set facing toward the wafer is provided in the optical path between the first image forming optical system G1 and the second image forming optical system G2. In addition, a second field lens constituted of a biconvex lens L51 having an aspherical convex surface set facing toward the reticle is provided in the optical path between the second image forming optical system G2 and the third image forming optical system G3.

Thus, light from the reticle R enters the concave reflecting mirror M12 via the positive meniscus lens L11, the positive meniscus lens L12 and the negative meniscus lens L13 in the first embodiment. After the light having been reflected at the concave reflecting mirror M12 is reflected at the concave reflecting mirror M11 via the negative meniscus lens L13, the light forms the first intermediate image of the reticle pattern within the first field lens (L41~L43).

The light from the first intermediate image formed in the first field lens (L41~L43) is reflected at the concave reflecting mirror M22, is reflected at the concave reflecting mirror M21 via the negative meniscus lens L21 and forms the second intermediate image of the reticle pattern near the second field lens L51 via the negative meniscus lens L21. The light from the second intermediate image formed near the second field lens L51 forms the final image of the reticle pattern onto the wafer W via the lenses L31~L38 constituting the third image forming optical system G3.

Table (1) below lists data values regarding the catadioptric system achieved in the first embodiment. In the main data presented in Table (1), λ represents the central wavelength of the exposure light, β represents the projection magnification factor (the image forming magnification factor of the overall system), NA represents the image-side (wafer-side) numerical aperture, A represents the radius of the image circle IF on the wafer W, i.e., the maximum image height, B represents the maximum object height corresponding to the maximum image height A, LX represents the measurement of the effective exposure area ER along the X direction (the measurement of the long side) and LY represents the measurement of the effective exposure area ER along the Y direction (the measurement of the short side).

In addition, in the optical member data presented in Table (1), the surface numbers in the first column indicate the order in which the individual surfaces are set, starting from the reticle side, r in the second column indicates the radius of curvature of each surface (the radius of curvature at the vertex in the case of an aspherical surface: mm), d in the third column indicates the distances between the individual surfaces on the axis, i.e., the surface intervals (mm), and n in the fourth column indicates the refractive index corresponding to the central wavelength. It is to be noted that the sign attached to the value representing a surface interval d is switched each time the light is reflected. Accordingly, the sign attached to the values representing the surface intervals d within the optical path extending from the concave reflecting mirror M12 to the concave reflecting mirror M11 and the optical path extending from the concave reflecting mirror M22 to the concave reflecting mirror M21 is negative, and the sign is positive in the remaining optical path. In addition, regardless of the direction along which the light enters, the radius of curvature of a convex surface set facing toward the reticle assumes a positive value and the radius of curvature of a concave surface set facing toward the reticle assumes a negative value.

TABLE (1)

(main data)

$\lambda$ = 157.6 nm
$\beta$ = 1/4
NA = 0.70
A = 17 mm
B = 68 mm
LX = 22 mm
LY = 5 mm (optical member data)

| surface number | r | d | n |
|---|---|---|---|
| (reticle surface) | | 64.582058 | |
| 1 | −209.99497 | 24.525484 | 1.560000 (lens L11) |
| 2* | −166.93294 | 2.218319 | |
| 3 | −155.66573 | 15.657738 | 1.560000 (lens L12) |
| 4* | −112.14862 | 222.368536 | |
| 5 | −137.10069 | 10.687500 | 1.560000 (lens L13) |
| 6 | −297.35521 | 5.164034 | |
| 7 | −230.99151 | −5.164034 | (concave reflecting mirror M12) |
| 8 | −297.35521 | −10.687500 | 1.560000 (lens L13) |
| 9 | −137.10069 | −202.268536 | |
| 10 | 9031.77704 | 238.120070 | (concave reflecting mirror M11) |
| 11* | −476.24503 | 35.519322 | 1.560000 (lens L41) |
| 12 | −183.40344 | 1.000000 | |
| 13* | 232.87955 | 33.691524 | 1.560000 (lens L42) |
| 14 | −6107.18575 | 1.000000 | |
| 15 | 296.13333 | 25.457233 | 1.560000 (lens L43) |
| 16* | 365.41518 | 301.171316 | |
| 17 | −2848.33830 | −261.483816 | (concave reflecting mirror M22) |
| 18 | 165.31377 | −10.687500 | 1.560000 (lens L21) |
| 19 | 383.70240 | −5.000000 | |
| 20 | 255.80102 | 5.000000 | (concave reflecting mirror M21) |
| 21 | 383.70240 | 10.687500 | 1.560000 (lens L21) |
| 22 | 165.31377 | 281.483816 | |
| 23* | 896.07542 | 60.560876 | 1.560000 (lens L51) |
| 24 | −133.46870 | 19.157687 | |
| 25 | −130.23246 | 70.000000 | 1.560000 (lens L31) |
| 26* | −151.76418 | 175.887352 | |
| 27* | 132.53655 | 15.000000 | 1.560000 (lens L32) |
| 28 | 94.29966 | 25.759223 | |
| 29 | 104.80691 | 17.096377 | 1.560000 (lens L33) |
| 30* | 291.29374 | 30.716267 | |
| 31 | ∞ | 6.113832 | (aperture stop AS) |
| 32* | −426.89300 | 18.954117 | 1.560000 (lens L34) |
| 33 | −107.18535 | 14.684919 | |
| 34 | 152.17692 | 18.992313 | 1.560000 (lens L35) |
| 35 | 2173.98608 | 1.000000 | |
| 36 | 84.63119 | 31.851802 | 1.560000 (lens L36) |
| 37* | 383.82672 | 1.072291 | |
| 38 | 262.82386 | 15.136062 | 1.560000 (lens L37) |
| 39 | −676.46385 | 1.000000 | |
| 40 | 80.48028 | 37.973817 | 1.560000 (lens L38) |
| 41* | −2872.34135 | 6.000000 | |
| (wafer surface) | | | |

(aspherical surface data)

surface 2

$\kappa$ = 0.000000
$C_4$ = −0.291653 × $10^{-6}$    $C_6$ = 0.688361 × $10^{-11}$
$C_8$ = −0.173883 × $10^{-15}$    $C_{10}$ = 0.114644 × $10^{-18}$ TABLE (1)-continued surface 4

$\kappa = 0.000000$
$C_4 = 0.245562 \times 10^{-6}$    $C_6 = 0.937520 \times 10^{-11}$
$C_8 = -0.121380 \times 10^{-14}$   $C_{10} = 0.619768 \times 10^{-19}$ surface 11

$\kappa = 0.000000$
$C_4 = -0.317890 \times 10^{-7}$   $C_6 = -0.350349 \times 10^{-11}$
$C_8 = 0.549441 \times 10^{-15}$    $C_{10} = -0.185236 \times 10^{-19}$ surface 13

$\kappa = 0.000000$
$C_4 = 0.274807 \times 10^{-7}$    $C_6 = -0.280710 \times 10^{-11}$
$C_8 = -0.990831 \times 10^{-16}$   $C_{10} = -0.764627 \times 10^{-20}$ surface 16

$\kappa = 0.000000$
$C_4 = 0.507380 \times 10^{-7}$    $C_6 = -0.797166 \times 10^{-11}$
$C_8 = -0.693684 \times 10^{-16}$   $C_{10} = 0.761192 \times 10^{-20}$ surface 23

$\kappa = 0.000000$
$C_4 = -0.124616 \times 10^{-6}$   $C_6 = 0.245376 \times 10^{-10}$
$C_8 = -0.436363 \times 10^{-14}$   $C_{10} = 0.165599 \times 10^{-18}$ surface 26

$\kappa = 0.000000$
$C_4 = -0.652972 \times 10^{-7}$   $C_6 = 0.117653 \times 10^{-10}$
$C_8 = -0.107028 \times 10^{-14}$   $C_{10} = 0.613946 \times 10^{-19}$ surface 27

$\kappa = 0.000000$
$C_4 = -0.272313 \times 10^{-7}$   $C_6 = -0.517344 \times 10^{-11}$
$C_8 = -0.904051 \times 10^{-15}$   $C_{10} = -0.601541 \times 10^{-19}$ surface 30

$\kappa = 0.000000$
$C_4 = 0.303099 \times 10^{-6}$    $C_6 = 0.157674 \times 10^{-10}$
$C_8 = 0.136800 \times 10^{-14}$    $C_{10} = 0.231671 \times 10^{-18}$ surface 32

$\kappa = 0.000000$
$C_4 = -0.161006 \times 10^{-6}$   $C_6 = 0.118724 \times 10^{-10}$
$C_8 = 0.790687 \times 10^{-15}$    $C_{10} = 0.271051 \times 10^{-19}$ surface 37

$\kappa = 0.000000$
$C_4 = 0.894445 \times 10^{-7}$    $C_6 = 0.728182 \times 10^{-10}$
$C_8 = -0.886021 \times 10^{-14}$   $C_{10} = 0.108877 \times 10^{-17}$ surface 41

$\kappa = 0.000000$
$C_4 = 0.677633 \times 10^{-6}$    $C_6 = -0.377321 \times 10^{-9}$
$C_8 = 0.103549 \times 10^{-12}$    $C_{10} = 0.227795 \times 10^{-16}$ FIG. 5 shows the lateral aberration occurring in the catadioptric system in the first embodiment. In the aberration chart, Y represents the image height (mm). As the aberration chart clearly indicates, the chromatic aberration is properly corrected when the wavelength of the exposure light is within a range of 157.6 nm±0.5 pm in the first embodiment. In addition, the chart confirms that the spherical aberration, the coma aberration, the astigmatism and the distortion are successfully corrected to an extent to which they are practically non-existent and thus, outstanding image forming performance is achieved.

(Second Embodiment)

Figure 6:
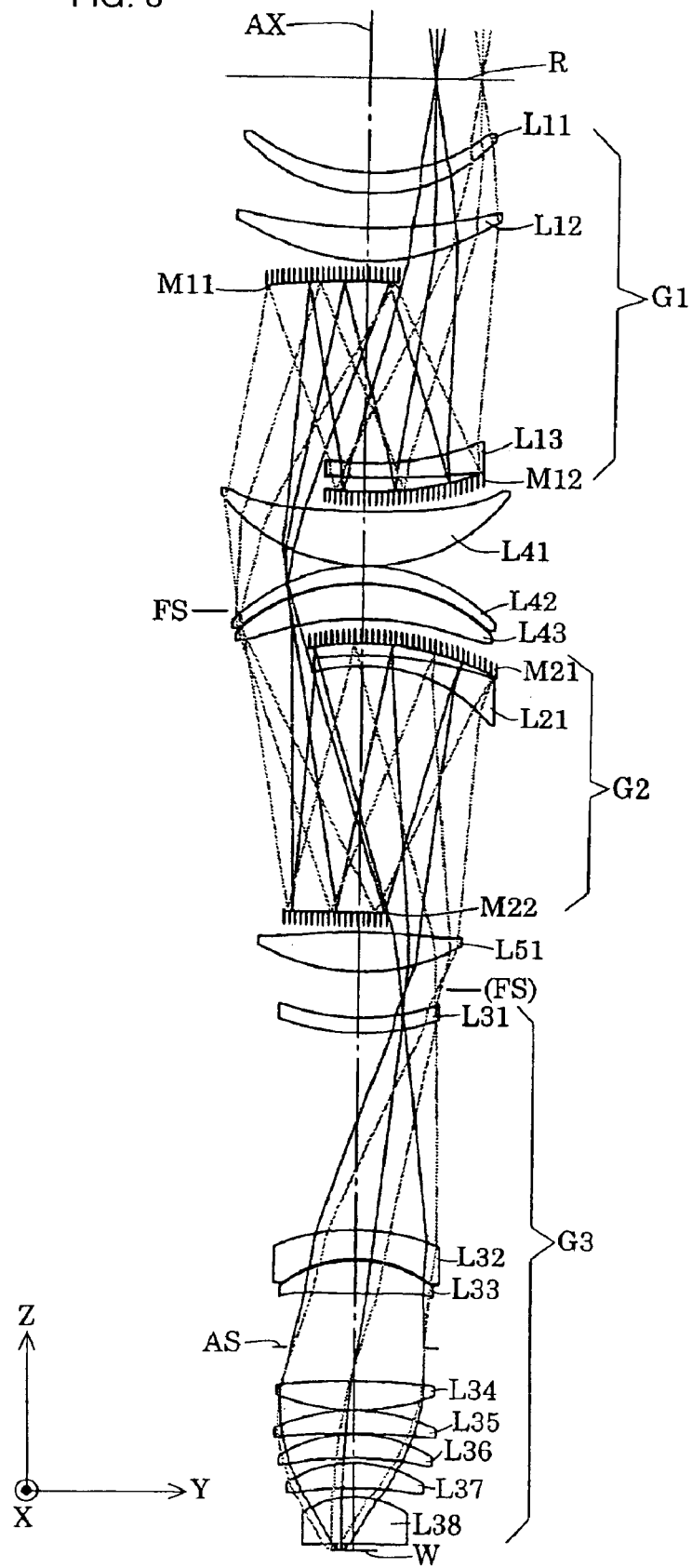
FIG. 6 shows the lens configuration of the catadioptric system achieved in a second embodiment.

FIG. 6 shows lens the configuration adopted in the catadioptric system (projection optical system PL) in the second embodiment. In the catadioptric system in FIG. 6, the first image forming optical system G1 is constituted with, starting on the reticle side, a positive meniscus lens L11 having an aspherical convex surface set facing toward the wafer, a positive meniscus lens L12 having an aspherical convex surface set facing toward the wafer, a concave reflecting mirror M11 having an almost flat concave surface set facing toward the wafer, a negative meniscus lens L13 having a concave surface set facing toward the reticle and a concave reflecting mirror M12 having a concave surface set facing toward the reticle.

In addition, the second image forming optical system G2 is constituted with, starting on the reticle side, a concave reflecting mirror M21 having a concave surface set facing toward the wafer, a negative meniscus lens L21 having a convex surface set facing toward the reticle and a concave reflecting mirror. M22 having an almost flat concave surface set facing toward the reticle.

The third image forming optical system G3 is constituted with, starting on the reticle side, a negative meniscus lens L31 having an aspherical convex surface set facing toward the wafer, a negative meniscus lens L32 having an aspherical convex surface set facing toward the reticle, a biconvex lens L33 having an aspherical convex surface set facing toward the wafer, an aperture stop AS, a biconvex lens L34 having an aspherical convex surface set facing toward the reticle, a positive meniscus lens L35 having a convex lens set facing toward the reticle side, a positive meniscus lens L36 having an aspherical concave surface set facing toward the wafer, a positive meniscus lens L37 having a convex lens set facing toward the reticle and a biconvex lens L38 having an aspherical convex surface set facing toward the wafer.

It is to be noted that a first field lens constituted with, starting on the reticle side, a positive meniscus lens L41 having an aspherical concave surface set facing toward the reticle, a positive meniscus lens L42 having an aspherical convex surface set facing toward the reticle and a positive meniscus lens L43 having an aspherical concave surface set facing toward the wafer is provided in the optical path between the first image forming optical system G1 and the second image forming optical system G2. In addition, a second field lens constituted of a biconvex lens L51 having an aspherical convex surface set facing toward the reticle is provided in the optical path between the second image forming optical system G2 and the third image forming optical system G3.

Thus, light from the reticle R enters the concave reflecting mirror M12 via the positive meniscus lens L11, the positive meniscus lens L12 and the negative meniscus lens L13 in the second embodiment. After the light having been reflected at the concave reflecting mirror M12 is reflected at the concave reflecting mirror M11 via the negative meniscus lens L13, the light forms the first intermediate image of the reticle pattern within the first field lens (L41~L43).

The light from the first intermediate image formed in the first field lens (L41~L43) is reflected at the concave reflecting mirror M22, is reflected at the concave reflecting mirror M21 via the negative meniscus lens L21 and forms the second intermediate image of the reticle pattern near the second field lens L51 via the negative meniscus lens L21. The light from the second intermediate image formed near the second field lens L51 forms the final image of the reticle pattern onto the wafer W via the lenses L31~L38 constituting the third image forming optical system G3.

Table (2) below lists data values regarding the catadioptric system achieved in the second embodiment. In the main data presented in Table (2), λ represents the central wavelength of the exposure light, β represents the projection magnification factor (the image forming magnification factor of the overall system), NA represents the image-side (wafer-side) numerical aperture, A represents the radius of the image circle IF on the wafer W, i.e., the maximum image height, B represents the maximum object height corresponding to the maximum image height A, LX represents the measurement of the effective exposure area ER along the X direction (the measurement of the long side) and LY represents the measurement of the effective exposure area ER along the Y direction (the measurement of the short side).

In addition, in the optical member data presented in Table (2), the surface numbers in the first column indicate the order in which the individual surfaces are set, starting from the reticle side, r in the second column indicates the radius of curvature of each surface (the radius of curvature at the vertex in the case of an aspherical surface: mm), d in the third column indicates the distances between the individual surfaces on the axis, i.e., the surface intervals (mm,) and n in the fourth column indicates the refractive index corresponding to the central wavelength. It is to be noted that the sign attached to the value representing a surface interval d is switched each time the light is reflected. Accordingly, the sign attached to the values representing the surface intervals d within the optical path extending from the concave reflecting mirror M12 to the concave reflecting mirror M11 and the optical path extending from the concave reflecting mirror M22 to the concave reflecting mirror M21 is negative, and the sign is positive in the remaining optical path. In addition, regardless of the direction along which the light enters, the radius of curvature of a convex surface set facing toward the reticle assumes a positive value and the radius of curvature of a concave surface set facing toward the reticle assumes a negative value.

TABLE (2)

(main data)

$\lambda = 157.6$ nm
$\beta = 1/5$
NA = 0.8
A = 21 mm
B = 105 mm
LX = 22 mm
LY = 5 mm (optical member data)

| surface number | r | d | n |
|---|---|---|---|
| (reticle surface) | | 89.097796 | |
| 1 | −183.14650 | 19.722044 | 1.560000 (lens L11) |
| 2* | −172.17054 | 34.263431 | |
| 3 | −461.61726 | 32.462803 | 1.560000 (lens L12) |
| 4* | −180.99449 | 199.550635 | |
| 5 | −272.56734 | 13.359375 | 1.560000 (lens L13) |
| 6 | −988.74052 | 13.790803 | |
| 7 | −326.92312 | −13.790803 | (concave reflecting mirror M12) |
| 8 | −988.74052 | −13.359375 | 1.560000 (lens L13) |
| 9 | −272.56734 | −179.450635 | |
| 10 | 1164.40577 | 226.600813 | (concave reflecting mirror M11) |
| 11* | −673.49253 | 52.893617 | 1.560000 (lens L41) |
| 12 | −170.57409 | 1.000000 | |
| 13* | 145.84783 | 18.775044 | 1.560000 (lens L42) |
| 14 | 177.50368 | 1.000000 | |
| 15 | 174.53532 | 35.709621 | 1.560000 (lens L43) |
| 16* | 297.00962 | 294.044471 | |
| 17 | −2044.05791 | −247.356971 | (concave reflecting mirror M22) |
| 18 | 160.43373 | −10.687500 | 1.560000 (lens L21) |
| 19 | 366.71769 | −12.000000 | |
| 20 | 264.23742 | 12.000000 | (concave reflecting mirror M21) |
| 21 | 366.71769 | 10.687500 | 1.560000 (lens L21) |
| 22 | 160.43373 | 267.356971 | |
| 23* | 385.86277 | 39.609336 | 1.560000 (lens L51) |
| 24 | −192.31716 | 45.851242 | |
| 25 | −210.15146 | 15.000000 | 1.560000 (lens L31) |
| 26* | −216.35913 | 193.996639 | |
| 27* | 224.33623 | 28.450755 | 1.560000 (lens L32) |
| 28 | 112.85221 | 2.259549 | |

TABLE (2)-continued

| 29 | 118.06671 | 31.990438 | 1.560000 (lens L33) |
|---|---|---|---|
| 30* | −575.87913 | 51.431023 | |
| 31 | ∞ | 32.226964 | (aperture stop AS) |
| 32* | 739.93426 | 27.150099 | 1.560000 (lens L34) |
| 33 | −203.64309 | 1.000000 | |
| 34 | 180.06059 | 22.479157 | 1.560000 (lens L35) |
| 35 | 737.32257 | 1.000000 | |
| 36 | 135.48460 | 23.362271 | 1.560000 (lens L36) |
| 37* | 559.50671 | 4.229139 | |
| 38 | 120.70160 | 24.487231 | 1.560000 (lens L37) |
| 39 | 372.54409 | 8.973147 | |
| 40 | 91.59293 | 44.833371 | 1.560000 (lens L38) |
| 41* | −2636.41853 | 6.000000 | |
| (wafer surface) | | | |

(aspherical surface data)

surface 2

$\kappa = 0.000000$
$C_4 = -0.264407 \times 10^{-7}$       $C_6 = -0.476678 \times 10^{-12}$
$C_8 = 0.155729 \times 10^{-15}$       $C_{10} = -0.517698 \times 10^{-20}$ surface 4

$\kappa = 0.000000$
$C_4 = 0.280731 \times 10^{-7}$        $C_6 = 0.571906 \times 10^{-12}$
$C_8 = 0.469828 \times 10^{-17}$       $C_{10} = 0.988050 \times 10^{-21}$ surface 11

$\kappa = 0.000000$
$C_4 = 0.275486 \times 10^{-7}$        $C_6 = -0.579812 \times 10^{-11}$
$C_8 = 0.188014 \times 10^{-15}$       $C_{10} = -0.327703 \times 10^{-20}$ surface 13

$\kappa = 0.000000$
$C_4 = -0.305645 \times 10^{-7}$       $C_6 = -0.100924 \times 10^{-11}$
$C_8 = 0.185962 \times 10^{-16}$       $C_{10} = -0.380314 \times 10^{-20}$ surface 16

$\kappa = 0.000000$
$C_4 = 0.476746 \times 10^{-7}$        $C_6 = -0.515517 \times 10^{-11}$
$C_8 = -0.536543 \times 10^{-16}$      $C_{10} = 0.833063 \times 10^{-20}$ surface 23

$\kappa = 0.000000$
$C_4 = -0.916646 \times 10^{-7}$       $C_6 = 0.125088 \times 10^{-11}$
$C_8 = -0.367721 \times 10^{-16}$      $C_{10} = -0.108975 \times 10^{-20}$ surface 26

$\kappa = 0.000000$
$C_4 = -0.696241 \times 10^{-7}$       $C_6 = 0.269136 \times 10^{-10}$
$C_8 = -0.305398 \times 10^{-14}$      $C_{10} = 0.112606 \times 10^{-18}$ surface 27

$\kappa = 0.000000$
$C_4 = 0.216592 \times 10^{-7}$        $C_6 = 0.590674 \times 10^{-11}$
$C_8 = 0.832609 \times 10^{-16}$       $C_{10} = -0.333598 \times 10^{-19}$ surface 30

$\kappa = 0.000000$
$C_4 = 0.180772 \times 10^{-6}$        $C_6 = 0.105754 \times 10^{-10}$
$C_8 = 0.691500 \times 10^{-15}$       $C_{10} = 0.189377 \times 10^{-19}$ surface 32

$\kappa = 0.000000$
$C_4 = -0.173909 \times 10^{-7}$       $C_6 = 0.507430 \times 10^{-11}$
$C_8 = -0.989619 \times 10^{-16}$      $C_{10} = -0.182632 \times 10^{-19}$ surface 37

$\kappa = 0.000000$
$C_4 = 0.764004 \times 10^{-7}$        $C_6 = 0.873773 \times 10^{-11}$
$C_8 = -0.285150 \times 10^{-15}$      $C_{10} = 0.481104 \times 10^{-19}$ surface 41

Figure 7:
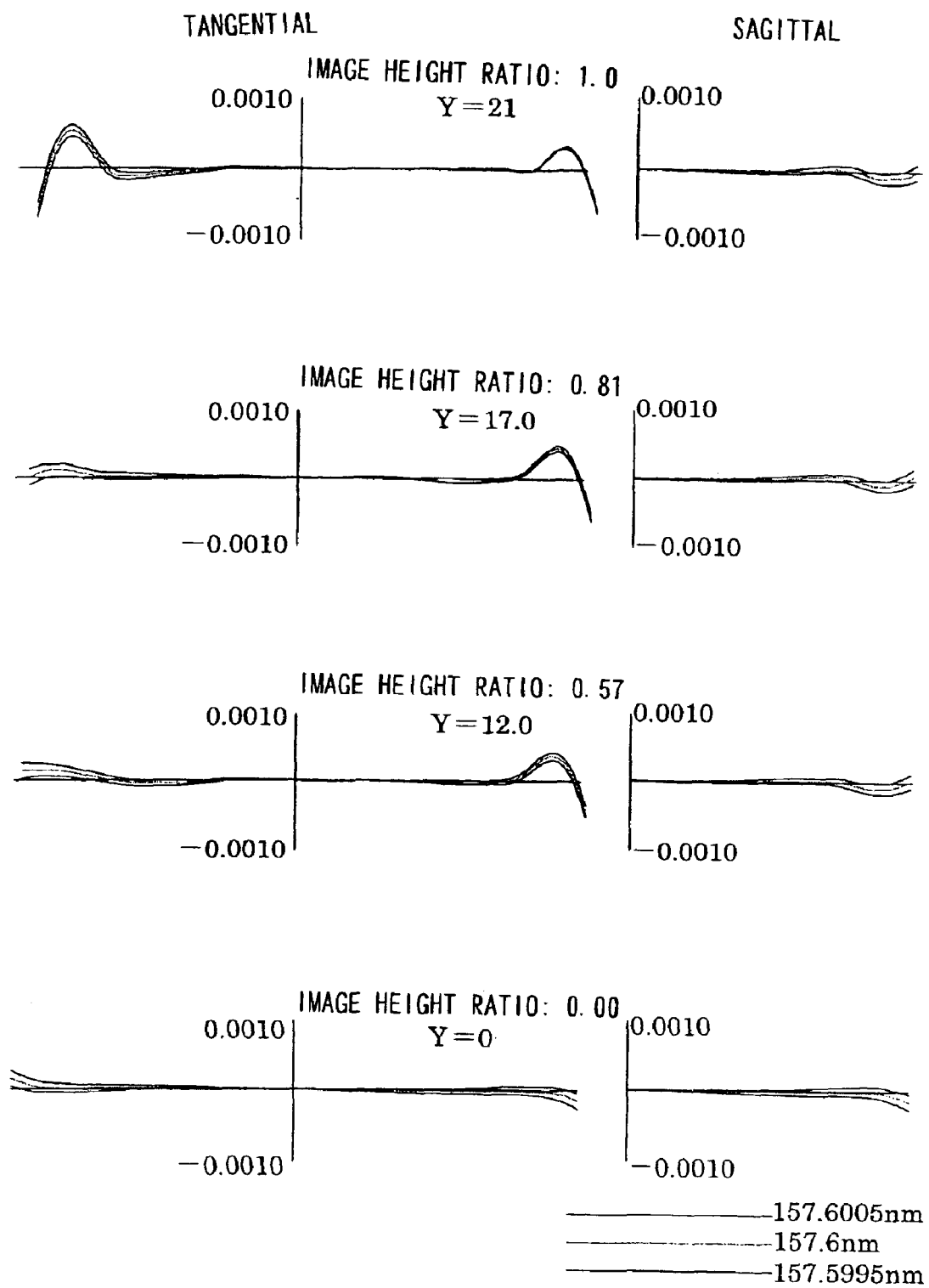
FIG. 7 shows the lateral aberration manifesting at the catadioptric system in the second embodiment.

$\kappa = 0.000000$
$C_4 = 0.145715 \times 10^{-6}$        $C_6 = -0.124981 \times 10^{-9}$
$C_8 = 0.704755 \times 10^{-13}$       $C_{10} = -0.114853 \times 10^{-16}$ FIG. 7 shows the lateral aberration occurring in the catadioptric system in the second embodiment. In the aberration chart, Y represents the image height (mm). As the aberration chart clearly indicates, the chromatic aberration is properly corrected in the second embodiment when the wavelength of the exposure light is within a range of 157.6 nm±0.5 pm, as in the first embodiment. In addition, the chart confirms that the spherical aberration, the coma aberration, the astigmatism and the distortion are successfully corrected to an extent to which they are practically non-existent and thus, outstanding image forming performance is achieved.

(Third Embodiment)

Figure 8:
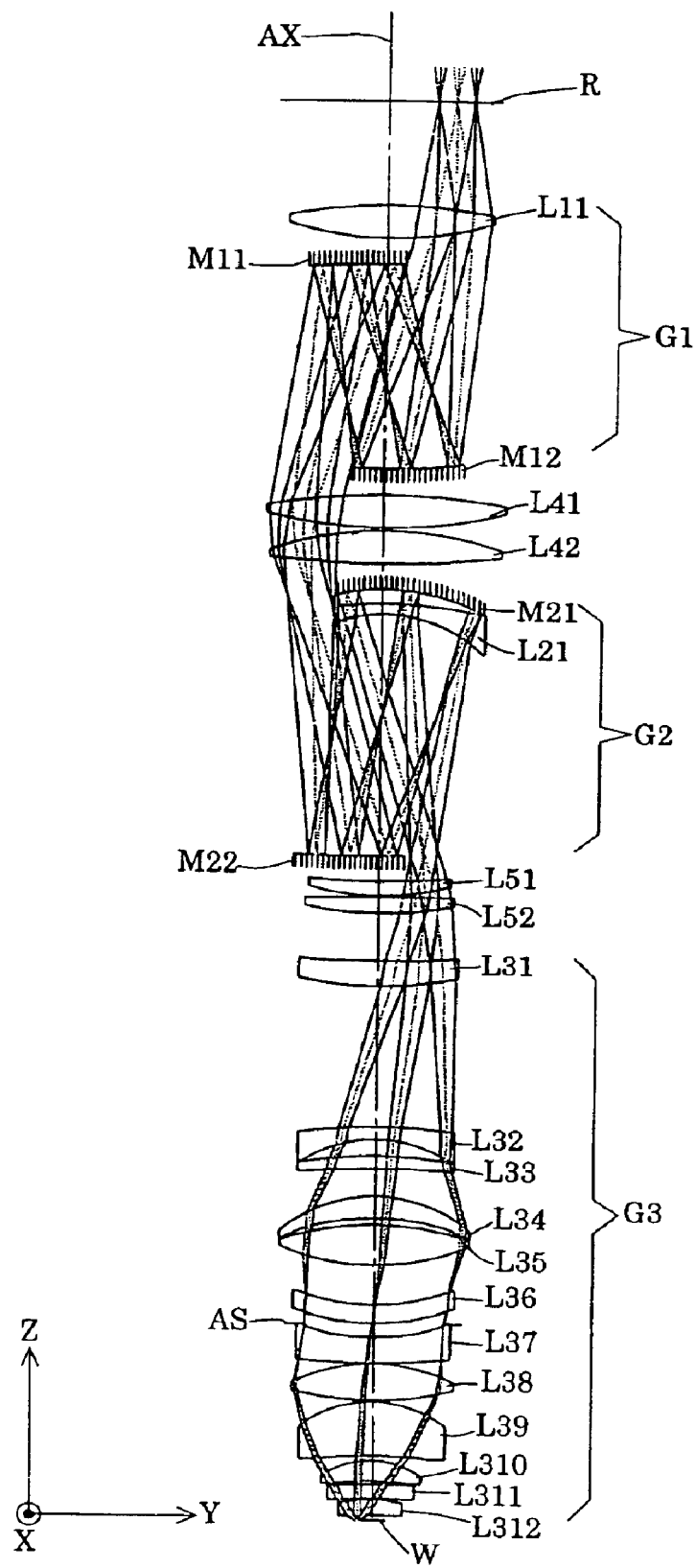
FIG. 8 shows the lens configuration of the catadioptric system achieved in a third embodiment.

FIG. 8 shows the lens configuration adopted in the catadioptric system (projection optical system PL) in the third embodiment. In the catadioptric system in FIG. 8, the first image forming optical system G1 is constituted with, starting on the reticle side, a biconvex lens L11, a concave reflecting mirror M11 having an almost flat concave surface set facing toward the wafer and a concave reflecting mirror M12 having a concave surface set facing toward the reticle.

In addition, the second image forming optical system G2 is constituted with, starting on the reticle side, a concave reflecting mirror M21 having a concave surface set facing toward the wafer, a negative meniscus lens L21 having a convex surface set facing toward the reticle and a concave reflecting mirror M22 having an almost flat concave surface set facing toward the reticle.

The third image forming optical system G3 is constituted with, starting on the reticle side, a positive meniscus lens L31 having an aspherical concave surface set facing toward the reticle, a negative meniscus lens L32 having a convex surface set facing toward the reticle, a positive meniscus lens L33 having a convex surface set facing toward the reticle, a positive meniscus lens L34 having an aspherical concave surface set facing toward the wafer, a biconvex lens L35, a negative meniscus lens L36 having an aspherical concave surface set facing toward the reticle, an aperture stop AS, a negative meniscus lens L37 having an aspherical concave surface set facing toward the reticle, a biconvex lens L38 having an aspherical convex surface set facing toward the wafer, a positive meniscus lens L39 having an aspherical concave surface set facing toward the wafer, a positive meniscus lens L310 having a convex surface set facing toward the reticle, a biconcave lens L311 and a positive meniscus lens L312 having a convex surface set facing toward the reticle.

It is to be noted that a first field lens constituted with, starting on the reticle side, a biconvex lens L41 and a biconvex lens L42 having an aspherical convex surface set facing toward the wafer is provided in the optical path between the first image forming optical system G1 and the second image forming optical system G2. In addition, a second field lens constituted with, starting on the reticle side, a positive meniscus lens L51 having a concave surface set facing toward the reticle and a biconvex lens L52 is provided in the optical path between the second image forming optical system G2 and the third image forming optical system G3.

Thus, light from the reticle R enters the concave reflecting mirror M12 via the biconvex lens L11 in the third embodiment. After the light having been reflected at the concave reflecting mirror M12 is reflected at the concave reflecting mirror M13, the light forms the first intermediate image of the reticle pattern via the first field lens (L41 and L42).

The light from the first intermediate image formed via the first field lens (L41 and L42) is reflected at the concave reflecting mirror M22, is reflected at the concave reflecting mirror M21 via the negative meniscus lens L21 and forms the second intermediate image of the reticle pattern near the second field lens (L51 and L52) via the negative meniscus lens L21. The light from the second intermediate image forms the final image of the reticle pattern onto the wafer W via the second field lens (L51 and L52) and the lenses L31~L312 constituting the third image forming optical system G3.

Table (3) below lists data values regarding the catadioptric system achieved in the third embodiment. In the main data presented in Table (3), λ represents the central wavelength of the exposure light, β represents the projection magnification factor (the image forming magnification factor of the overall system), NA represents the image-side (wafer-side) numerical aperture, A represents the radius of the image circle IF on the wafer W, i.e., the maximum image height, B represents the maximum object height corresponding to the maximum image height A, LX represents the measurement of the effective exposure area ER along the X direction (the measurement of the long side) and LY represents the measurement of the effective exposure area ER along the Y direction (the measurement of the short side).

In addition, in the optical member data presented in Table (3), the surface numbers in the first column indicate the order in which the individual surfaces are set, starting from the reticle side, r in the second column indicates the radius of curvature of each surface (the radius of curvature at the vertex in the case of an aspherical surface: mm), d in the third column indicates the distances between the individual surfaces on the axis, i.e., the surface intervals (mm), and n in the fourth column indicates the reflective index corresponding to the central wavelength. It is to be noted that the sign attached to the value representing a surface interval d is switched each time the light is reflected. Accordingly, the sign attached to the values representing the surface intervals d within the optical path extending from the concave reflecting mirror M12 to the concave reflecting mirror M11 and the optical path extending from the concave reflecting mirror M22 to the concave reflecting mirror M21 is negative, and the sign is positive in the remaining optical path. In addition, regardless of the direction along which the light enters, the radius of curvature of a convex surface set facing toward the reticle assumes a positive value and the radius of curvature of a concave surface set facing toward the reticle assumes a negative value.

TABLE (3)

(main data)

λ = 157.6 nm
β = 1/5
NA = 0.8
A = 18 mm
B = 90 mm
LX = 20 mm
LY = 5 mm (optical member data)

| surface number | r | d | n |
|---|---|---|---|
| (reticle surface) | | 115.557292 | |
| 1 | 637.80078 | 35.884968 | 1.560000 (lens L11) |
| 2 | −384.35892 | 264.955326 | |
| 3 | −649.27643 | −234.955326 | (concave reflecting mirror M12) |
| 4 | 1823.09082 | 264.955326 | (concave reflecting mirror M11) |
| 5 | 801.77882 | 37.945664 | 1.560000 (lens L41) |
| 6 | −494.28706 | 3.445777 | |
| 7 | 369.70210 | 39.503113 | 1.560000 (lens L42) |
| 8* | −792.94351 | 343.865788 | |

TABLE (3)-continued

| | | |
|---|---|---|
| 9 | −1937.59830 | −284.229026 (concave reflecting mirror M22) |
| 10 | 155.49061 | −12.344063 1.560000 (lens L21) |
| 11 | 512.20865 | −17.292699 |
| 12 | 227.77903 | 17.292699 (concave reflecting mirror M21) |
| 13 | 512.20865 | 12.344063 1.560000 (lens L21) |
| 14 | 155.49061 | 314.229026 |
| 15 | −689.77068 | 17.668624 1.560000 (lens L51) |
| 16 | −259.40459 | 1.000000 |
| 17 | 8014.40173 | 18.997331 1.560000 (lens L52) |
| 18 | −384.30480 | 56.716677 |
| 19* | −1649.43052 | 30.000000 1.560000 (lens L31) |
| 20 | −393.58799 | 164.724808 |
| 21 | 631.85472 | 15.000000 1.560000 (lens L32) |
| 22 | 150.20509 | 19.656249 |
| 23 | 538.55887 | 15.000000 1.560000 (lens L33) |
| 24 | 1467.74312 | 31.821291 |
| 25 | 165.43316 | 25.293398 1.560000 (lens L34) |
| 26* | 367.95233 | 6.929525 |
| 27 | 350.71428 | 45.314099 1.560000 (lens L35) |
| 28 | −265.00281 | 45.939883 |
| 29* | −222.47865 | 20.000000 1.560000 (lens L36) |
| 30 | −254.36058 | 1.000000 |
| 31 | ∞ | 14.234702 (aperture stop AS) |
| 32* | −300.54174 | 30.000000 1.560000 (lens L37) |
| 33 | −831.20280 | 1.000000 |
| 34 | 202.39550 | 41.149482 1.560000 (lens L38) |
| 35* | −341.32295 | 1.000000 |
| 36 | 135.74819 | 60.768405 1.560000 (lens L39) |
| 37* | 873.19608 | 4.920450 |
| 38 | 95.14679 | 23.732322 1.560000 (lens L310) |
| 39 | 382.32196 | 4.152784 |
| 40 | −7890.70221 | 15.000000 1.560000 (lens L311) |
| 41 | 554.20021 | 1.823828 |
| 42 | 164.57547 | 17.998214 1.560000 (lens L312) |
| 43 | 21350.59500 (wafer surface) | 6.000000 |

(aspherical surface data)

surface 8

$\kappa = 0.000000$
$C_4 = 0.120134 \times 10^{-7}$   $C_6 = -0.141075 \times 10^{-12}$
$C_8 = 0.191837 \times 10^{-17}$   $C_{10} = -0.169436 \times 10^{-22}$ surface 19

$\kappa = 0.000000$
$C_4 = -0.153558 \times 10^{-7}$   $C_6 = -0.750057 \times 10^{-13}$
$C_8 = -0.110884 \times 10^{-16}$   $C_{10} = 0.325196 \times 10^{-22}$ surface 26

$\kappa = 0.000000$
$C_4 = 0.494425 \times 10^{-7}$   $C_6 = 0.707114 \times 10^{-12}$
$C_8 = 0.176474 \times 10^{-16}$   $C_{10} = 0.615523 \times 10^{-21}$ surface 29

$\kappa = 0.000000$
$C_4 = -0.755499 \times 10^{-8}$   $C_6 = 0.321947 \times 10^{-11}$
$C_8 = -0.596697 \times 10^{-17}$   $C_{10} = 0.457591 \times 10^{-20}$ surface 32

$\kappa = 0.000000$
$C_4 = -0.509707 \times 10^{-7}$   $C_6 = -0.426764 \times 10^{-11}$
$C_8 = 0.576131 \times 10^{-17}$   $C_{10} = -0.691255 \times 10^{-20}$ surface 35

$\kappa = 0.000000$
$C_4 = 0.283140 \times 10^{-9}$   $C_6 = 0.915262 \times 10^{-12}$
$C_8 = 0.266523 \times 10^{-16}$   $C_{10} = 0.112707 \times 10^{-21}$ surface 37

$\kappa = 0.000000$
$C_4 = 0.443648 \times 10^{-7}$   $C_6 = 0.354423 \times 10^{-11}$
$C_8 = 0.351861 \times 10^{-16}$   $C_{10} = -0.206407 \times 10^{-19}$ FIG. 9 shows the lateral aberration occurring in the catadioptric system in the third embodiment. In the aberration chart, Y represents the image height (mm). As the aberration chart clearly indicates, the chromatic aberration is properly corrected when the wavelength of the exposure light is within a range of 157.6 nm±0.3 pm in the third embodiment. In addition, the chart confirms that the spherical aberration, the coma aberration, the astigmatism and the distortion are successfully corrected to an extent to which they are practically non-existent and thus, outstanding image forming performance is achieved.

(Fourth Embodiment)

Figure 10:
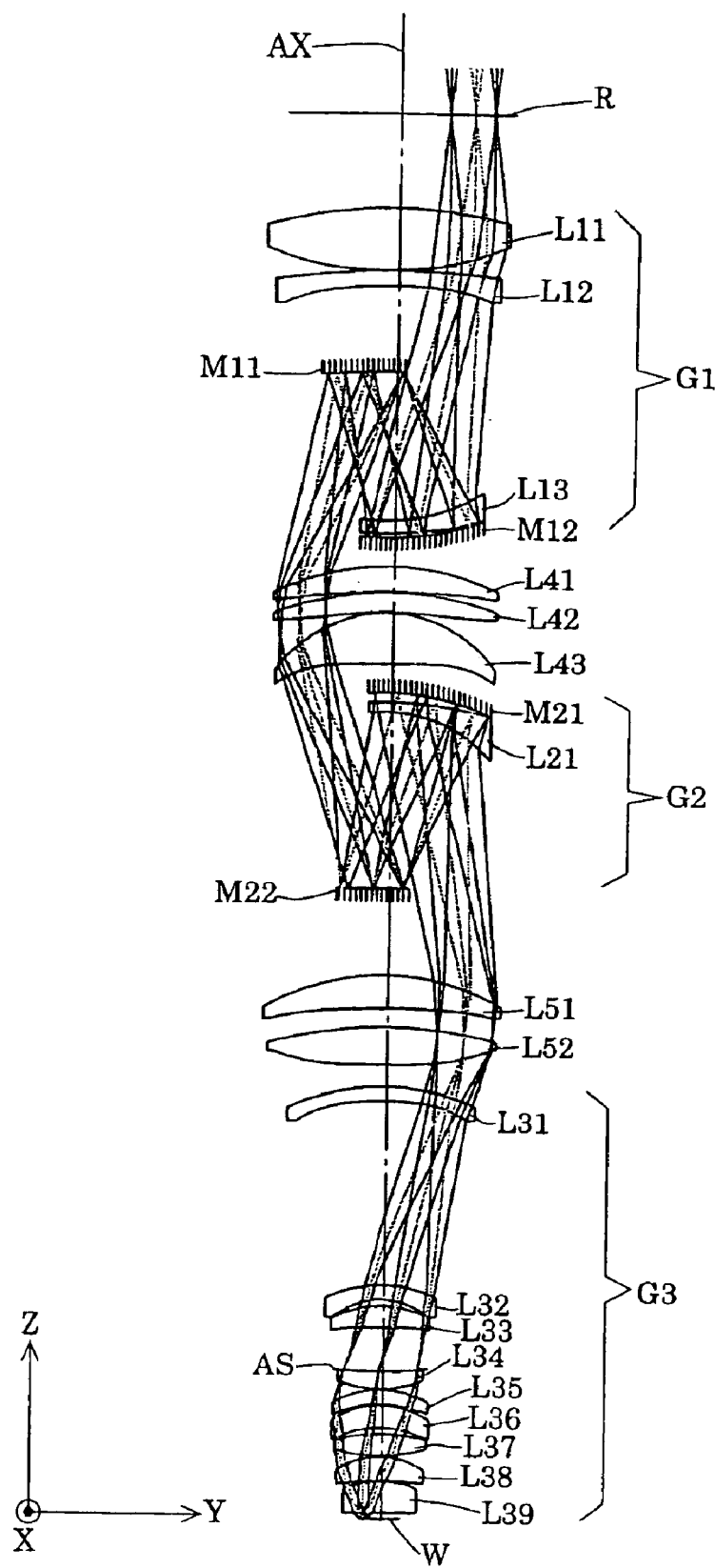
FIG. 10 shows the lens configuration of the catadioptric system achieved in a fourth embodiment.

FIG. 10 shows the lens configuration of the catadioptric system (projection optical system PL) achieved in the fourth embodiment. In the catadioptric system in FIG. 10, the first image forming optical system G1 is constituted with, starting on the reticle side, a biconvex lens 11 having an aspherical convex surface set facing toward the wafer, a negative meniscus lens L12 having an aspherical concave surface set facing toward the wafer, a concave reflecting mirror M11 having an almost flat concave surface set facing toward the wafer, a negative meniscus lens L13 having a concave surface set facing toward the reticle and a concave reflecting mirror M12 having a concave surface set facing toward the reticle.

In addition, the second image forming optical system G2 is constituted with, starting on the reticle side, a concave reflecting mirror M21 having a concave surface set facing toward the wafer, a negative meniscus lens L21 having a convex surface set facing toward the reticle and a concave reflecting mirror M22 having an almost flat concave surface set facing toward the reticle.

The third image forming optical system G3 is constituted with, starting on the reticle side, a positive meniscus lens L31 having an aspherical concave surface set facing toward the wafer, a negative meniscus lens L32 having an aspherical concave surface set facing toward the wafer, a positive meniscus lens L33 having an aspherical concave surface set facing toward the wafer, an aperture stop AS, a positive meniscus lens L34 having an aspherical concave surface set facing toward the reticle, a positive meniscus lens L35 having a convex surface set facing toward the reticle, a positive meniscus lens L36 having an aspherical concave surface set facing toward the wafer, a biconvex lens L37 having an aspherical convex surface set facing toward the wafer, a positive meniscus lens L38 having an aspherical concave surface set facing toward the wafer and a positive meniscus lens L39 having an aspherical convex surface set facing toward the reticle.

It is to be noted that a first field lens constituted with, starting on the reticle side, a positive meniscus lens L41 having a convex surface set facing toward the reticle, a positive meniscus lens L42 having an aspherical concave surface set facing toward the wafer and a positive meniscus lens L43 having an aspherical concave surface set facing toward the wafer is provided in the optical path between the first image forming optical system G1 and the second image forming optical system G2. In addition, a second field lens constituted with, starting on the reticle side, a positive meniscus lens L51 having an aspherical concave surface set facing toward the wafer and a biconvex lens L52 having an aspherical convex surface set facing toward the wafer is provided in the optical path between the second image forming optical system G2 and the third image forming optical system G3.

Thus, light from the reticle R enters the concave reflecting mirror M12 via the biconvex lens L11, the negative meniscus lens L12 and the negative meniscus lens L13 in the fourth embodiment. After the light having been reflected at the concave reflecting mirror M12 is reflected at the concave reflecting mirror M11 via the negative meniscus lens L13, the light forms the first intermediate image of the reticle pattern in the first field lens (L41~L43).

The light from the first intermediate image formed in the first field lens (L41~L43) is reflected at the concave reflecting mirror M22, is reflected at the concave reflecting mirror M21 via the negative meniscus lens L21 and forms the second intermediate image of the reticle pattern in the second field lens (L51 and L52) via the negative meniscus lens L21. The light from the second intermediate image formed in the second field lens (L51 and L52) forms the final image of the reticle pattern onto the wafer W via the lenses L31~L39 constituting the third image forming optical system G3.

Table (4) below lists data values regarding the catadioptric system achieved in the fourth embodiment. In the main data presented in Table (4), λ represents the central wavelength of the exposure light, β represents the projection magnification factor (the image forming magnification factor of the overall system), NA represents the image-side (wafer-side) numerical aperture, A represents the radius of the image circle IF on the wafer W, i.e., the maximum image height, B represents the maximum object height corresponding to the maximum image height A, LX represents the measurement of the effective exposure area ER along the X direction (the measurement of the long side) and LY represents the measurement of the effective exposure area ER along the Y direction (the measurement of the short side).

In addition, in the optical member data presented in Table (4), the surface numbers in the first column indicate the order in which the individual surfaces are set, starting from the reticle side, r in the second column indicates the radius of curvature of each surface (the radius of curvature at the vertex in the case of an aspherical surface: mm), d in the third column indicates the distances between the individual surfaces on the axis, i.e., the surface intervals (mm), and n in the fourth column indicates the refractive index corresponding to the central wavelength. It is to be noted that the sign attached to the value representing a surface interval d is switched each time the light is reflected. Accordingly, the sign attached to the values representing the surface intervals d within the optical path extending from the concave reflecting mirror M12 to the concave reflecting mirror M11 and the optical path extending from the concave reflecting mirror M22 to the concave reflecting mirror M21 is negative, and the sign is positive in the remaining optical path. In addition, regardless of the direction along which the light enters, the radius of curvature of a convex surface set facing toward the reticle assumes a positive value and the radius of curvature of a concave surface set facing toward the reticle assumes a negative value.

TABLE (4)

(main data)

λ = 157.6 nm
β = 1/5
NA = 0.6
A = 21 mm
B = 105 mm
LX = 22 mm
LY = 6 mm (optical member data)

| surface number | r | d | n | |
|---|---|---|---|---|
| | (reticle surface) | 89.750712 | | |
| 1 | 487.10912 | 59.670314 | 1.560000 | (lens L11) |
| 2* | −519.08376 | 1.000000 | | |
| 3 | 903.03433 | 15.000000 | 1.560000 | (lens L12) |
| 4* | 1000.08801 | 242.753250 | | |
| 5 | −175.15215 | 13.359375 | 1.560000 | (lens L13) |
| 6 | −345.12145 | 4.339428 | | |
| 7 | −279.08379 | −4.339428 | | (concave reflecting mirror M12) |
| 8 | −345.12145 | −13.359375 | 1.560000 | (lens L13) |

TABLE (4)-continued

| 9 | −175.15215 | −153.071977 | | |
|---|---|---|---|---|
| 10 | 1708.26507 | 200.770780 | | (concave reflecting mirror M11) |
| 11 | 249.41241 | 26.953146 | 1.560000 | (lens L41) |
| 12 | 718.70577 | 1.000000 | | |
| 13 | 309.55923 | 20.466222 | 1.560000 | (lens L42) |
| 14* | 307.16348 | 1.000000 | | |
| 15 | 130.97653 | 54.347087 | 1.560000 | (lens L43) |
| 16* | −1198.98798 | 237.403998 | | |
| 17 | −932.83768 | −186.980264 | | (concave reflecting mirror M22) |
| 18 | 136.92807 | −10.687500 | 1.560000 | (lens L21) |
| 19 | 362.11962 | −9.736234 | | |
| 20 | 239.02716 | 9.736234 | | (concave reflecting mirror M21) |
| 21 | 362.11962 | 10.687500 | 1.560000 | (lens L21) |
| 22 | 136.92807 | 279.616570 | | |
| 23 | 234.11735 | 35.444231 | 1.560000 | (lens L51) |
| 24* | 166013.12617 | 19.145884 | | |
| 25 | 443.29340 | 39.864137 | 1.560000 | (lens L52) |
| 26* | 5423.37926 | 22.505878 | | |
| 27 | 224.26889 | 15.000000 | 1.560000 | (lens L31) |
| 28* | 450.00000 | 191.487329 | | |
| 29 | 131.47312 | 15.000000 | 1.560000 | (lens L32) |
| 30* | 73.42096 | 6.655173 | | |
| 31 | 107.95341 | 21.906621 | 1.560000 | (lens L33) |
| 32* | −557437.69550 | 42.476569 | | |
| 33 | ∞ | 2.832772 | | (aperture stop AS) |
| 34* | −431.12055 | 17.973889 | 1.560000 | (lens L34) |
| 35 | −118.75437 | 1.000000 | | |
| 36 | 99.31449 | 15.000000 | 1.560000 | (lens L35) |
| 37 | 127.78163 | 1.000000 | | |
| 38 | 92.45252 | 21.852801 | 1.560000 | (lens L36) |
| 39* | 118.80433 | 6.195531 | | |
| 40 | 198.80815 | 21.182933 | 1.560000 | (lens L37) |
| 41* | −156.29012 | 1.000000 | | |
| 42 | 77.69761 | 24.589309 | 1.560000 | (lens L38) |
| 43* | 443.02200 | 1.000000 | | |
| 44* | 133.51267 | 31.188952 | 1.560000 | (lens L39) |
| 45 | 17904.27963 | 6.018159 | | |
| | (wafer surface) | | | |

(aspherical surface data)

surface 2

$\kappa = 0.000000$
$C_4 = -0.815643 \times 10^{-7}$     $C_6 = 0.413258 \times 10^{-11}$
$C_8 = -0.113569 \times 10^{-15}$     $C_{10} = 0.147898 \times 10^{-20}$ surface 4

$\kappa = 0.000000$
$C_4 = 0.114732 \times 10^{-6}$     $C_6 = -0.219867 \times 10^{-11}$
$C_8 = 0.617602 \times 10^{-16}$     $C_{10} = -0.322366 \times 10^{-21}$ surface 14

$\kappa = 0.000000$
$C_4 = -0.117278 \times 10^{-6}$     $C_6 = 0.199688 \times 10^{-11}$
$C_8 = 0.688425 \times 10^{-16}$     $C_{10} = -0.127291 \times 10^{-20}$ surface 16

$\kappa = 0.000000$
$C_4 = 0.191460 \times 10^{-6}$     $C_6 = 0.172729 \times 10^{-11}$
$C_8 = -0.417938 \times 10^{-15}$     $C_{10} = 0.122892 \times 10^{-19}$ surface 24

$\kappa = 0.000000$
$C_4 = 0.101006 \times 10^{-6}$     $C_6 = -0.601731 \times 10^{-11}$
$C_8 = 0.336098 \times 10^{-15}$     $C_{10} = -0.113255 \times 10^{-19}$ surface 26

$\kappa = 0.000000$
$C_4 = -0.259409 \times 10^{-6}$     $C_6 = 0.200455 \times 10^{-10}$
$C_8 = -0.886510 \times 10^{-15}$     $C_{10} = 0.203312 \times 10^{-19}$ surface 28

$\kappa = 0.000000$
$C_4 = 0.254720 \times 10^{-6}$     $C_6 = -0.499612 \times 10^{-11}$
$C_8 = -0.101235 \times 10^{-15}$     $C_{10} = 0.475827 \times 10^{-19}$ TABLE (4)-continued surface 30

$\kappa = 0.000000$
$C_4 = -0.122986 \times 10^{-6}$    $C_6 = -0.297417 \times 10^{-10}$
$C_8 = -0.286999 \times 10^{-14}$   $C_{10} = -0.314877 \times 10^{-18}$ surface 32

$\kappa = 0.000000$
$C_4 = 0.260763 \times 10^{-6}$     $C_6 = 0.278223 \times 10^{-10}$
$C_8 = 0.311168 \times 10^{-14}$    $C_{10} = 0.409140 \times 10^{-18}$ surface 34

$\kappa = 0.000000$
$C_4 = -0.246966 \times 10^{-7}$    $C_6 = -0.328800 \times 10^{-11}$
$C_8 = 0.155119 \times 10^{-14}$    $C_{10} = 0.481917 \times 10^{-19}$ surface 39

$\kappa = 0.000000$
$C_4 = 0.363517 \times 10^{-6}$     $C_6 = 0.688387 \times 10^{-12}$
$C_8 = 0.263082 \times 10^{-14}$    $C_{10} = 0.401937 \times 10^{-18}$ surface 41

$\kappa = 0.000000$
$C_4 = 0.171166 \times 10^{-6}$     $C_6 = -0.110988 \times 10^{-10}$
$C_8 = 0.989095 \times 10^{-15}$    $C_{10} = 0.238040 \times 10^{-18}$ surface 43

$\kappa = 0.000000$
$C_4 = 0.130469 \times 10^{-6}$     $C_6 = 0.132452 \times 10^{-9}$
$C_8 = -0.246540 \times 10^{-13}$   $C_{10} = 0.404311 \times 10^{-17}$ surface 44

Figure 11:
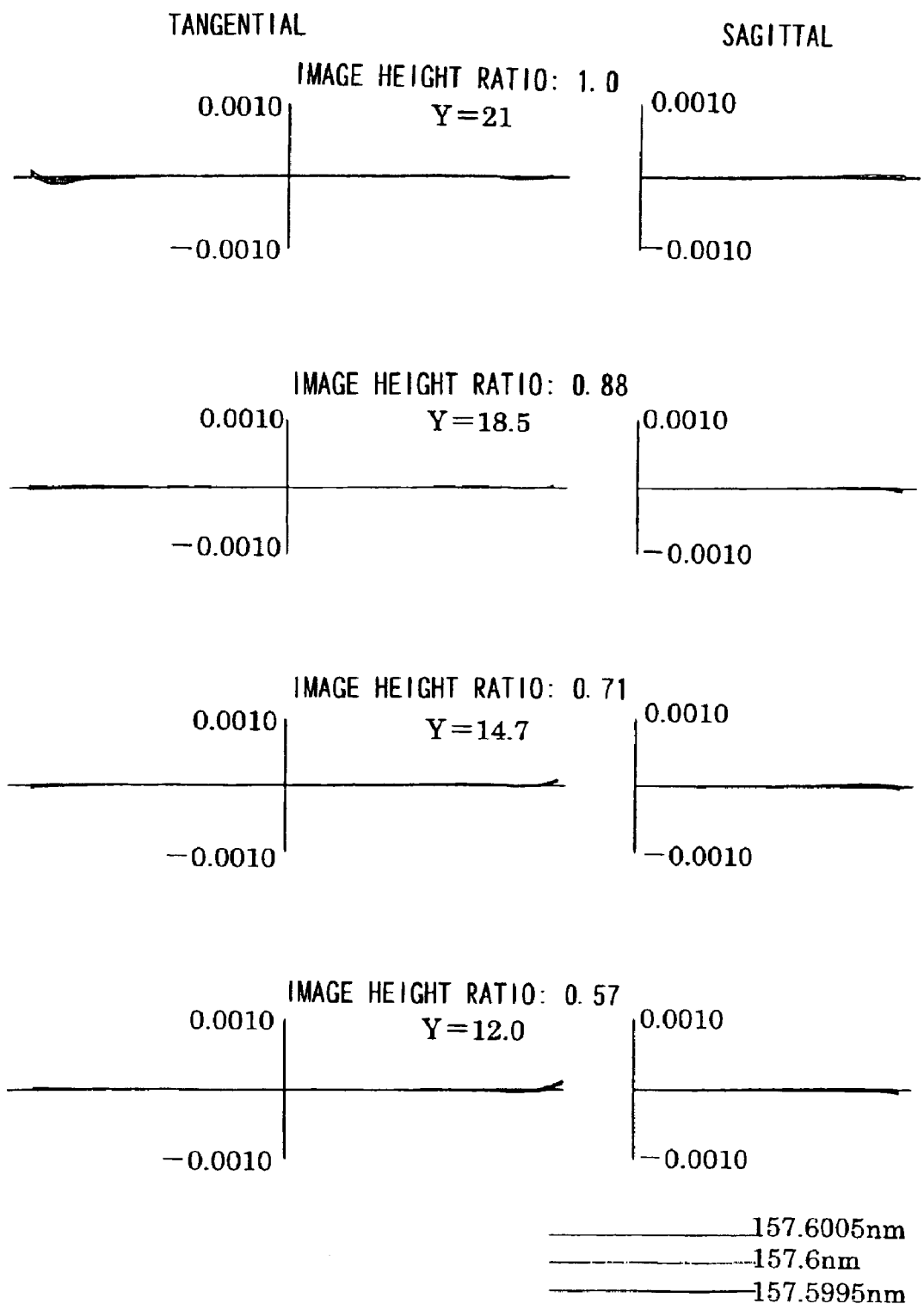
FIG. 11 shows the lateral aberration manifesting at the catadioptric system in the fourth embodiment.

$\kappa = 0.000000$
$C_4 = 0.736368 \times 10^{-6}$     $C_6 = 0.554124 \times 10^{-10}$
$C_8 = 0.111988 \times 10^{-13}$    $C_{10} = 0.498595 \times 10^{-17}$ FIG. 11 shows the lateral aberration occurring in the catadioptric system in the fourth embodiment. In the aberration chart, Y represents the image height (mm). As the aberration chart clearly indicates, the chromatic aberration is properly corrected in the fourth embodiment when the wavelength of the exposure light is within a range of 157.6 nm±0.5 pm, as in the first and second embodiments. In addition, the chart confirms that the spherical aberration, the coma aberration, the astigmatism and the distortion are successfully corrected to an extent to which they are practically non-existent and thus, outstanding image forming performance is achieved.

(Fifth Embodiment)

Figure 12:
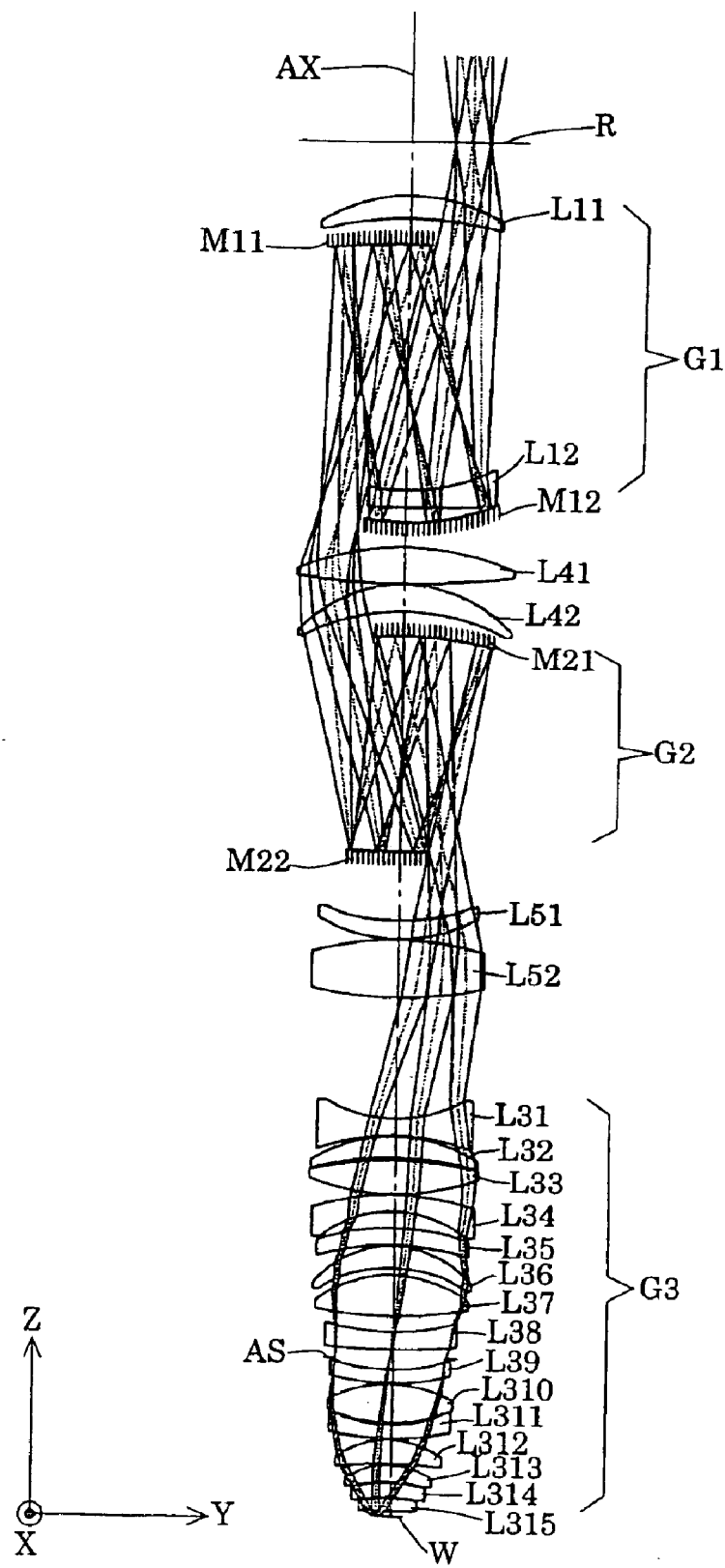
FIG. 12 shows the lens configuration of the catadioptric system achieved in a fifth embodiment.

FIG. 12 shows the lens configuration of the catadioptric system (projection optical system PL) achieved in the fifth embodiment. In the catadioptric system in FIG. 12, the first image forming optical system G1 is constituted with, starting on the reticle side, a positive meniscus lens L11 having a convex surface set facing toward the reticle, a concave reflecting mirror M11 having an almost flat concave surface set facing toward the wafer, a negative meniscus lens L12 having a concave surface set facing toward the reticle and a concave reflecting mirror M12 having a concave surface set facing toward the reticle.

The second image forming optical system G2 is constituted with, starting on the reticle side, a concave reflecting mirror M21 having a concave surface set facing toward the wafer and a concave reflecting mirror M22 having an almost flat concave surface set facing toward the reticle.

The third image forming optical system G3 is constituted with, starting on the reticle side, a biconcave lens L31, a positive meniscus lens L32 having an aspherical concave surface set facing toward the wafer, a biconvex lens L33, a negative meniscus lens L34 having a convex surface set facing toward the reticle, a positive meniscus lens L35 having a convex surface set facing toward the reticle, a positive meniscus lens L36 having an aspherical concave surface set facing toward the wafer, a biconvex lens L37, a negative meniscus lens L38 having a concave surface set facing toward the reticle, an aperture stop AS, a negative meniscus lens L39 having an aspherical concave surface set facing toward the reticle, a biconvex lens L310 having an aspherical convex surface set facing toward the wafer, a negative meniscus lens L311 having a concave surface set facing toward the reticle, a positive meniscus lens L312 having an aspherical concave surface set facing toward the wafer, a positive meniscus lens L313 having a convex surface set facing toward the reticle, a positive meniscus lens L314 having a convex surface set facing toward the reticle and a biconvex lens L315.

It is to be noted that a first field lens constituted with, starting on the reticle side, a biconvex lens L41 and a positive meniscus lens L42 having an aspherical concave surface set facing toward the wafer is provided in the optical path between the first image forming optical system G1 and the second image forming optical system G2. A second field lens constituted with, starting on the reticle side, a positive meniscus lens L51 having an aspherical concave surface set facing toward the reticle and a biconvex lens L52 is provided in the optical path between the second image forming optical system G2 and the third image forming optical system G3.

Thus, light from the reticle R enters the concave reflecting mirror M12 via the positive meniscus lens L11 and the negative meniscus lens L12 in the fifth embodiment. After the light having been reflected at the concave reflecting mirror M12 is reflected at the concave reflecting mirror M11 via the negative meniscus lens L12, the light forms the first intermediate image of the reticle pattern near the first field lens (L41 and L42).

After the light from the first intermediate image is sequentially reflected at the concave reflecting mirror M22 and the concave reflecting mirror M21 via the first field lens (L41 and L42), the light forms the second intermediate image of the reticle pattern near the second field lens (L51 and L52). The light from the second intermediate image then forms the final image of the reticle pattern onto the wafer W via the second field lens (L51 and L52) and the lenses L31~L315 constituting the third image forming optical system G3.

Table (5) below lists data values regarding the catadioptric system achieved in the fifth embodiment. In the main data presented in Table (5), λ represents the central wavelength of the exposure light, β represents the projection magnification factor (the image forming magnification factor of the overall system), NA represents the image-side (wafer-side) numerical aperture, A represents the radius of the image circle IF on the wafer W, i.e., the maximum image height, B represents the maximum object height corresponding to the maximum image height A, LX represents the measurement of the effective exposure area ER along the X direction (the measurement of the long side) and LY represents the measurement of the effective exposure area ER along the Y direction (the measurement of the short side).

In addition, in the optical member data presented in Table (5), the surface numbers in the first column indicate the order in which the individual surfaces are set, starting from the reticle side, r in the second column indicates the radius of curvature of each surface (the radius of curvature at the vertex in the case of an aspherical surface: mm), d in the third column indicates the distances between the individual surfaces on the axis, i.e., the surface intervals (mm,) and n in the fourth column indicates the refractive index corresponding to the central wavelength. It is to be noted that the sign attached to the value representing a surface interval d is switched each time the light is reflected. Accordingly, the sign attached to the values representing the surface intervals d within the optical path extending from the concave reflecting mirror M12 to the concave reflecting mirror M11 and the optical path extending from the concave reflecting mirror M22 to the concave reflecting mirror M21 is negative, and the sign is positive in the remaining optical path. In addition, regardless of the direction along which the light enters, the radius of curvature of a convex surface set facing toward the reticle assumes a positive value and the radius of curvature of a concave surface set facing toward the reticle assumes a negative value.

TABLE (5)

(main data)

$\lambda = 157.6$ nm
$\beta = 1/5$
$NA = 0.8$
$A = 18$ mm
$B = 90$ mm
$LX = 20$ mm
$LY = 5$ mm (optical member data)

| surface number | r | d | n |
|---|---|---|---|
| | (reticle surface) | 61.000000 | |
| 1 | 211.27080 | 26.106514 | 1.560000 (lens L11) |
| 2 | 459.51275 | 321.906829 | |
| 3 | −213.95008 | 20.000000 | 1.560000 (lens L12) |
| 4 | −1566.75457 | 16.802820 | |
| 5 | −284.67128 | −16.802820 | (concave reflecting mirror M12) |
| 6 | −1566.75457 | −20.000000 | 1.560000 (lens L12) |
| 7 | −213.95008 | −291.906829 | |
| 8 | 1086.35493 | 358.709650 | (concave reflecting mirror M11) |
| 9 | 318.29494 | 44.860140 | 1.560000 (lens L41) |
| 10 | −887.18127 | 1.000000 | |
| 11 | 171.70178 | 32.360508 | 1.560000 (lens L42) |
| 12* | 289.71170 | 292.761556 | |
| 13 | −1680.12168 | −262.761555 | (concave reflecting mirror M22) |
| 14 | 417.88785 | 346.788846 | (concave reflecting mirror M21) |
| 15* | −280.27770 | 23.000000 | 1.560000 (lens L51) |
| 16 | −181.49299 | 1.000000 | |
| 17 | 362.82014 | 70.000000 | 1.560000 (lens L52) |
| 18 | −416.73075 | 146.098155 | |
| 19 | −156.85191 | 20.000000 | 1.560000 (lens L31) |
| 20 | 267.60016 | 1.000000 | |
| 21 | 187.76395 | 25.225435 | 1.560000 (lens L32) |
| 22* | 384.80207 | 2.961318 | |
| 23 | 431.01527 | 41.508704 | 1.560000 (lens L33) |
| 24 | −276.05667 | 1.000000 | |
| 25 | 308.47916 | 20.000000 | 1.560000 (lens L34) |
| 26 | 136.01010 | 20.206121 | |
| 27 | 277.79256 | 21.000000 | 1.560000 (lens L35) |
| 28 | 333.49880 | 1.000000 | |
| 29 | 125.27880 | 25.793541 | 1.560000 (lens L36) |
| 30* | 216.27362 | 7.601524 | |
| 31 | 154.24702 | 48.496542 | 1.560000 (lens L37) |
| 32 | −544.19222 | 18.722230 | |
| 33 | −285.23875 | 20.000000 | 1.560000 (lens L38) |
| 34 | −800.51580 | 10.000000 | |
| 35 | ∞ | 13.059929 | (aperture stop AS) |
| 36* | −322.74880 | 16.000000 | 1.560000 (lens L39) |
| 37 | −286.86928 | 1.000000 | |
| 38 | 164.94509 | 45.299315 | 1.560000 (lens L310) |
| 39* | −210.06061 | 2.818820 | |
| 40 | −163.13416 | 15.000000 | 1.560000 (lens L311) |
| 41 | −369.63693 | 1.000000 | |
| 42 | 111.12796 | 27.284262 | 1.560000 (lens L312) |
| 43* | 1842.35594 | 1.000000 | |
| 44 | 92.22880 | 20.000000 | 1.560000 (lens L313) |
| 45 | 177.36266 | 1.236998 | |
| 46 | 177.43094 | 16.861444 | 1.560000 (lens L314) |

TABLE (5)-continued

| 47 | 186.23389 | 1.000000 | |
|---|---|---|---|
| 48 | 165.56422 | 15.000000 | 1.560000 (lens L315) |
| 49 | −1131.06283 | 6.000000 | |
| | (wafer surface) | | |

(aspherical surface data)

surface 12

$\kappa = 0.000000$
$C_4 = 0.181313 \times 10^{-7}$     $C_6 = 0.145718 \times 10^{-12}$
$C_8 = -0.178341 \times 10^{-17}$    $C_{10} = 0.265148 \times 10^{-21}$ surface 15

$\kappa = 0.000000$
$C_4 = -0.588707 \times 10^{-7}$     $C_6 = -0.844226 \times 10^{-12}$
$C_8 = -0.743823 \times 10^{-16}$    $C_{10} = -0.197114 \times 10^{-21}$ surface 22

$\kappa = 0.000000$
$C_4 = -0.294829 \times 10^{-7}$     $C_6 = 0.384432 \times 10^{-11}$
$C_8 = -0.393756 \times 10^{-16}$    $C_{10} = -0.345603 \times 10^{-21}$ surface 30

$\kappa = 0.000000$
$C_4 = 0.100809 \times 10^{-6}$      $C_6 = 0.669526 \times 10^{-12}$
$C_8 = -0.609327 \times 10^{-17}$    $C_{10} = 0.830042 \times 10^{-21}$ surface 36

$\kappa = 0.000000$
$C_4 = -0.137850 \times 10^{-6}$     $C_6 = -0.508803 \times 10^{-11}$
$C_8 = -0.272924 \times 10^{-15}$    $C_{10} = -0.202953 \times 10^{-19}$ surface 39

$\kappa = 0.000000$
$C_4 = -0.111530 \times 10^{-6}$     $C_6 = 0.650079 \times 10^{-11}$
$C_8 = 0.157560 \times 10^{-15}$     $C_{10} = -0.172336 \times 10^{-19}$ surface 43

Figure 13:
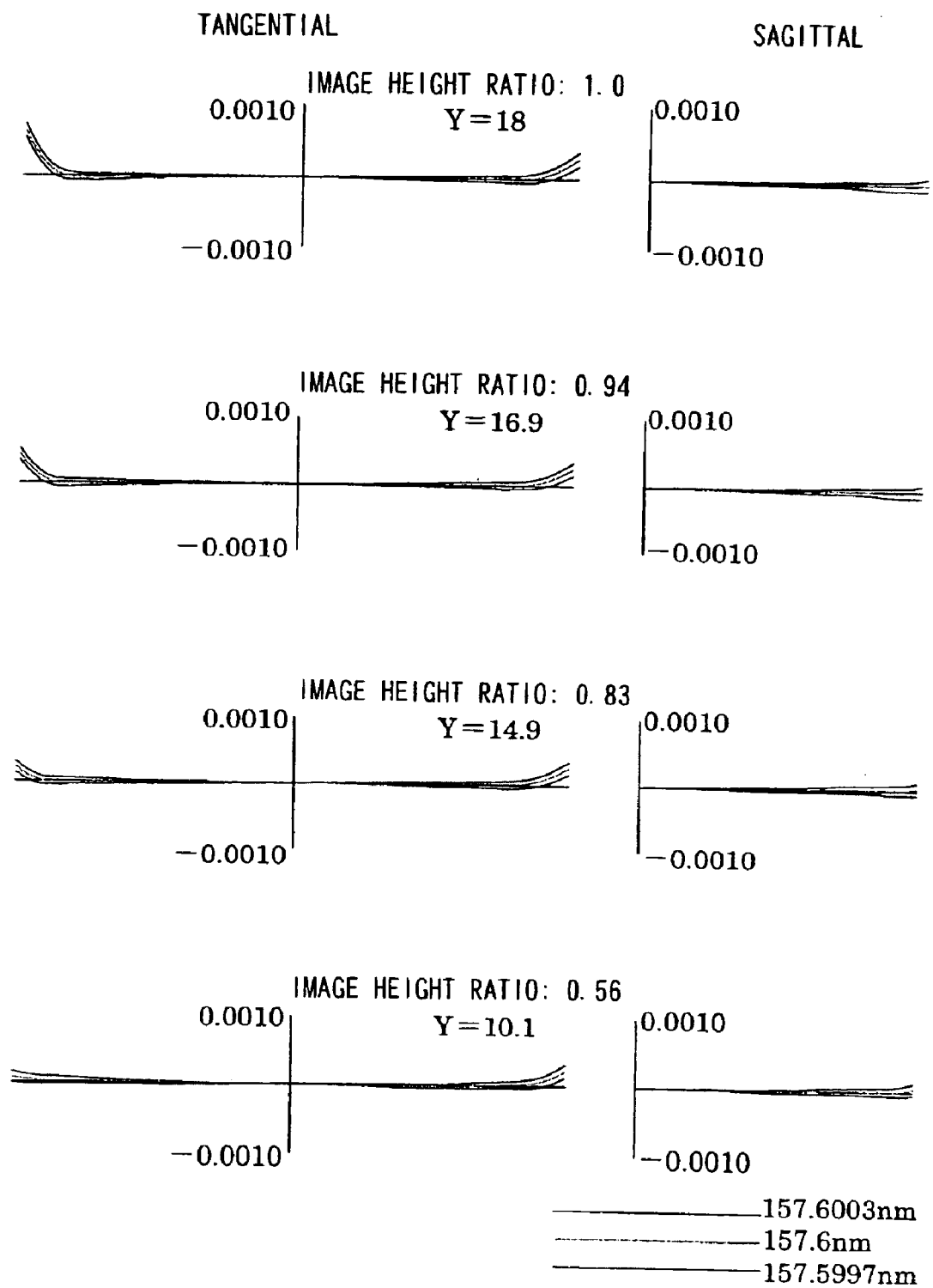
FIG. 13 shows the lateral aberration manifesting at the catadioptric system in the fifth embodiment.

$\kappa = 0.000000$
$C_4 = 0.170111 \times 10^{-6}$      $C_6 = -0.258296 \times 10^{-11}$
$C_8 = 0.608232 \times 10^{-15}$     $C_{10} = 0.232160 \times 10^{-19}$ FIG. 13 shows the lateral aberration occurring in the catadioptric system in the fifth embodiment. In the aberration chart, Y represents the image height (mm). As the aberration chart clearly indicates, the chromatic aberration is properly corrected in the fifth embodiment when the wavelength of the exposure light is within a range of 157.6 nm±0.3 pm, as in the third embodiment. In addition, the chart confirms that the spherical aberration, the coma aberration, the astigmatism and the distortion are successfully corrected to an extent to which they are practically non-existent and thus, outstanding image forming performance is achieved.

(Sixth Embodiment)

Figure 14:
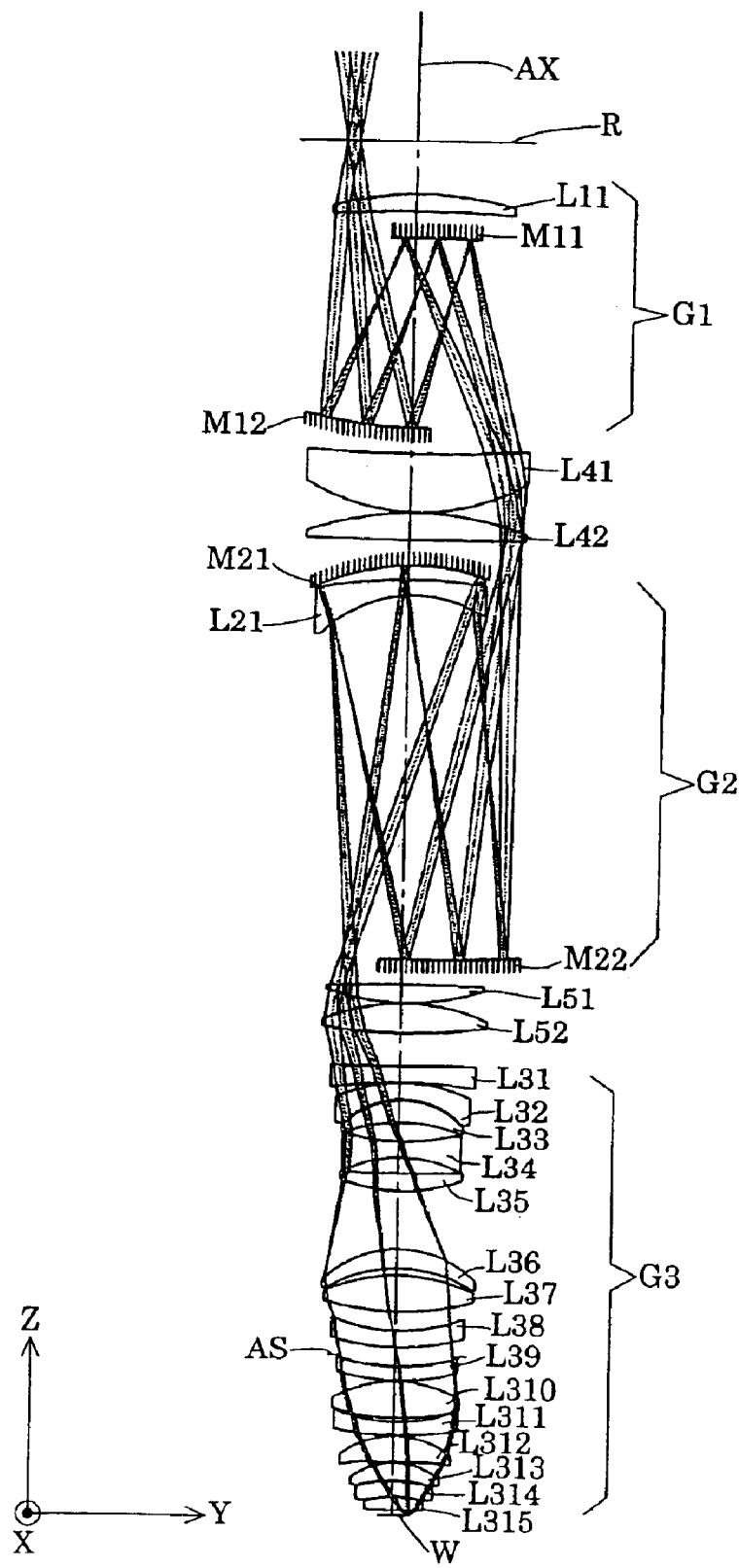
FIG. 14 shows the lens configuration of the catadioptric system achieved in a sixth embodiment.

FIG. 14 shows the lens configuration of the catadioptric system (projection optical system PL) achieved in the sixth embodiment. In the catadioptric system in FIG. 14, the first image forming optical system G1 is constituted with, starting on the reticle side, a positive meniscus lens L11 having a convex surface set facing toward the reticle, a concave reflecting mirror M11 having an almost flat concave surface set facing toward the wafer and a concave reflecting mirror M12 having a concave surface set facing toward the reticle.

The second image forming optical system G2 is constituted with, starting on the reticle side, a concave reflecting mirror M21 having a concave surface set facing toward the wafer, a negative meniscus lens L21 having a convex surface set facing toward the reticle and a concave reflecting mirror M22 having an almost flat concave surface set facing toward the reticle.

The third image forming optical system G3 is constituted with, starting on the reticle side, a biconcave lens L31, a negative meniscus lens L32 having an aspherical concave surface set facing toward the wafer, a positive meniscus lens L33 having a convex surface set facing toward the reticle, a biconcave lens L34, a negative meniscus lens L35 having a concave surface set facing toward the reticle, a positive meniscus lens L36 having an aspherical concave surface set facing toward the wafer, a biconvex lens L37, a negative meniscus lens L38 having a concave surface set facing toward the reticle, an aperture stop AS, a positive meniscus lens L39 having an aspherical concave surface set facing toward the reticle, a biconvex lens L310 having an aspherical convex surface set facing toward the wafer, a negative meniscus lens L311 having a concave surface set facing toward the reticle, a positive meniscus lens L312 having an aspherical concave surface set facing toward the wafer, a positive meniscus lens L313 having a convex surface set facing toward the reticle, a negative meniscus lens L314 having a convex surface set facing toward the reticle and a biconvex lens L315.

It is to be noted that a first field lens constituted with, starting on the reticle side, a positive meniscus lens L41 having a concave surface set facing toward the reticle and a biconvex lens L42 having an aspherical convex surface set facing toward the wafer is provided in the optical path between the first image forming optical system G1 and the second image forming optical system G2. In addition, a second field lens constituted with, starting on the reticle side, a biconvex lens L51 having an aspherical convex surface set facing toward the reticle and a biconvex lens L52 is provided in the optical path between the second image forming optical system G2 and the third image forming optical system G3.

Thus, light from the reticle R enters the concave reflecting mirror M12 via the positive meniscus lens L11 in the sixth embodiment. After the light having been reflected at the concave reflecting mirror M12 is reflected at the concave reflecting mirror M11, the light forms the first intermediate image of the reticle pattern in the first field lens (L41 and L42).

The light from the first intermediate image formed in the first field lens (L41 and L42) is reflected at the concave reflecting mirror M22, is reflected at the concave reflecting mirror M21 via the negative meniscus lens L21 and then forms the second intermediate image of the reticle pattern near the second field lens (L51 and L52) via the negative meniscus lens L21. The light from the second intermediate image then forms the final image of the reticle pattern onto the wafer W via the second field lens (L51 and L52) and the lens L31~L315 constituting the third image forming optical system G3.

Figure 15:
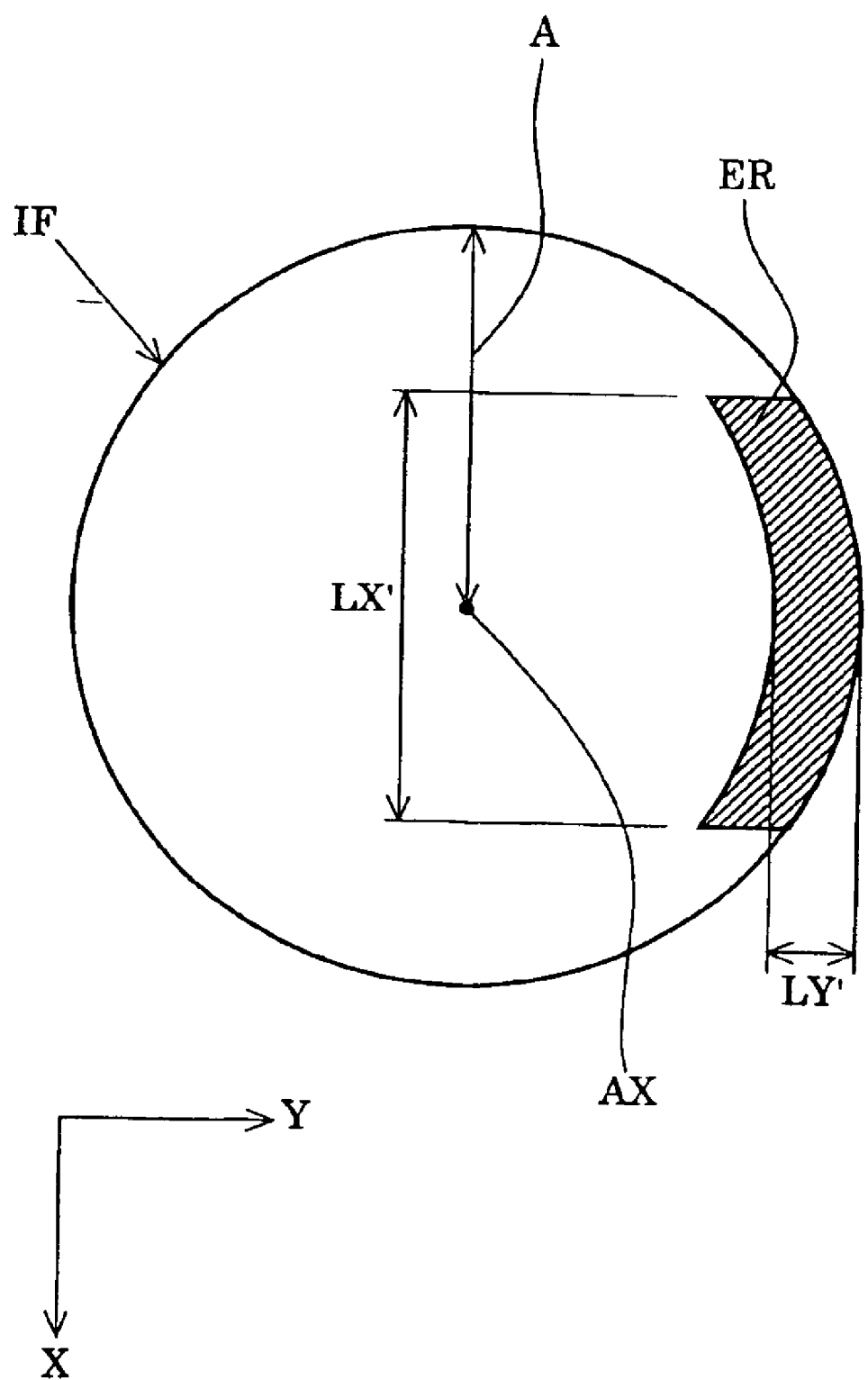
FIG. 15 shows that positional relationship between the arch-shaped effective exposure area formed on the wafer and the reference optical axis in the sixth embodiment.

It is to be noted that while a rectangular effective exposure area ER is formed on the wafer W in the first~fifth embodiments described above, an effective exposure area ER in a circular arch shape is formed in the sixth embodiment. FIG. 15 shows the positional relationship between the circular arch-shaped effective exposure area formed on the wafer and the reference optical axis achieved in the sixth embodiment. As shown in FIG. 15, a circular arch-shaped effective exposure area ER in a desired size is set at a position off the reference optical axis AX along the +Y direction within a circular area (image circle) IF with a radius A (which corresponds to the maximum image height) centered around the reference optical axis in the sixth embodiment. The arch-shaped effective exposure area ER measures LX' along the X direction and LY' along the Y direction. Thus, a circular arch-shaped illumination area IR having a size and shape corresponding to those of the circular arch-shaped effective exposure area ER is formed on the reticle R at a position off the reference optical axis AX along the −Y direction. Namely, the circular arch-shaped illumination area IR in a desired size is set at a position off the reference optical axis AX along the −Y direction within a circular area having a radius B (which corresponds to the maximum object height) centering around the reference optical axis AX.

Table (6) below lists data values regarding the catadioptric system achieved in the sixth embodiment. In the main data presented in Table (6), $\lambda$ represents the central wavelength of the exposure light, $\beta$ represents the projection magnification factor (the image forming magnification factor of the overall system), NA represents the image-side (wafer-side) numerical aperture, A represents the radius of the image circle IF on the wafer W, i.e., the maximum image height, B represents the maximum object height corresponding to the maximum image height A, LX' represents the measurement of the circular arch-shaped effective exposure area ER along the X direction and LY' represents the measurement of the circular arch-shaped effective exposure area ER along the Y direction.

In addition, in the optical member data presented in Table (6), the surface numbers in the first column indicate the order in which the individual surfaces are set, starting from the reticle side, r in the second column indicates the radius of curvature of each surface (the radius of curvature at the vertex in the case of an aspherical surface: mm), d in the third column indicates the distances between the individual surfaces on the axis, i.e., the surface intervals (mm,) and n in the fourth column indicates the reflective index corresponding to the central wavelength. It is to be noted that the sign attached to the value representing a surface interval d is switched each time the light is reflected. Accordingly, the sign attached to the values representing the surface intervals d within the optical path extending from the concave reflecting mirror M12 to the concave reflecting mirror M11 and the optical path extending from the concave reflecting mirror M22 to the concave reflecting mirror M21 is negative, and the sign is positive in the remaining optical path. In addition, regardless of the direction along which the light enters, the radius of curvature of the convex surface set facing toward the reticle assumes a positive value and the radius of curvature of a concave surface set facing toward the reticle assumes a negative value.

TABLE (6)

(main data)

$\lambda$ = 157.6 nm
$\beta$ = 1/5
NA = 0.8
A = 18 mm
B = 90 mm
LX' = 20 mm
LY' = 3 mm (optical member data)

| surface number | r | d | n |
|---|---|---|---|
| | (reticle surface) | 60.000000 | |
| 1 | 419.18852 | 19.580407 | 1.560000 (lens L11) |
| 2 | 1680.57391 | 254.993608 | |
| 3 | −489.61861 | −224.993608 | (concave reflecting mirror M12) |
| 4 | 2084.90414 | 254.993608 | (concave reflecting mirror M11) |
| 5 | −1514.77737 | 69.985952 | 1.560000 (lens L41) |
| 6 | −244.82172 | 1.000000 | |
| 7 | 364.28042 | 32.967769 | 1.560000 (lens L42) |
| 8* | −3138.44099 | 509.623508 | |
| 9 | −2184.60801 | −442.835110 | (concave reflecting mirror M22) |
| 10 | 149.68327 | −20.000000 | 1.560000 (lens L21) |

TABLE (6)-continued

| | | | |
|---|---|---|---|
| 11 | 559.08929 | −16.788398 | |
| 12 | 263.00265 | 16.788398 | (concave reflecting mirror M21) |
| 13 | 559.08929 | 20.000000 | 1.560000 (lens L21) |
| 14 | 149.68327 | 442.835110 | |
| 15* | 1889.70924 | 23.000000 | 1.560000 (lens L51) |
| 16 | −264.21722 | 1.000000 | |
| 17 | 233.99661 | 35.823627 | 1.560000 (lens L52) |
| 18 | −619.37646 | 38.987456 | |
| 19 | −5441.96593 | 20.000000 | 1.560000 (lens L31) |
| 20 | 502.25155 | 1.000000 | |
| 21 | 182.75539 | 20.000000 | 1.560000 (lens L32) |
| 22* | 97.20773 | 1.457183 | |
| 23 | 97.56626 | 26.063961 | 1.560000 (lens L33) |
| 24 | 183.48181 | 23.001316 | |
| 25 | −240.13113 | 20.000000 | 1.560000 (lens L34) |
| 26 | 145.02922 | 19.973246 | |
| 27 | −950.10258 | 21.000000 | 1.560000 (lens L35) |
| 28 | −183.48772 | 69.067372 | |
| 29 | 126.47126 | 23.315183 | 1.560000 (lens L36) |
| 30* | 187.64534 | 7.841194 | |
| 31 | 217.50174 | 40.946892 | 1.560000 (lens L37) |
| 32 | −326.63509 | 22.449513 | |
| 33 | −196.62797 | 20.000000 | 1.560000 (lens L38) |
| 34 | −267.67602 | 10.000000 | |
| 35 | ∞ | 12.422431 | (aperture stop AS) |
| 36* | −340.00000 | 16.000000 | 1.560000 (lens L39) |
| 37 | −248.51990 | 1.000000 | |
| 38 | 156.19975 | 43.018450 | 1.560000 (lens L310) |
| 39* | −324.35639 | 5.121067 | |
| 40 | −177.96849 | 15.000000 | 1.560000 (lens L311) |
| 41 | −358.98302 | 1.000000 | |
| 42 | 107.39866 | 29.810536 | 1.560000 (lens L312) |
| 43* | −5286.38967 | 1.000000 | |
| 44 | 88.60392 | 20.000000 | 1.560000 (lens L313) |
| 45 | 178.21372 | 1.000000 | |
| 46 | 177.28766 | 17.334341 | 1.560000 (lens L314) |
| 47 | 131.47878 | 1.213668 | |
| 48 | 131.32841 | 15.001321 | 1.560000 (lens L315) |
| 49 | −1923.73296 | 6.000000 | |
| | (wafer surface) | | |

(aspherical surface data)

surface 8

$\kappa = 0.000000$
$C_4 = 0.554200 \times 10^{-8}$      $C_6 = -0.280967 \times 10^{-13}$
$C_8 = 0.778972 \times 10^{-18}$     $C_{10} = -0.177500 \times 10^{-22}$ surface 15

$\kappa = 0.000000$
$C_4 = -0.109228 \times 10^{-7}$     $C_6 = -0.364285 \times 10^{-12}$
$C_8 = 0.142762 \times 10^{-16}$     $C_{10} = -0.362739 \times 10^{-21}$ surface 22

$\kappa = 0.000000$
$C_4 = 0.225626 \times 10^{-7}$      $C_6 = -0.154524 \times 10^{-12}$
$C_8 = 0.164766 \times 10^{-16}$     $C_{10} = 0.164885 \times 10^{-20}$ surface 30

$\kappa = 0.000000$
$C_4 = 0.379428 \times 10^{-7}$      $C_6 = 0.163017 \times 10^{-11}$
$C_8 = 0.684667 \times 10^{-16}$     $C_{10} = -0.115849 \times 10^{-20}$ surface 36

$\kappa = 0.000000$
$C_4 = -0.146106 \times 10^{-6}$     $C_6 = -0.502919 \times 10^{-11}$
$C_8 = -0.270461 \times 10^{-15}$    $C_{10} = -0.186877 \times 10^{-19}$ surface 39

$\kappa = 0.000000$
$C_4 = -0.159225 \times 10^{-6}$     $C_6 = 0.844367 \times 10^{-11}$
$C_8 = 0.120649 \times 10^{-15}$     $C_{10} = -0.173041 \times 10^{-19}$ surface 43

$\kappa = 0.000000$
$C_4 = 0.204302 \times 10^{-6}$      $C_6 = -0.422928 \times 10^{-11}$
$C_8 = 0.824463 \times 10^{-15}$     $C_{10} = 0.719034 \times 10^{-20}$ FIG. 16 shows the lateral aberration occurring in the catadioptric system in the sixth embodiment. In the aberration chart, Y represents the image height (mm). As the aberration chart clearly indicates, in the sixth embodiment, the chromatic aberration is properly corrected when the wavelength of the exposure light is within a range of 157.6 nm±0.3 pm, as in the third and fifth embodiments. In addition, the chart confirms that the spherical aberration, the coma aberration, the astigmatism and the distortion are successfully corrected to an extent to which they are practically non-existent and thus, outstanding image forming performance is achieved.

(Seventh Embodiment)

Figure 17:
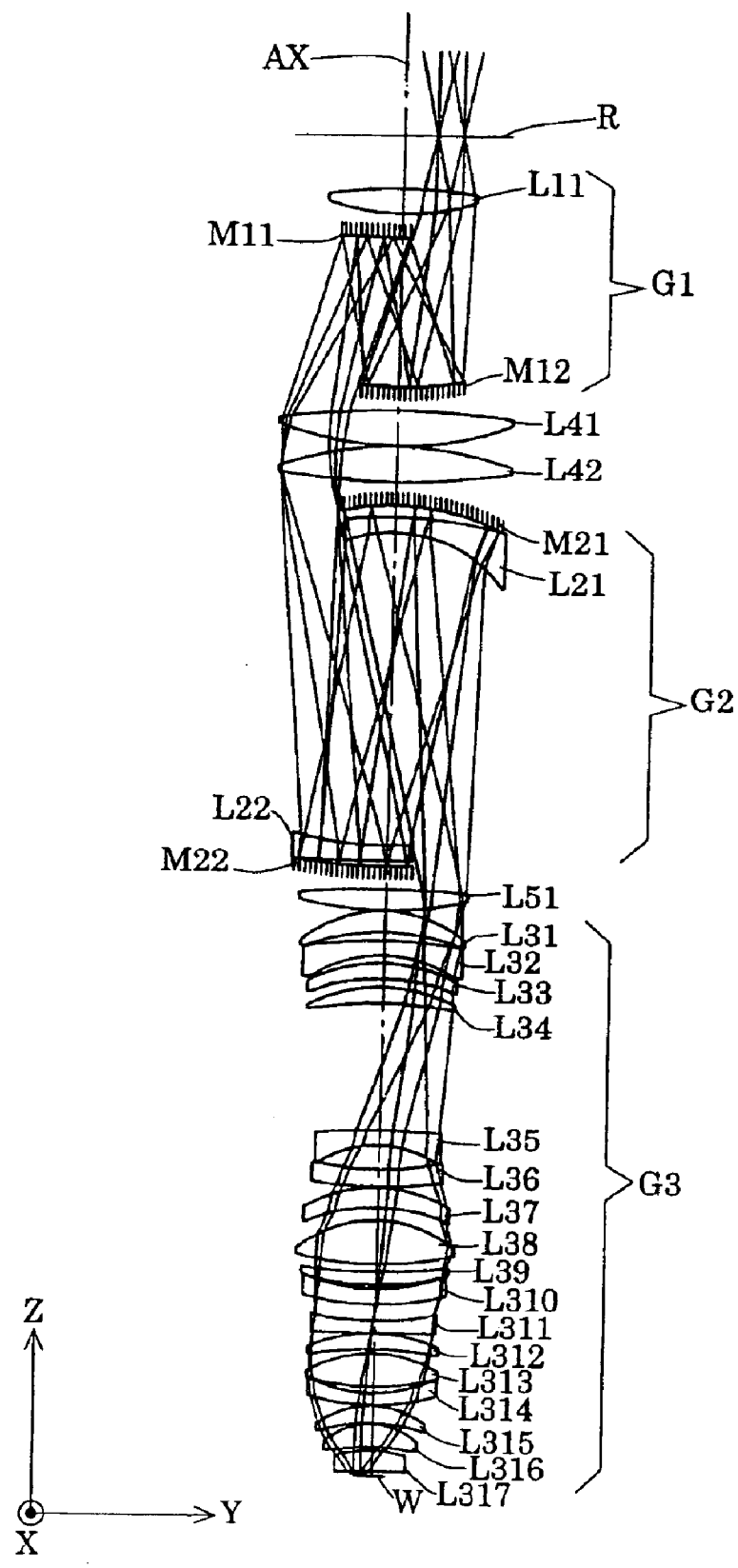
FIG. 17 shows the lens configuration of the catadioptric system achieved in a seventh embodiment.

FIG. 17 shows the lens configuration of the catadioptric system (projection optical system PL) achieved in the seventh embodiment. In the catadioptric system in FIG. 17, the first image forming optical system G1 is constituted with, starting on the reticle side, a biconvex lens L11, a convex reflecting mirror M13 having an almost flat convex surface set facing toward the wafer and a concave reflecting mirror M12 having a concave surface set facing toward the reticle.

The second image forming optical system G2 is constituted with, starting on the reticle side, a concave reflecting mirror M21 having a concave surface set facing toward the wafer, a negative meniscus lens L21 having a convex surface set facing toward the reticle, a negative meniscus lens L22 having a concave surface set facing toward the reticle and a concave reflecting mirror M22 having a concave surface set facing toward the reticle.

In addition, the third image forming optical system G3 is constituted with, starting on the reticle side, a positive meniscus lens L31 having a convex surface set facing toward the reticle, a negative meniscus lens L32 having a convex surface set facing toward the reticle, a positive meniscus lens L33 having an aspherical concave surface set facing toward the wafer, a positive meniscus lens L34 having a convex surface set facing toward the reticle, a negative meniscus lens L35 having a convex surface set facing toward the reticle, a negative meniscus lens L36 having a concave surface set facing toward the reticle, a positive meniscus lens L37 having an aspherical concave surface set facing toward the wafer, a biconvex lens L38, a positive meniscus lens L39 having a concave surface set facing toward the reticle, a negative meniscus lens L310 having a concave surface set facing toward the reticle, a negative meniscus lens L311 having an aspherical concave surface set facing toward the reticle, a positive meniscus lens L312 having a convex surface set facing toward the reticle, a biconvex lens L313 having an aspherical convex surface set facing toward the wafer, a negative meniscus lens L314 having to a concave surface set facing toward the reticle, a positive meniscus lens L315 having an aspherical concave surface set facing toward the wafer, a positive meniscus lens L316 having a convex surface set facing toward the reticle and a positive meniscus lens L317 having a convex surface set facing toward the reticle.

It is to be noted that a first field lens constituted with, starting on the reticle side, a biconvex lens L41 and a biconvex lens L42 having an aspherical convex surface set facing toward the wafer is provided in the optical path between the first image forming optical system G1 and the second image forming optical system G2. In addition, a second field lens constituted of a biconvex lens L51 having an aspherical convex surface set facing toward the reticle is provided in the optical path between the second image forming optical system G2 and the third image forming optical system G3.

Thus, light from the reticle R enters the concave reflecting mirror M12 via the biconvex lens L11 in the seventh embodiment. After the light having been reflected at the concave reflecting mirror M12 is reflected at the convex reflecting mirror M11, the light forms the first intermediate image of the reticle pattern near the first field lens (L41 and L42).

The light from the first intermediate image is first reflected at the concave reflecting mirror M22 via the negative meniscus lens L22 and then enters the concave reflecting mirror M21 via the negative meniscus lens L22 and the negative meniscus lens L21. The light reflected at the concave reflecting mirror M21 forms the second intermediate image of the reticle pattern near the second field lens (L51) via the negative meniscus lens L21. The light from the second intermediate image then forms the final image of the reticle pattern onto the wafer W via the lenses L31~L317 constituting the third image forming optical system G3.

Table (7) below lists data values regarding the catadioptric system achieved in the seventh embodiment. In the main data presented in Table (5), λ represents the central wavelength of the exposure light, β represents the projection magnification factor (the image forming magnification factor of the overall system), NA represents the image-side (wafer-side) numerical aperture, A represents the radius of the image circle IF on the wafer W, i.e., the maximum image height, B represents the maximum object height corresponding to the maximum image height A, LX represents the measurement of the effective exposure area ER along the X direction (the measurement of the long side) and LY represents the measurement of the effective exposure area ER along the Y direction (the measurement of the short side).

In addition, in the optical member data presented in Table (7), the surface numbers in the first column indicate the order in which the individual surfaces are set, starting from the reticle side, r in the second column indicates the radius of curvature of each surface (the radius of curvature at the vertex in the case of an aspherical surface: mm), d in the third column indicates the distances between the individual surfaces on the axis, i.e., the surface intervals (mm), and n in the fourth column indicates the refractive index corresponding to the central wavelength. It is to be noted that the sign attached to the value representing a surface interval d is switched each time the light is reflected. Accordingly, the sign attached to the values representing the surface intervals d within the optical path extending from the concave reflecting mirror M12 to the concave reflecting mirror M11 and the optical path extending from the concave reflecting mirror M22 to the concave reflecting mirror M21 is negative, and the sign is positive in the remaining optical path. In addition, regardless of the direction along which the light enters, the radius of curvature of the convex surface set facing toward the reticle assumes a positive value and the radius of curvature of the concave surface set facing toward the reticle assumes a negative value. Also, conditional expression corresponding values LAT and AX respectively indicate the magnification factor chromatic aberration coefficient and the on-axis chromatic aberration coefficient in Table (7).

TABLE (7)

(main data)

λ = 157.6 nm
β = 1/4
NA = 0.845
A = 18 mm

TABLE (7)-continued

B = 72 mm
LX = 22 mm
LY = 4 mm (optical member data)

| surface number | r | d | n |
|---|---|---|---|
| (reticle surface) | | 64.313122 | |
| 1 | 633.35560 | 29.362563 | 1.560000 (lens L11) |
| 2 | −297.41454 | 217.631552 | |
| 3 | −376.41908 | −187.631552 | (concave reflecting mirror M12) |
| 4 | −1719.92425 | 217.631552 | (convex reflecting mirror M11) |
| 5 | 1020.41099 | 44.070507 | 1.560000 (lens L41) |
| 6 | −406.99116 | 1.000000 | |
| 7 | 426.60624 | 46.118329 | 1.560000 (lens L42) |
| 8* | −604.42303 | 465.826853 | |
| 9 | −401.62011 | 20.000000 | 1.560000 (lens L22) |
| 10 | −2157.31867 | 6.871072 | |
| 11 | −632.50781 | −6.871072 | (concave reflecting mirror M22) |
| 12 | −2157.31867 | −20.000000 | 1.560000 (lens L22) |
| 13 | −401.62011 | −401.565841 | |
| 14 | 163.07026 | −20.000000 | 1.560000 (lens L21) |
| 15 | 512.54817 | −14.261012 | |
| 16 | 296.41597 | 14.261013 | (concave reflecting mirror M21) |
| 17 | 512.54817 | 20.000000 | 1.560000 (lens L21) |
| 18 | 163.07026 | 458.436913 | |
| 19* | 8910.30168 | 26.990021 | 1.560000 (lens L51) |
| 20 | −390.02333 | 1.000000 | |
| 21 | 154.61680 | 27.437462 | 1.560000 (lens L31) |
| 22 | 266.36618 | 10.838480 | |
| 23 | 578.36195 | 20.000000 | 1.560000 (lens L32) |
| 24 | 156.58391 | 10.000000 | |
| 25 | 200.15045 | 20.000000 | 1.560000 (lens L33) |
| 26* | 355.24067 | 10.000000 | |
| 27 | 199.94207 | 20.000000 | 1.560000 (lens L34) |
| 28 | 565.87990 | 165.714184 | |
| 29 | 1057.18610 | 20.000000 | 1.560000 (lens L35) |
| 30 | 132.35645 | 30.141989 | |
| 31 | −325.89570 | 21.445301 | 1.560000 (lens L36) |
| 32 | −460.40857 | 1.000000 | |
| 33 | 180.42036 | 25.000000 | 1.560000 (lens L37) |
| 34* | 290.73962 | 15.607903 | |
| 35 | 153.52191 | 54.725337 | 1.560000 (lens L38) |
| 36 | −377.47953 | 10.000000 | |
| 37 | −596.78960 | 16.523215 | 1.560000 (lens L39) |
| 38 | −292.83030 | 4.261011 | |
| 39 | −234.60209 | 20.000000 | 1.560000 (lens L310) |
| 40 | −317.15396 | 19.987264 | |
| 41* | −596.23286 | 16.000000 | 1.560000 (lens L311) |
| 42 | −10714.58691 | 1.000000 | |
| 43 | 201.11330 | 20.217332 | 1.560000 (lens L312) |
| 44 | 561.52434 | 5.000000 | |
| 45 | 161.81186 | 41.142108 | 1.560000 (lens L313) |
| 46* | −311.48442 | 7.344549 | |
| 47 | −177.28368 | 15.000000 | 1.560000 (lens L314) |
| 48 | −264.46461 | 1.000000 | |
| 49 | 114.47887 | 21.221832 | 1.560000 (lens L315) |
| 50* | 284.79460 | 1.000000 | |
| 51 | 87.32352 | 28.536749 | 1.560000 (lens L316) |
| 52 | 301.26342 | 4.000000 | |
| 53 | 149.71418 | 26.671264 | 1.560000 (lens L317) |
| 54 | 1921.15947 | 6.000000 | |
| (wafer surface) | | | |

(aspherical surface data)

surface 8

$\kappa = 0.000000$
$C_4 = 0.118332 \times 10^{-7}$   $C_6 = -0.901477 \times 10^{-13}$
$C_8 = 0.456579 \times 10^{-18}$   $C_{10} = 0.500107 \times 10^{-23}$ surface 19

$\kappa = 0.000000$
$C_4 = 0.362526 \times 10^{-7}$   $C_6 = -0.325425 \times 10^{-12}$
$C_8 = -0.715942 \times 10^{-17}$   $C_{10} = 0.938233 \times 10^{-22}$ TABLE (7)-continued surface 26

$\kappa = 0.000000$
$C_4 = 0.784516 \times 10^{-7}$   $C_6 = 0.132181 \times 10^{-11}$
$C_8 = 0.390546 \times 10^{-16}$   $C_{10} = 0.194862 \times 10^{-20}$ surface 34

$\kappa = 0.000000$
$C_4 = 0.770740 \times 10^{-7}$   $C_6 = 0.108454 \times 10^{-11}$
$C_8 = -0.141384 \times 10^{-16}$   $C_{10} = -0.154327 \times 10^{-20}$ surface 41

$\kappa = 0.000000$
$C_4 = -0.111168 \times 10^{-6}$   $C_6 = -0.459164 \times 10^{-11}$
$C_8 = -0.179391 \times 10^{-15}$   $C_{10} = -0.627753 \times 10^{-20}$ surface 46

$\kappa = 0.000000$
$C_4 = -0.806181 \times 10^{-7}$   $C_6 = 0.979363 \times 10^{-11}$
$C_8 = -0.432122 \times 10^{-15}$   $C_{10} = 0.353438 \times 10^{-20}$ surface 50

$\kappa = 0.000000$
$C_4 = 0.171550 \times 10^{-6}$   $C_6 = -0.506941 \times 10^{-11}$
$C_8 = 0.172612 \times 10^{-14}$   $C_{10} = -0.907247 \times 10^{-19}$ (conditional expression corresponding values)

$LAT = -3.9 \times 10^{-7}$
$AX = -5.2 \times 10^{-5}$

Figure 18:
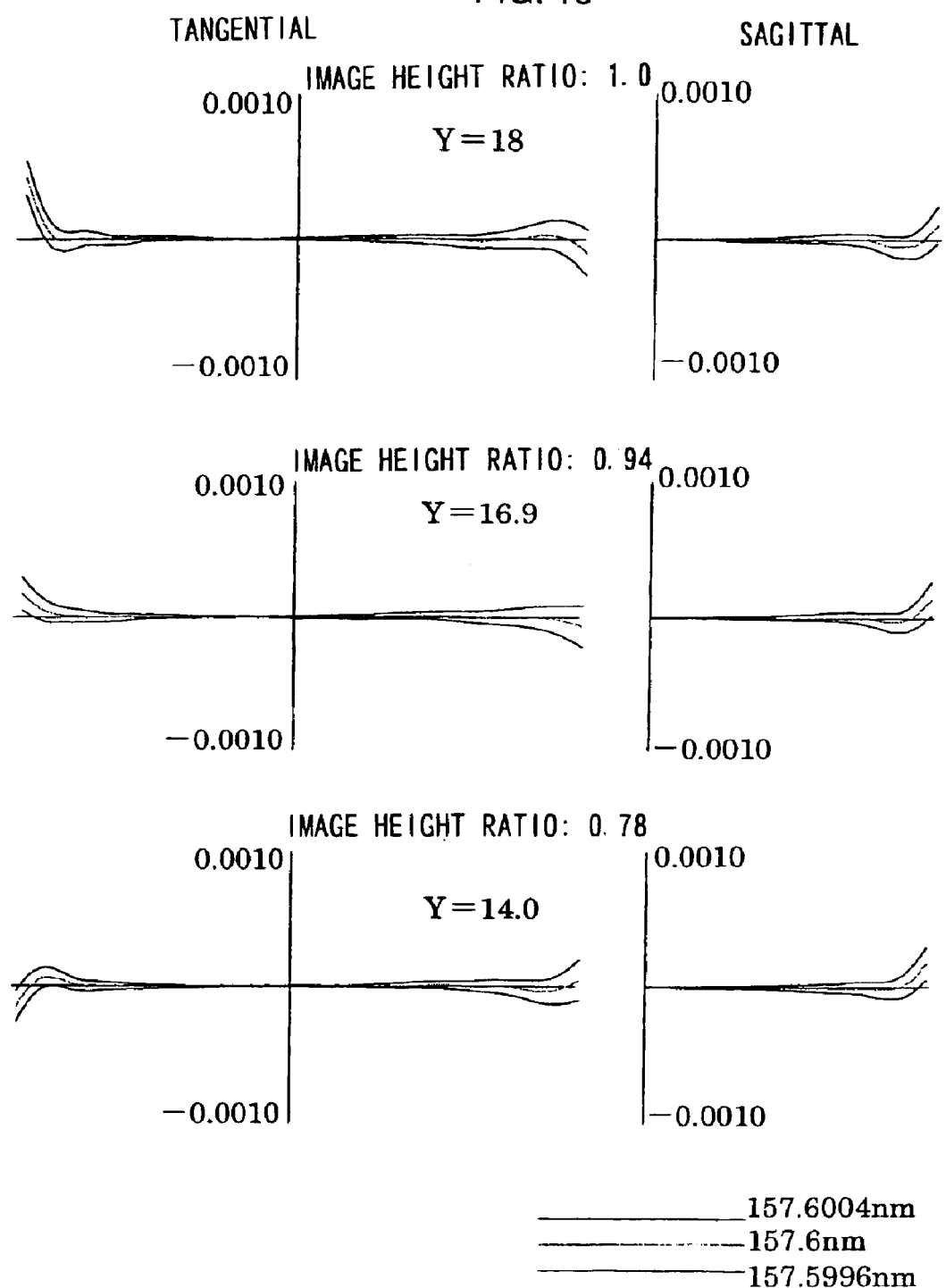
FIG. 18 shows the lateral aberration manifesting at the catadioptric system in the seventh embodiment.
Figure 19:
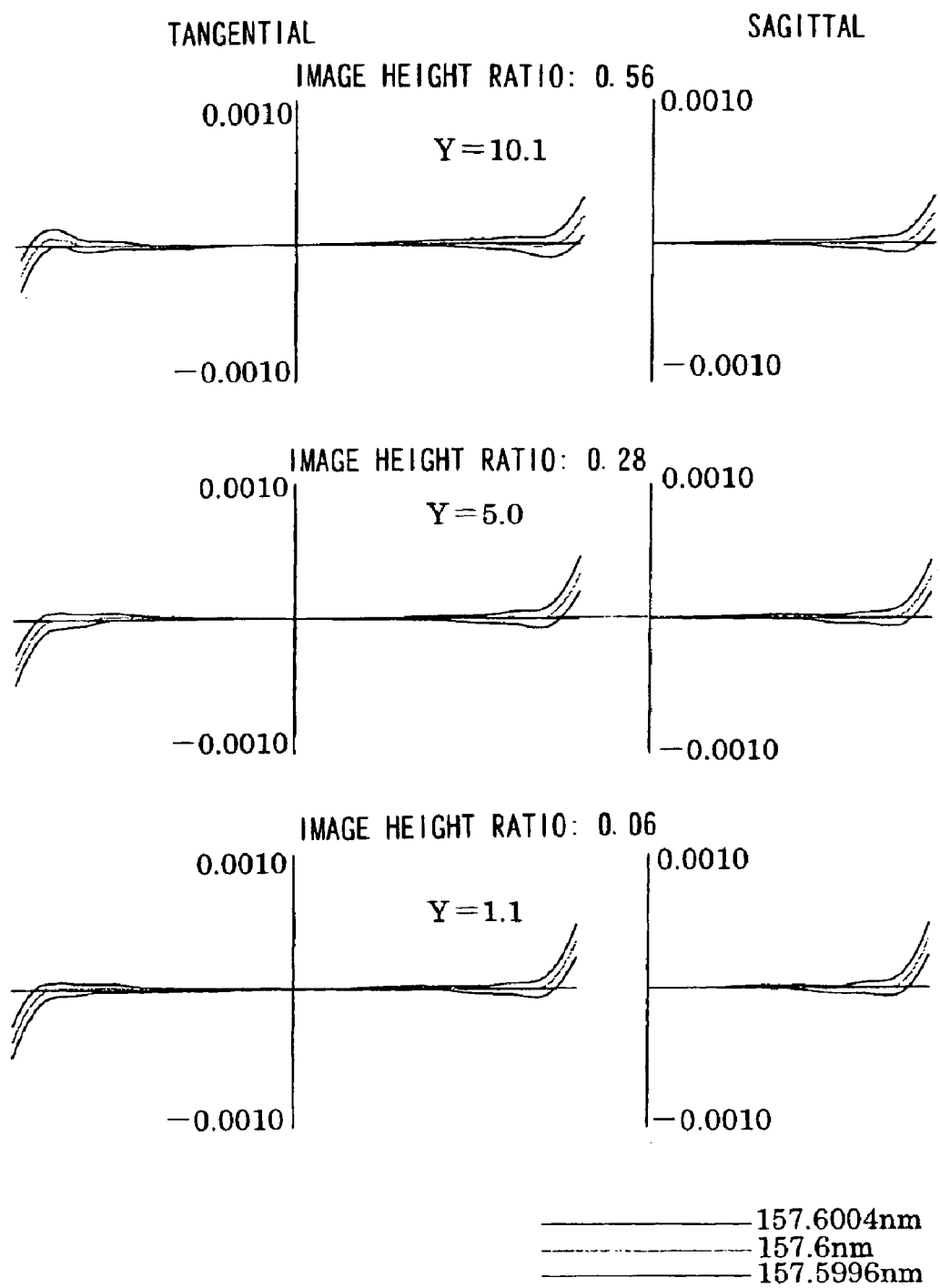
FIG. 19 shows the lateral aberration manifesting at the catadioptric system in the seventh embodiment.

FIGS. 18 and 19 show the lateral aberration occurring in the catadioptric system in the seventh embodiment. In the aberration chart, Y represents the image height (mm). As the aberration chart clearly indicates, the chromatic aberration is properly corrected when the wavelength of the exposure light is within a range of 157.6 nm±0.4 pm in the seventh embodiment. In addition, the chart confirms that the spherical aberration, the coma aberration, the astigmatism and the distortion are successfully corrected to an extent to which they are practically non-existent and thus, outstanding image forming performance is achieved.

(Eighth Embodiment)

Figure 20:
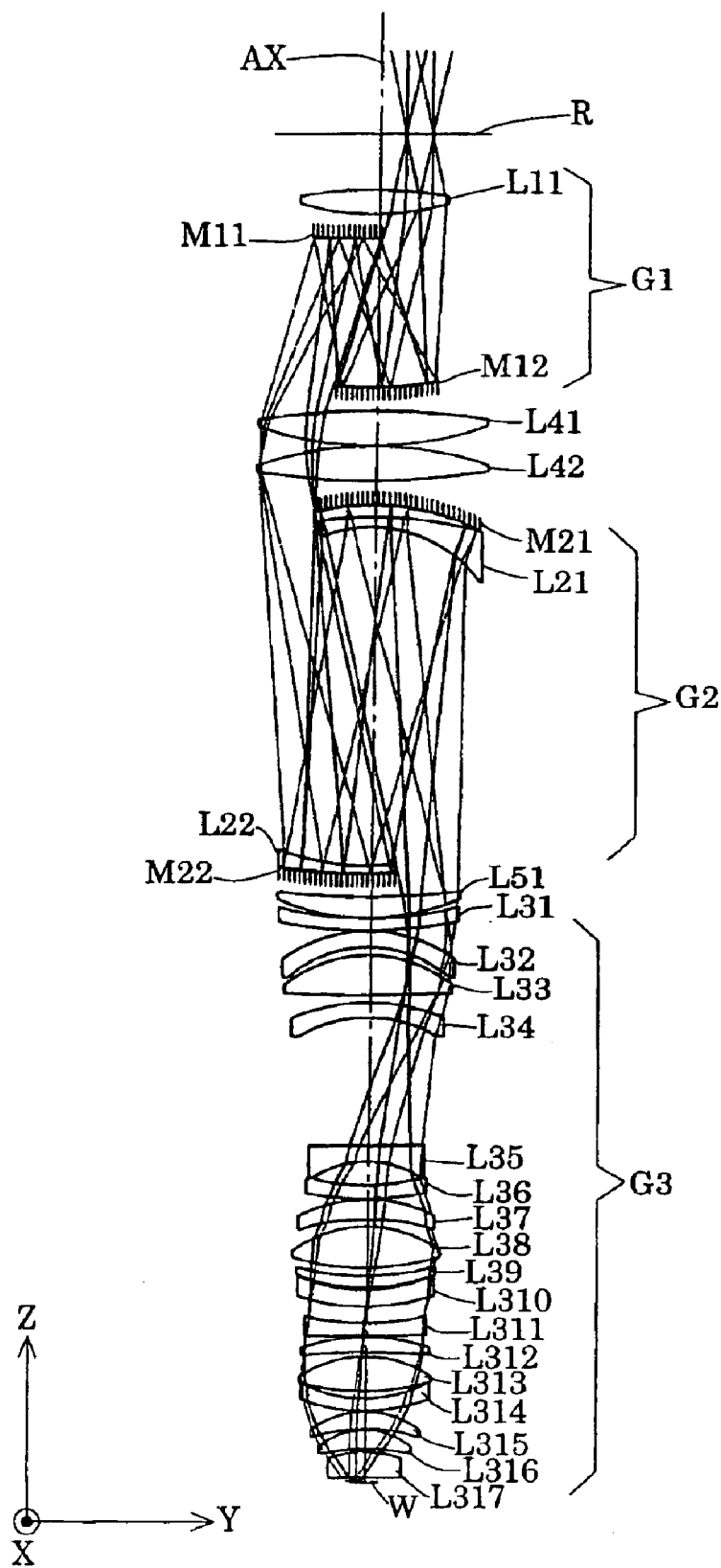
FIG. 20 shows the lens configuration of the catadioptric system achieved in an eighth embodiment.

FIG. 20 shows the lens configuration of the catadioptric system (projection optical system PL) achieved in the eighth embodiment. In the catadioptric system in FIG. 20, the first image forming optical system G1 is constituted with, starting on the reticle side, a biconvex lens L11, a convex reflecting mirror M11 having an almost flat convex surface set facing toward the wafer and a concave reflecting mirror M12 having a concave surface set facing toward the reticle.

The second image forming optical system G2 is constituted with, starting on the reticle side, a concave reflecting mirror M21 having a concave surface set facing toward the wafer, a negative meniscus lens L21 having a convex surface set facing toward the reticle, a negative meniscus lens L22 having a concave surface set facing toward the reticle and a concave reflecting mirror M22 having a concave surface set facing toward the reticle.

The third image forming optical system G3 is constituted with, starting on the reticle side, a negative meniscus lens L31 having a concave surface set facing toward the reticle, a negative meniscus lens L32 having a convex surface set facing toward the reticle, a biconvex lens L33, a negative meniscus lens L34 having an aspherical concave surface set facing toward the wafer, a biconcave lens L35, a negative meniscus lens L36 having a concave surface set facing toward the reticle, a positive meniscus lens L37 having an aspherical concave surface set facing toward the wafer, a biconvex lens L38, a positive meniscus lens L39 having a concave surface set facing toward the reticle, a negative meniscus lens L310 having a concave surface set facing toward the reticle, a negative meniscus lens L311 having an aspherical concave surface set facing toward the reticle, a positive meniscus lens L312 having a convex surface set facing toward the reticle, a biconvex lens L313 having an aspherical convex surface set facing toward the wafer, a negative meniscus lens L314 having a concave surface set facing toward the reticle, a positive meniscus lens L315 having an aspherical concave surface set facing toward the wafer, a positive meniscus lens L316 having a convex surface set facing toward the reticle and a positive meniscus lens L317 having a convex surface set facing toward the reticle.

It is to be noted that a first field lens constituted with, starting on the reticle side, a biconvex lens L41 and a biconvex lens L42 having an aspherical convex surface set facing toward the wafer is provided in the optical path between the first image forming optical system G1 and the second image forming optical system G2. In addition, a second field lens constituted of a positive meniscus lens L51 having an aspherical concave surface set facing toward the reticle is provided in the optical path between the second image forming optical system G2 and the third image forming optical system G3.

Thus, light from the reticle R enters the concave reflecting mirror M12 via the biconvex lens L11 in the eighth embodiment. After the light having been reflected at the concave reflecting mirror M12 is reflected at the convex reflecting mirror M11, the light forms the first intermediate image of the reticle pattern near the first field lens (L41 and L42).

The light from the first intermediate image is first reflected at the concave reflecting mirror M22 via the negative meniscus lens L22 and then enters the concave reflecting mirror M21 via the negative meniscus lens L22 and the negative meniscus lens L21. The light reflected at the concave reflecting mirror M21 forms the second intermediate image of the reticle pattern near the second field lens (L51) via the negative meniscus lens L21. The light from the second intermediate image then forms the final image of the reticle pattern onto the wafer W via the lenses L31~L317 constituting the third image forming optical system G3.

Table (8) below lists data values regarding the catadioptric system achieved in the seventh embodiment. In the main data presented in Table (5), λ represents the central wavelength of the exposure light, β represents the projection magnification factor (the image forming magnification factor of the overall system), NA represents the image-side (wafer-side) numerical aperture, A represents the radius of the image circle IF on the wafer W, i.e., the maximum image height, B represents the maximum object height corresponding to the maximum image height A, LX represents the measurement of the effective exposure area ER along the X direction (the measurement of the long side) and LY represents the measurement of the effective exposure area ER along the Y direction (the measurement of the short side).

In addition, in the optical member data presented in Table (8), the surface numbers in the first column indicate the order in which the individual surfaces are set, starting from the reticle side, r in the second column indicates the radius of curvature of each surface (the radius of curvature at the vertex in the case of an aspherical surface: mm), d in the third column indicates the distances between the individual surfaces on the axis, i.e., the surface intervals (mm), and n in the fourth column indicates the refractive index corresponding to the central wavelength. It is to be noted that the sign attached to the value representing a surface interval d is switched each time the light is reflected. Accordingly, the sign attached to the values representing the surface intervals d within the optical path extending from the concave reflecting mirror M12 to the concave reflecting mirror M11 and the optical path extending from the concave reflecting mirror M22 to the concave reflecting mirror M21 is negative, and the sign is positive in the remaining optical path. In addition, regardless of the direction along which the light enters, the radius of curvature of a convex surface set facing toward the reticle assumes a positive value and the radius of curvature of a concave surface set facing toward the reticle assumes a negative value. Also, conditional expression corresponding values LAT and AX respectively indicate the magnification factor chromatic aberration coefficient and the on-axis chromatic aberration coefficient in Table (8).

TABLE (8)

(main data)

$\lambda = 157.6$ nm
$\beta = 1/4$
NA = 0.845
A = 18 mm
B = 72 mm
LX = 22 mm
LY = 4 mm (optical member data)

| surface number | r | d | n |
|---|---|---|---|
|  | (reticle surface) | 64.644427 |  |
| 1 | 567.00647 | 29.774149 | 1.560000 (lens L11) |
| 2 | −305.96356 | 215.805682 |  |
| 3 | −375.35826 | −185.805682 | (concave reflecting mirror M12) |
| 4 | −1771.14235 | 215.805682 | (convex reflecting mirror M11) |
| 5 | 1046.06672 | 43.621058 | 1.560000 (lens L41) |
| 6 | −403.21536 | 1.000000 |  |
| 7 | 421.69510 | 45.558190 | 1.560000 (lens L42) |
| 8* | −640.00612 | 490.635779 |  |
| 9 | −305.40131 | 10.000000 | 1.560000 (lens L22) |
| 10 | −663.42492 | 1.000000 |  |
| 11 | −681.00059 | −1.000000 | (concave reflecting mirror M22) |
| 12 | −663.42492 | −10.000000 | 1.560000 (lens L22) |
| 13 | −305.40131 | −433.352800 |  |
| 14 | 163.68529 | −12.344063 | 1.560000 (lens L21) |
| 15 | 526.44415 | −14.938916 |  |
| 16 | 294.23457 | 14.938916 | (concave reflecting mirror M21) |
| 17 | 526.44415 | 12.344063 | 1.560000 (lens L21) |
| 18 | 163.68529 | 474.352800 |  |
| 19* | −742.11875 | 26.894368 | 1.560000 (lens L51) |
| 20 | −266.21012 | 1.000000 |  |
| 21 | −400.00000 | 15.000000 | 1.560000 (lens L31) |
| 22 | −534.63536 | 1.000000 |  |
| 23 | 184.35678 | 20.000000 | 1.560000 (lens L32) |
| 24 | 153.88212 | 10.000000 |  |
| 25 | 168.88100 | 50.000000 | 1.560000 (lens L33) |
| 26 | −1758.10942 | 10.000000 |  |
| 27 | 235.07511 | 20.000000 | 1.560000 (lens L34) |
| 28* | 189.46638 | 163.801245 |  |
| 29 | −2896.25856 | 20.000000 | 1.560000 (lens L35) |
| 30 | 124.65800 | 29.898504 |  |
| 31 | −242.21131 | 17.005799 | 1.560000 (lens L36) |
| 32 | −357.22247 | 1.000000 |  |
| 33 | 192.53113 | 25.000000 | 1.560000 (lens L37) |
| 34* | 412.29894 | 8.987693 |  |
| 35 | 152.52351 | 53.177839 | 1.560000 (lens L38) |
| 36 | −296.92089 | 10.000000 |  |
| 37 | −316.87875 | 15.000000 | 1.560000 (lens L39) |
| 38 | −219.63445 | 3.105791 |  |
| 39 | −194.61097 | 20.000000 | 1.560000 (lens L310) |
| 40 | −271.06241 | 20.333056 |  |
| 41* | −523.95508 | 16.000000 | 1.560000 (lens L311) |
| 42 | −1588.24429 | 1.000000 |  |
| 43 | 255.61070 | 18.833104 | 1.560000 (lens L312) |
| 44 | 1097.97464 | 5.000000 |  |

TABLE (8)-continued

| 45 | 151.14790 | 42.445707 | 1.560000 (lens L313) |
|---|---|---|---|
| 46* | −331.45182 | 8.725261 |  |
| 47 | −170.85207 | 15.000000 | 1.560000 (lens L314) |
| 48 | −227.87568 | 1.000000 |  |
| 49 | 112.98983 | 21.658527 | 1.560000 (lens L315) |
| 50* | 277.63494 | 1.000000 |  |
| 51 | 85.92800 | 24.591365 | 1.560000 (lens L316) |
| 52 | 235.86682 | 4.000000 |  |
| 53 | 137.24923 | 31.502456 | 1.560000 (lens L317) |
| 54 | 1707.95360 | 6.000000 |  |
|  | (wafer surface) |  |  |

(aspherical surface data)

surface 8

$\kappa = 0.000000$
$C_4 = 0.115614 \times 10^{-7}$ $C_6 = -0.898054 \times 10^{-13}$
$C_8 = 0.586813 \times 10^{-18}$ $C_{10} = 0.189867 \times 10^{-23}$ surface 19

$\kappa = 0.000000$
$C_4 = 0.128999 \times 10^{-7}$ $C_6 = -0.445747 \times 10^{-12}$
$C_8 = 0.542677 \times 10^{-17}$ $C_{10} = -0.302494 \times 10^{-22}$ surface 28

$\kappa = 0.000000$
$C_4 = 0.535059 \times 10^{-7}$ $C_6 = 0.132973 \times 10^{-11}$
$C_8 = 0.750691 \times 10^{-16}$ $C_{10} = 0.629454 \times 10^{-20}$ surface 34

$\kappa = 0.000000$
$C_4 = 0.887048 \times 10^{-7}$ $C_6 = 0.117209 \times 10^{-11}$
$C_8 = -0.416125 \times 10^{-16}$ $C_{10} = -0.382530 \times 10^{-20}$ surface 41

$\kappa = 0.000000$
$C_4 = -0.113856 \times 10^{-6}$ $C_6 = -0.516355 \times 10^{-11}$
$C_8 = -0.221902 \times 10^{-15}$ $C_{10} = -0.928183 \times 10^{-20}$ surface 46

$\kappa = 0.000000$
$C_4 = -0.824280 \times 10^{-7}$ $C_6 = 0.998838 \times 10^{-11}$
$C_8 = -0.426713 \times 10^{-15}$ $C_{10} = 0.170015 \times 10^{-20}$ surface 50

$\kappa = 0.000000$
$C_4 = 0.159085 \times 10^{-6}$ $C_6 = -0.478787 \times 10^{-11}$
$C_8 = 0.166305 \times 10^{-14}$ $C_{10} = -0.824509 \times 10^{-19}$ (conditional expression corresponding values)

LAT = $-5.7 \times 10^{-8}$
AX = $-3.9 \times 10^{-5}$

Figure 21:
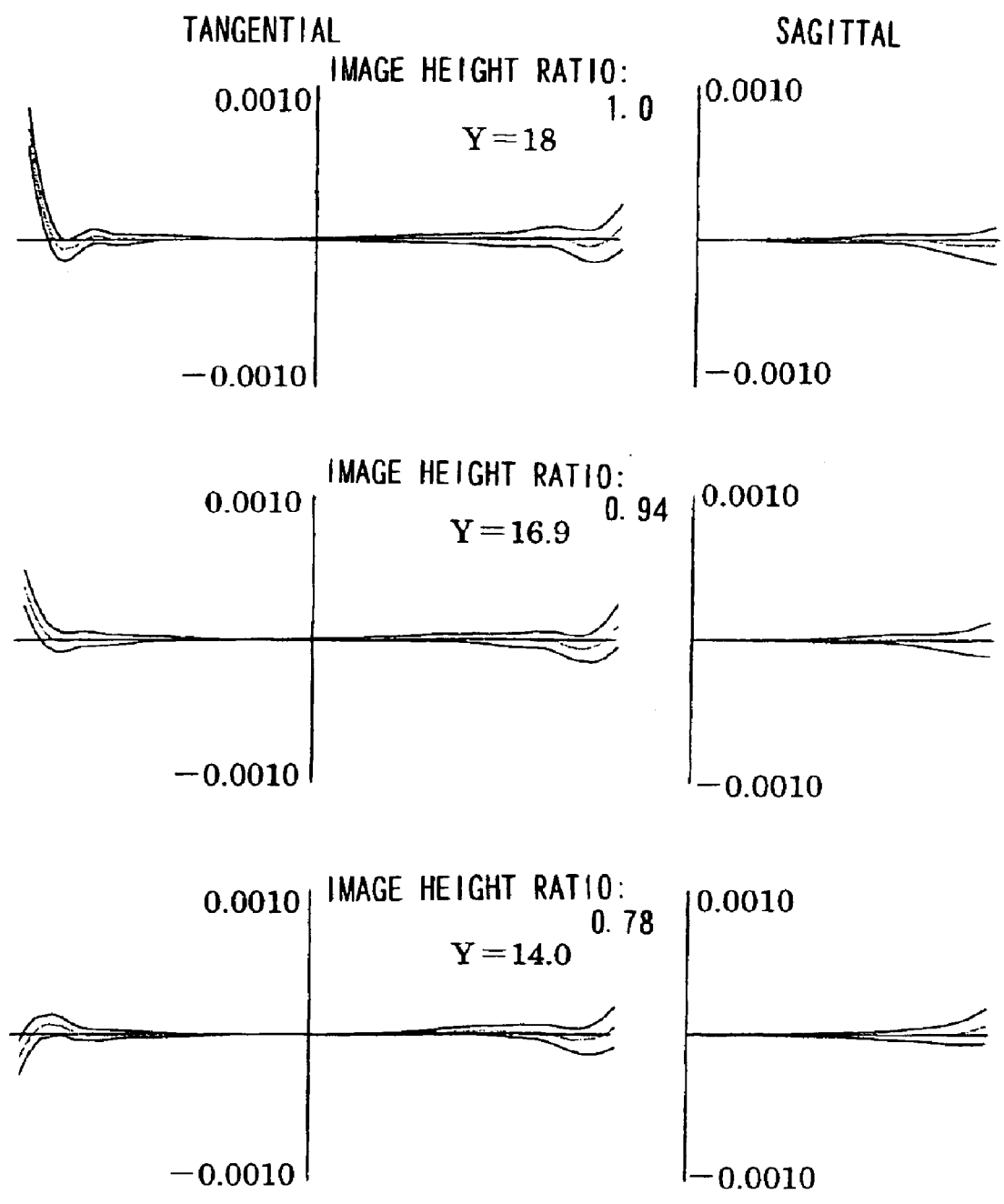
FIG. 21 shows the lateral aberration manifesting at the catadioptric system in the eighth embodiment.
Figure 22:
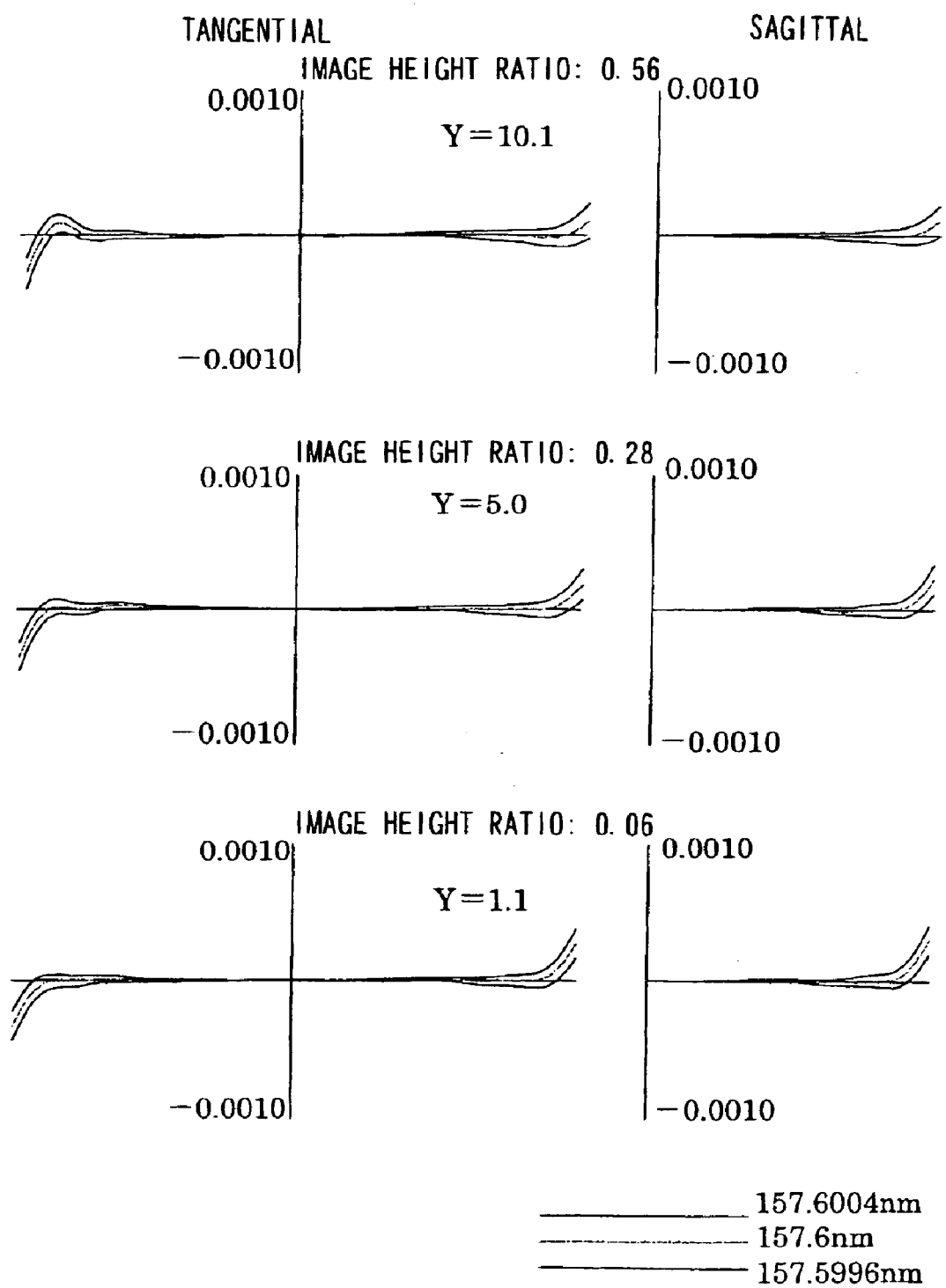
FIG. 22 shows the lateral aberration manifesting at the catadioptric system in the eighth embodiment.

FIGS. 21 and 22 show the lateral aberration occurring in the catadioptric system in the eighth embodiment. In the aberration chart, Y represents the image height (mm). As the aberration chart clearly indicates, the chromatic aberration is properly corrected in the eighth embodiment when the wavelength of the exposure light is within a range of 157.6 nm±0.4 pm, as in the seventh embodiment. In addition, the chart confirms that the spherical aberration, the coma aberration, the astigmatism and the distortion are successfully corrected to an extent to which they are practically non-existent and thus, outstanding image forming performance is achieved.

(Ninth Embodiment)

Figure 23:
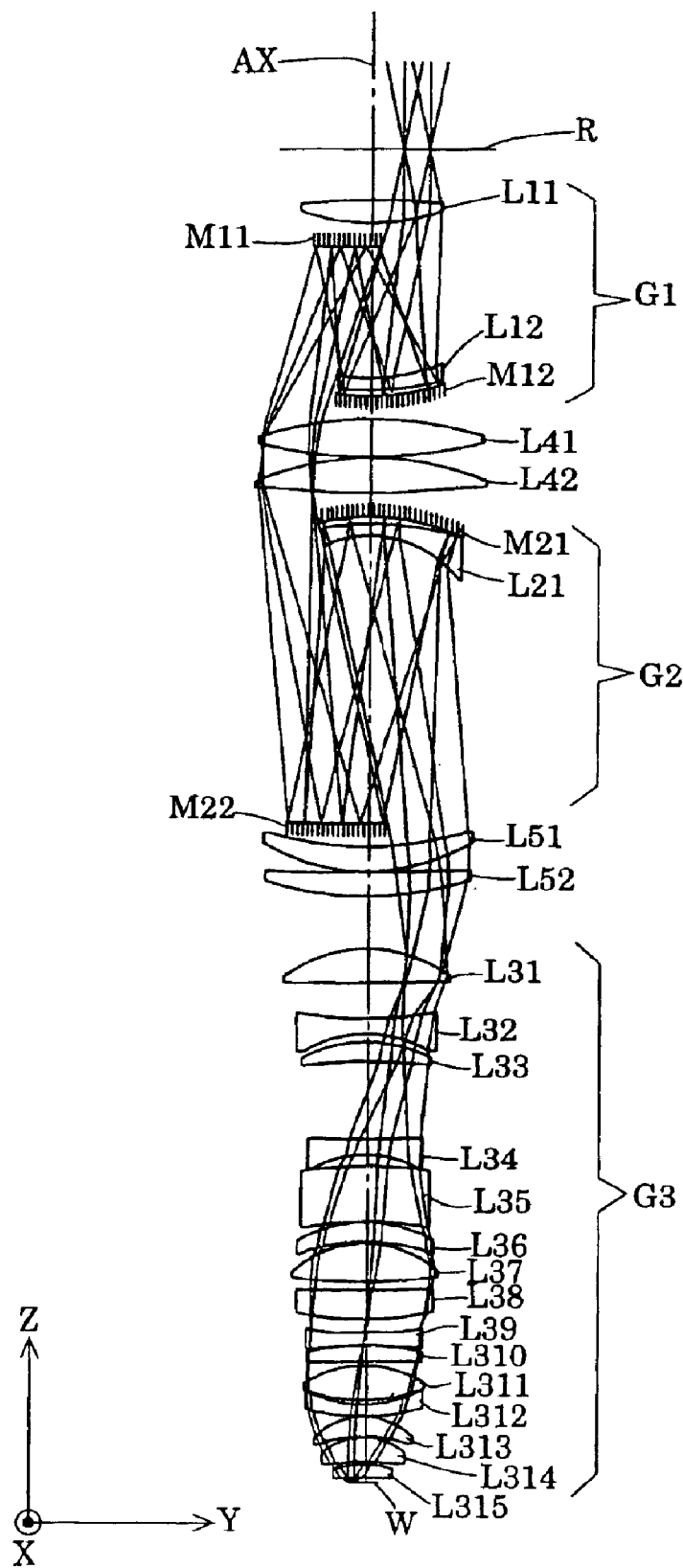
FIG. 23 shows the lens configuration of the catadioptric system achieved in a ninth embodiment.

FIG. 23 shows the lens configuration of the catadioptric system (projection optical system PL) achieved in the ninth embodiment. In the catadioptric system in FIG. 23, the first image forming optical system G1 is constituted with, starting on the reticle side, a biconvex lens L11, a convex reflecting mirror M11 having an almost flat convex surface set facing toward the wafer, a negative meniscus lens L12 having a concave surface set facing toward the reticle and a concave reflecting mirror M12 having a concave surface set facing toward the reticle.

The second image forming optical system G2 is constituted with, starting on the reticle side, a concave reflecting mirror M21 having a concave surface set facing toward the wafer, a negative meniscus lens L21 having a convex surface set facing toward the reticle and a concave reflecting mirror M22 having an almost flat concave surface set facing toward the reticle.

The third image forming optical system G3 is constituted with, starting on the reticle side, a biconvex lens L31, a biconcave lens L32 having an aspherical concave surface set facing toward the wafer, a positive meniscus lens L33 having a convex surface set facing toward the reticle, a biconcave lens L34, a negative meniscus lens L35 having a convex surface set facing toward the reticle a positive meniscus lens L36 having an aspherical concave surface set facing toward the wafer, a biconvex lens L37, a positive meniscus lens L38 having a concave surface set facing toward the reticle, a biconcave lens L39 having an aspherical concave surface set facing toward the reticle, a biconvex lens L310, a biconvex lens L311 having an aspherical convex surface set facing toward the wafer, a negative meniscus lens L312 having a concave surface set facing toward the reticle, a positive meniscus lens L313 having an aspherical a concave surface set facing toward the wafer, a positive meniscus lens L314 having a convex surface set facing toward the reticle and a positive meniscus lens L315 having a convex surface set facing toward the reticle.

It is to be noted that a first field lens constituted with, starting on the reticle side, a biconvex lens L41 and a biconvex lens L42 having an aspherical convex surface set facing toward the wafer is provided in the optical path between the first image forming optical system G1 and the second image forming optical system G2. In addition, a second field lens constituted of a positive meniscus lens L51 having an aspherical concave surface set facing toward the reticle and a positive meniscus lens L52 having a concave surface set facing toward the reticle is provided in the optical path between the second image forming optical system G2 and the third image forming optical system G3.

Thus, light from the reticle R enters the concave reflecting mirror M12 via the biconvex lens L11 and the negative meniscus lens L12 in the ninth embodiment. After the light having been reflected at the concave reflecting mirror M12 is reflected at the convex reflecting mirror M131, the light forms the first intermediate image of the reticle pattern near the first field lens (L41 and L42).

The light from the first intermediate image is first reflected at the concave reflecting mirror M22 and then enters the concave reflecting mirror M21 via the negative meniscus lens L21. The light reflected at the concave reflecting mirror M21 forms the second intermediate image of the reticle pattern near the second field lens (L51 and L52) via the negative meniscus lens L21. The light from the second intermediate image forms the final image of the reticle pattern onto the wafer W via the lenses L31~L315 constituting the third image forming optical system G3.

Table (9) below lists data values regarding the catadioptric system achieved in the ninth embodiment. In the main data presented in Table (5), λ represents the central wavelength of the exposure light, β represents the projection magnification factor (the image forming magnification factor of the overall system), NA represents the image-side (wafer-side) numerical aperture, A represents the radius of the image circle IF on the wafer W, i.e., the maximum image height, B represents the maximum object height corresponding to the maximum image height A, LX represents the measurement of the effective exposure area ER along the X direction (the measurement of the long side) and LY represents the measurement of the effective exposure area ER along the Y direction (the measurement of the short side).

In addition, in the optical member data presented in Table (9), the surface numbers in the first column indicate the order in which the individual surfaces are set, starting from the reticle side, r in the second column indicates the radius of curvature of each surface (the radius of curvature at the vertex in the case of an aspherical surface: mm), d in the third column indicates the distances between the individual surfaces on the axis, i.e., the surface intervals (mm), and n in the fourth column indicates the refractive index corresponding to the central wavelength. It is to be noted that the sign attached to the value representing a surface interval d is switched each time the light is reflected. Accordingly, the sign attached to the values representing the surface intervals d within the optical path extending from the concave reflecting mirror M12 to the concave reflecting mirror M11 and the optical path extending from the concave reflecting mirror M22 to the concave reflecting mirror M21 is negative, and the sign is positive in the remaining optical path. In addition, regardless of the direction along which the light enters, the radius of curvature of a convex surface set facing toward the reticle assumes a positive value and the radius of curvature of a concave surface set facing toward the reticle assumes a negative value. Also, conditional expression corresponding values LAT and AX respectively indicate the magnification factor chromatic aberration coefficient and the on-axis chromatic aberration coefficient in Table (9).

TABLE (9)

(main data)

$\lambda$ = 157.6 nm
$\beta$ = 1/4
NA = 0.845
A = 18 mm
B = 72 mm
LX = 22 mm
LY = 4 mm (optical member data)

| surface number | r | d | n |
|---|---|---|---|
| | (reticle surface) | 60.000000 | |
| 1 | 991.47248 | 28.195143 | 1.560000 (lens L11) |
| 2 | −267.50588 | 192.866330 | |
| 3 | −212.01226 | 15.000000 | 1.560000 (lens L12) |
| 4 | −359.05656 | 7.438380 | |
| 5 | −274.13902 | −7.438380 | (concave reflecting mirror M12) |
| 6 | −359.05656 | −15.000000 | 1.560000 (lens L12) |
| 7 | −212.01226 | −162.866330 | |
| 8 | −2397.49986 | 215.304710 | (convex reflecting mirror M11) |
| 9 | 480.51853 | 46.865206 | 1.560000 (lens L41) |
| 10 | −546.66851 | 1.000000 | |
| 11 | 379.33588 | 44.717026 | 1.560000 (lens L42) |
| 12* | −630.25132 | 422.571113 | |
| 13 | −1860.74365 | −369.081141 | (concave reflecting mirror M22) |
| 14 | 136.07113 | −15.000000 | 1.560000 (lens L21) |
| 15 | 388.51075 | −8.489972 | |
| 16 | 269.57337 | 8.489972 | (concave reflecting mirror M21) |
| 17 | 388.51075 | 15.000000 | 1.560000 (lens L21) |
| 18 | 136.07113 | 399.081141 | |
| 19* | −368.26543 | 30.000000 | 1.560000 (lens L51) |
| 20 | −253.70093 | 1.000000 | |
| 21 | −2467.73840 | 30.000000 | 1.560000 (lens L52) |
| 22 | −400.60099 | 68.350972 | |
| 23 | 171.28983 | 44.279149 | 1.560000 (lens L31) |

TABLE (9)-continued

| | | | |
|---|---|---|---|
| 24 | −3312.88121 | 44.770000 | |
| 25 | −448.65736 | 20.000000 | 1.560000 (lens L32) |
| 26* | 168.02309 | 10.000000 | |
| 27 | 170.42305 | 25.208415 | 1.560000 (lens L33) |
| 28 | 769.81302 | 99.804041 | |
| 29 | −1652.36364 | 20.000000 | 1.560000 (lens L34) |
| 30 | 132.90519 | 15.026016 | |
| 31 | 530.98620 | 70.000000 | 1.560000 (lens L35) |
| 32 | 452.64324 | 1.000000 | |
| 33 | 177.34168 | 25.000000 | 1.560000 (lens L36) |
| 34* | 415.66350 | 1.000000 | |
| 35 | 138.37477 | 47.565338 | 1.560000 (lens L37) |
| 36 | −654.96909 | 10.000000 | |
| 37 | −2112.93849 | 34.994222 | 1.560000 (lens L38) |
| 38 | −411.84982 | 16.215559 | |
| 39* | −4467.59569 | 16.000000 | 1.560000 (lens L39) |
| 40 | 568.03899 | 1.000000 | |
| 41 | 359.65731 | 20.527531 | 1.560000 (lens L310) |
| 42 | −5233.89502 | 5.000000 | |
| 43 | 146.19360 | 42.262782 | 1.560000 (lens L311) |
| 44* | −225.18468 | 5.392886 | |
| 45 | −155.97378 | 15.000000 | 1.560000 (lens L312) |
| 46 | −257.64593 | 1.000000 | |
| 47 | 87.50795 | 24.651827 | 1.560000 (lens L313) |
| 48* | 221.10625 | 1.000000 | |
| 49 | 83.17065 | 29.222819 | 1.560000 (lens L314) |
| 50 | 263.21163 | 4.000000 | |
| 51 | 149.89321 | 16.010949 | 1.560000 (lens L315) |
| 52 | 1461.12239 | 6.000000 | |
| (wafer surface) | | | |

(aspherical surface data)

surface 12

$\kappa = 0.000000$
$C_4 = 0.269991 \times 10^{-7}$ $C_6 = -0.510706 \times 10^{-12}$
$C_8 = 0.110177 \times 10^{-16}$ $C_{10} = -0.123713 \times 10^{-21}$ surface 19

$\kappa = 0.000000$
$C_4 = 0.121430 \times 10^{-7}$ $C_6 = -0.146728 \times 10^{-12}$
$C_8 = 0.126272 \times 10^{-18}$ $C_{10} = 0.894134 \times 10^{-23}$ surface 26

$\kappa = 0.000000$
$C_4 = 0.691903 \times 10^{-7}$ $C_6 = 0.102075 \times 10^{-11}$
$C_8 = 0.983473 \times 10^{-16}$ $C_{10} = 0.117306 \times 10^{-20}$ surface 34

$\kappa = 0.000000$
$C_4 = 0.993275 \times 10^{-7}$ $C_6 = 0.240380 \times 10^{-11}$
$C_8 = 0.301051 \times 10^{-16}$ $C_{10} = -0.215154 \times 10^{-20}$ surface 39

$\kappa = 0.000000$
$C_4 = -0.140256 \times 10^{-6}$ $C_6 = -0.785178 \times 10^{-11}$
$C_8 = -0.323968 \times 10^{-15}$ $C_{10} = -0.150679 \times 10^{-19}$ surface 44

$\kappa = 0.000000$
$C_4 = -0.100300 \times 10^{-6}$ $C_6 = 0.114834 \times 10^{-10}$
$C_8 = -0.384285 \times 10^{-15}$ $C_{10} = -0.139887 \times 10^{-20}$ surface 48

$\kappa = 0.000000$
$C_4 = 0.200382 \times 10^{-6}$ $C_6 = -0.794777 \times 10^{-11}$
$C_8 = 0.361073 \times 10^{-14}$ $C_{10} = -0.138717 \times 10^{-18}$ (conditional expression corresponding values)

LAT = +9.7 × $10^{-7}$
AX = −4.5 × $10^{-5}$

Figure 24:
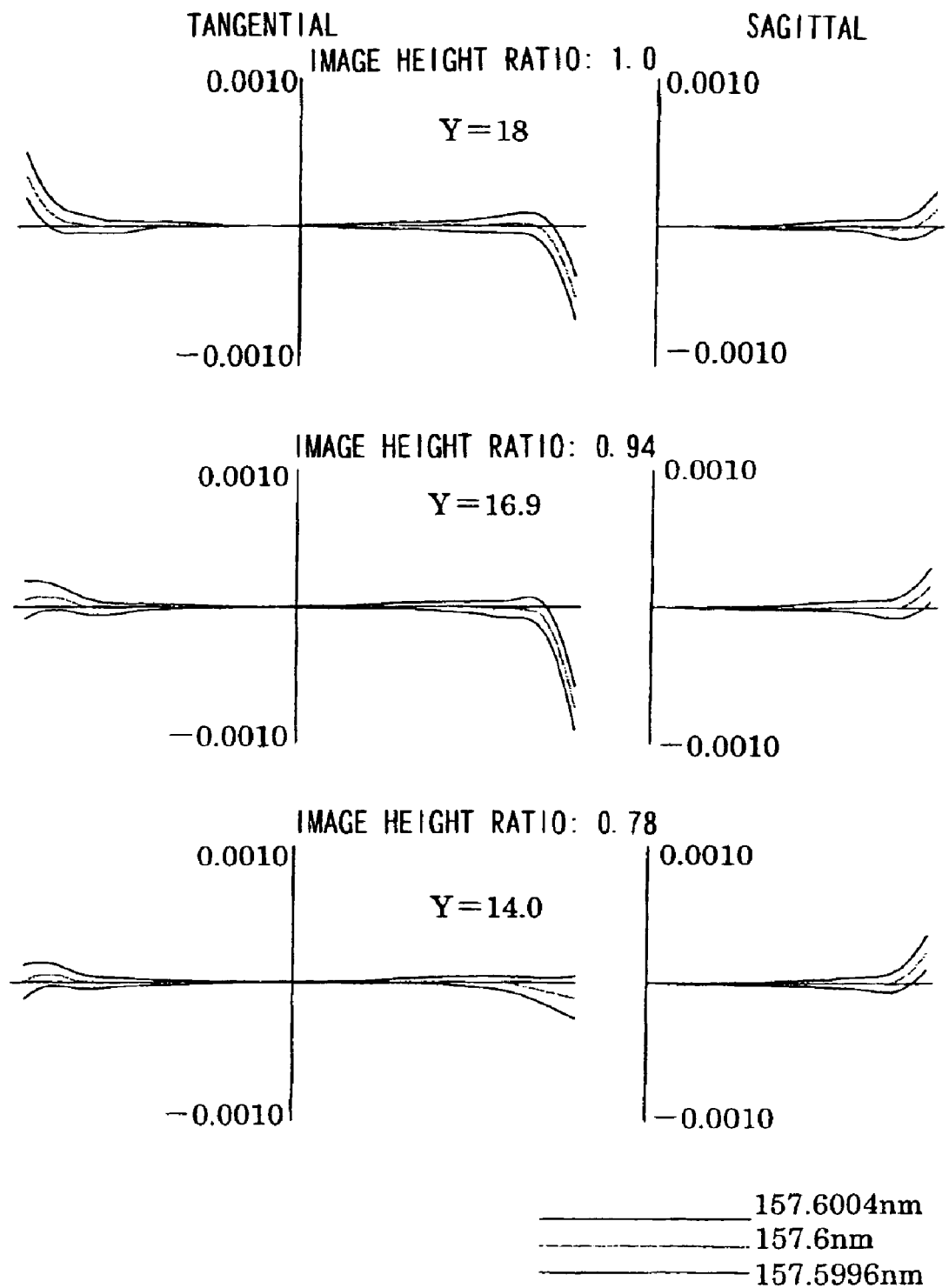
FIG. 24 shows the lateral aberration manifesting at the catadioptric system in the ninth embodiment.
Figure 25:
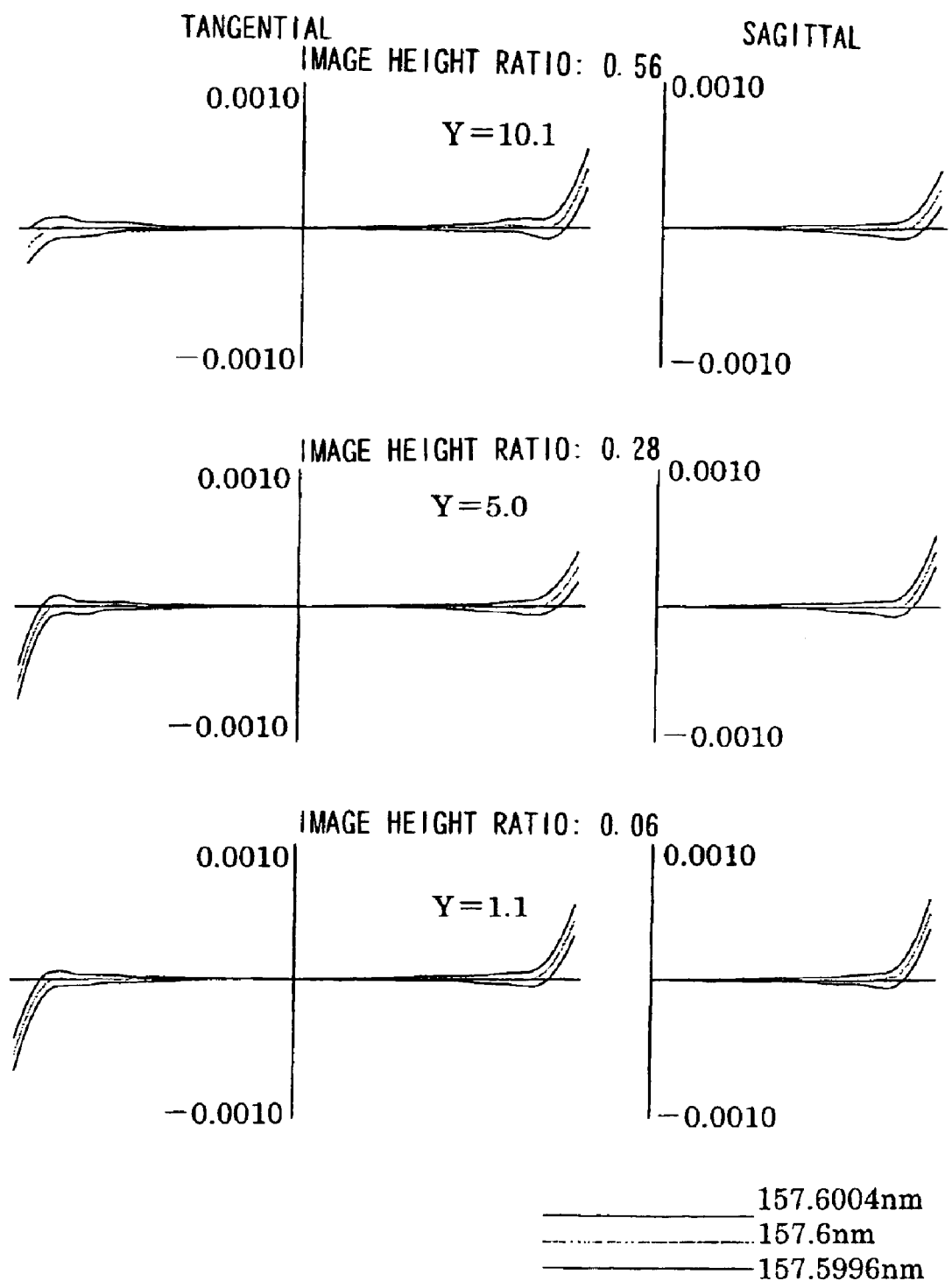
FIG. 25 shows the lateral aberration manifesting at the catadioptric system in the ninth embodiment.

FIGS. 24 and 25 show the lateral aberration occurring in the catadioptric system in the ninth embodiment. In the aberration chart, Y represents the image height (mm). As the aberration chart clearly indicates, the chromatic aberration is properly corrected in the ninth embodiment when the wavelength of the exposure light is within a range of 157.6 nm±0.4 pm, as in the seventh embodiment. In addition, the chart confirms that the spherical aberration, the coma aberration, the astigmatism and the distortion are successfully corrected to an extent to which they are practically non-existent and thus, outstanding image forming performance is achieved.

As described above, an image-side NA of 0.7 is assured in conjunction with $F_2$ laser light with a central wavelength of 157.6 nm, and an image circle with a 17 mm radius in which the various aberrations including the chromatic aberration are fully corrected is assured on the wafer W in the first embodiment. In the second embodiment, an image-side NA of 0.8 is assured in conjunction with $F_2$ laser light with a central wavelength of 157.6 nm, and an image circle with a 21 mm radius in which the various aberrations including the chromatic aberration are fully corrected is assured on the wafer W. In addition, in the third, fifth and sixth embodiments, an image-side NA of 0.8 is assured in conjunction with $F_2$ laser light with a central wavelength of 157.6 nm and an image circle with an 18 mm radius in which the various aberrations including the chromatic aberration are fully corrected is assured on the wafer W. In the fourth embodiment, an image-side NA of 0.6 is assured in conjunction with $F_2$ laser light with a central wavelength of 157.6 nm, and an image circle with a 21 mm radius in which the various aberrations including the chromatic aberration are fully corrected is assured on the wafer W. Furthermore, in the seventh~ninth embodiments, an image-side NA of 0.845 is assured in conjunction with $F_2$ laser light with a central wavelength of 157.6 nm, and an image circle with a 18 mm radius with the various aberrations including the chromatic aberration are fully corrected is assured on the wafer W.

As a result, a high resolution with 0.1 µm or less can be achieved while assuring a sufficiently large rectangular effective exposure area measuring 22 mm×5 mm in the first and second embodiments and assuring a sufficiently large rectangular effective exposure area measuring 22 mm× approximately 6 mm in the fourth embodiment. The pattern at the reticle R can be transferred with a high degree of accuracy through scanning exposure onto individual exposure areas on the wafer W each achieving, for instance, a 22 mm×33 mm size. In addition, a high resolution of 0.1 µm or less can be achieved while assuring a sufficiently large rectangular effective exposure area measuring 20 mm×5 mm in the third and fifth embodiments. In these embodiments, the pattern at the reticle R can be transferred with a high degree of accuracy through scanning exposure onto individual exposure areas on the wafer W each achieving, for instance, a 20 mm×33 mm size. In the sixth embodiment, a high resolution of 0.1 µm or less can be achieved while assuring a sufficiently large circular arc-shaped effective exposure area measuring 20 mm×3 mm. In the sixth embodiment, the pattern at the reticle R can be transferred with a high degree of accuracy through scanning exposure onto individual exposure areas on the wafer W each achieving, for instance, 20 mm×33 mm size. Furthermore, a high resolution of 0.1 µm or less can be achieved while assuring a sufficiently large rectangular effective exposure area measuring 22 mm×4 mm in the seventh~ninth embodiments. In these embodiments, the pattern at the reticle R can be transferred with a high degree of accuracy through scanning exposure onto individual exposure areas on the wafer W each achieving, for instance, a 22 mm×33 m size. It is to be noted that a sufficiently long wafer-side working distance measuring approximately 6 mm can be assured in all of the embodiments described above. Moreover, a sufficiently long mask-side working distance measuring approximately 60 mm~115 mm can be assured in the embodiments.

In addition, in the first embodiment, the lens L41 has the largest effective diameter at approximately 240 mm and the effective diameters of the other lenses are mostly equal to or smaller than 200 mm. In the second embodiment, the concave reflecting mirror M21 has the largest effective diameter among the reflecting mirrors at approximately 250 mm and the lens L41 has the largest effective diameter of approximately 268 mm among the lenses. The effective diameters of the other lenses are mostly equal to or smaller than 200 mm. In addition, in the third embodiment, the lens L41 has the largest effective diameter of approximately 260 mm and the effective diameters of the other lenses are mostly equal to or smaller than 200 mm. In the fourth embodiment, the lens L11 has the largest effective diameter of approximately 235 mm and the effective diameters of the other lenses are mostly equal to or smaller than 200 mm. In the fifth embodiment, the lens L41 has the largest effective diameter of approximately 250 mm and the effective diameters of the other lenses are mostly equal to or smaller than 200 mm. Furthermore, in the sixth embodiment, the lens L41 has the largest effective diameter of approximately 250 mm and the effective diameters of the other lenses are mostly equal to or smaller than 200 mm. In the seventh embodiment, the concave reflecting mirror M21 has the largest effective a diameter among the reflecting mirrors at approximately 260 mm and the lenses L41 and L42 have a largest effective diameter of approximately 280 mm. The effective diameters of the other lenses are mostly equal to or smaller than 190 mm. In the seventh embodiment, the concave reflecting mirror M21 has the largest effective diameter among the reflecting mirrors at approximately 260 mm and the lenses L41 and L42 have the largest effective diameter of approximately 277 mm. The effective diameters of the other lenses are mostly equal to or smaller than 179 mm. In the ninth embodiment, the concave reflecting mirror M21 has the largest effective diameter among the reflecting mirrors at approximately 217 mm and the lenses L41 and L42 have a largest effective diameter of approximately 280 mm. The effective diameters of the other lenses are mostly equal to or smaller than 176 mm. Thus, the sizes of the concave reflecting mirrors and the lenses are kept down to achieve miniaturization of the optical systems in all the embodiments.

Moreover, the number of lenses used to form the image three times in the projection optical system achieved in each of the embodiments described above is extremely small (16 lenses are used in the first and second embodiments, 18 lenses are used in the third and fourth embodiments, 21 lenses are used in the fifth and sixth embodiments, 23 lenses are used in the seventh and eighth embodiments and 21 lenses are used in the ninth embodiment). Since an effective reflection reducing coating cannot be formed in an optical system that uses $F_2$ laser light, the extent of light loss occurring at the lens surfaces tends to be significant if a great number of lenses is employed in the optical system. From this viewpoint, the number of lenses is minimized to reduce the quantity of light loss at the lens surfaces in each of the embodiments described above. In addition, the number of aspherical surfaces used in each of the embodiments is extremely small (12 aspherical surfaces in the first and second embodiments, 14 aspherical surfaces in the third and fourth embodiments, 7 aspherical surfaces in the fifth and sixth the embodiments and 7 aspherical surfaces in the seventh~ninth embodiments), as well.

In the seventh~ninth embodiments, two reflecting mirrors among the two reflecting mirrors M11 and M12 included in the first image forming optical system G1 and the two reflecting mirrors M21 and M22 included in the second image forming optical system G2 are each immediately preceded by a negative lens. More specifically, the negative meniscus lens L21 is set to immediately precede the concave reflecting mirror M21 and the negative meniscus lens 22 is set to immediately precede the concave reflecting mirror M22 in the seventh and eighth embodiments. In the ninth embodiment, on the other hand, the negative meniscus lens L12 is set to immediately precede the concave reflecting mirror M12 and the negative meniscus lens L21 is set to immediately precede the concave reflecting mirror M21. Thus, in the seventh~ninth embodiments, in which a negative lens is set to immediately precede each of the two reflecting mirrors as described above, the magnification factor chromatic aberration and the on-axis chromatic aberration are corrected.

To explain this point in reference to the conditional expression corresponding values presented in Tables (7)~(9), the magnification factor chromatic aberration coefficient LAT and the on-axis chromatic aberration coefficient AX respectively satisfy the following conditional expressions (1) and (2) in the seventh~ninth embodiments.

$$|LAT|<5\times10^{-6} \quad (1)$$

$$|AX|<2\times10^{-4} \quad (2)$$

It is to be noted that the magnification factor chromatic aberration and the on-axis chromatic aberration can be corrected even better by setting the upper limit for the conditional expression (1) to $2.5\times10^{-6}$ and the upper limit for the conditional expression (2) to $1.0\times10^{-4}$.

With the exposure apparatus achieved in any of the embodiments described above, micro devices (semiconductor elements, image-capturing elements, liquid crystal display elements, thin film magnetic heads, etc.) can be manufactured by illuminating the reticle (mask) with the illumination optical system (an illumination step) and then scan-exposing the transfer pattern at the reticle onto a photosensitive substrate with the projection optical system (an exposure step). The following is an explanation of an example of a method that may be adopted to manufacture a micro device, e.g., a semiconductor device, by forming a specific circuit pattern onto a photosensitive substrate such as a wafer with the exposure apparatus achieved in one of the embodiments given in reference to the flowchart presented in FIG. 26.

Figure 26:
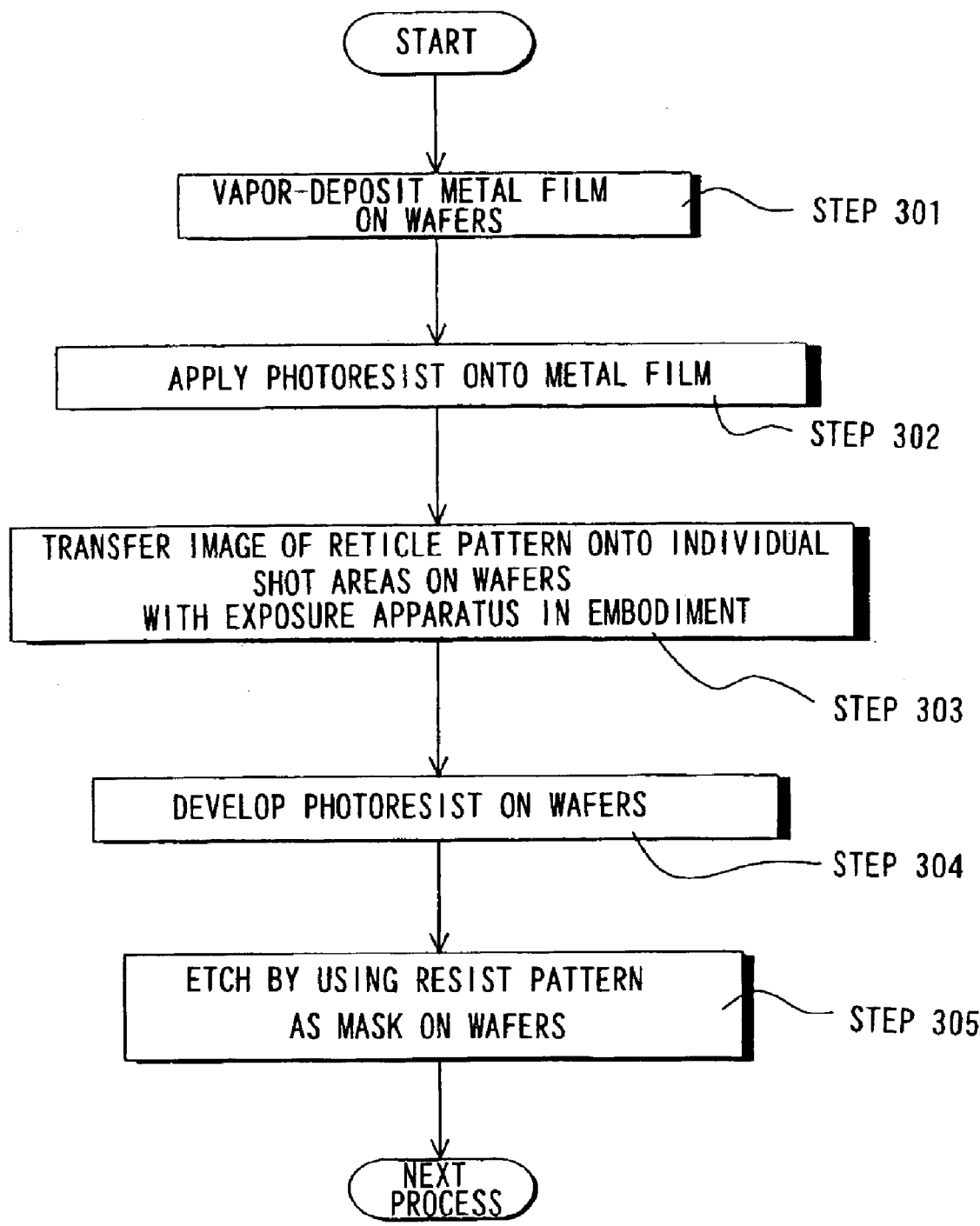
FIG. 26 presents a flowchart of a method adopted to obtain a micro device constituted of a semiconductor device.

First, a metal film is vapor-deposited onto a single lot of wafers in step 301 in FIG. 26. In the following step 302, a photoresist is applied onto the metal film on the single lot of wafers. Then in step 303, an image of the pattern on the reticle is sequentially exposed and transferred onto individual shot areas on the single lot of wafers with the projection optical system achieved in one of the embodiments. In step 304, the photoresist on the single lot of wafers is developed and then, in step 305, the single lot of wafers are etched by using the resist pattern as a mask, thereby forming a circuit pattern corresponding to the pattern at the reticle in the individual shot areas of each wafer. Subsequently, a circuit pattern in an upper layer is formed and the like and thus, a device such as a semiconductor element is manufactured. By adopting the semiconductor device manufacturing method described above, a high throughput is achieved in manufacturing semiconductor devices having extremely fine circuit patterns.

Figure 27:
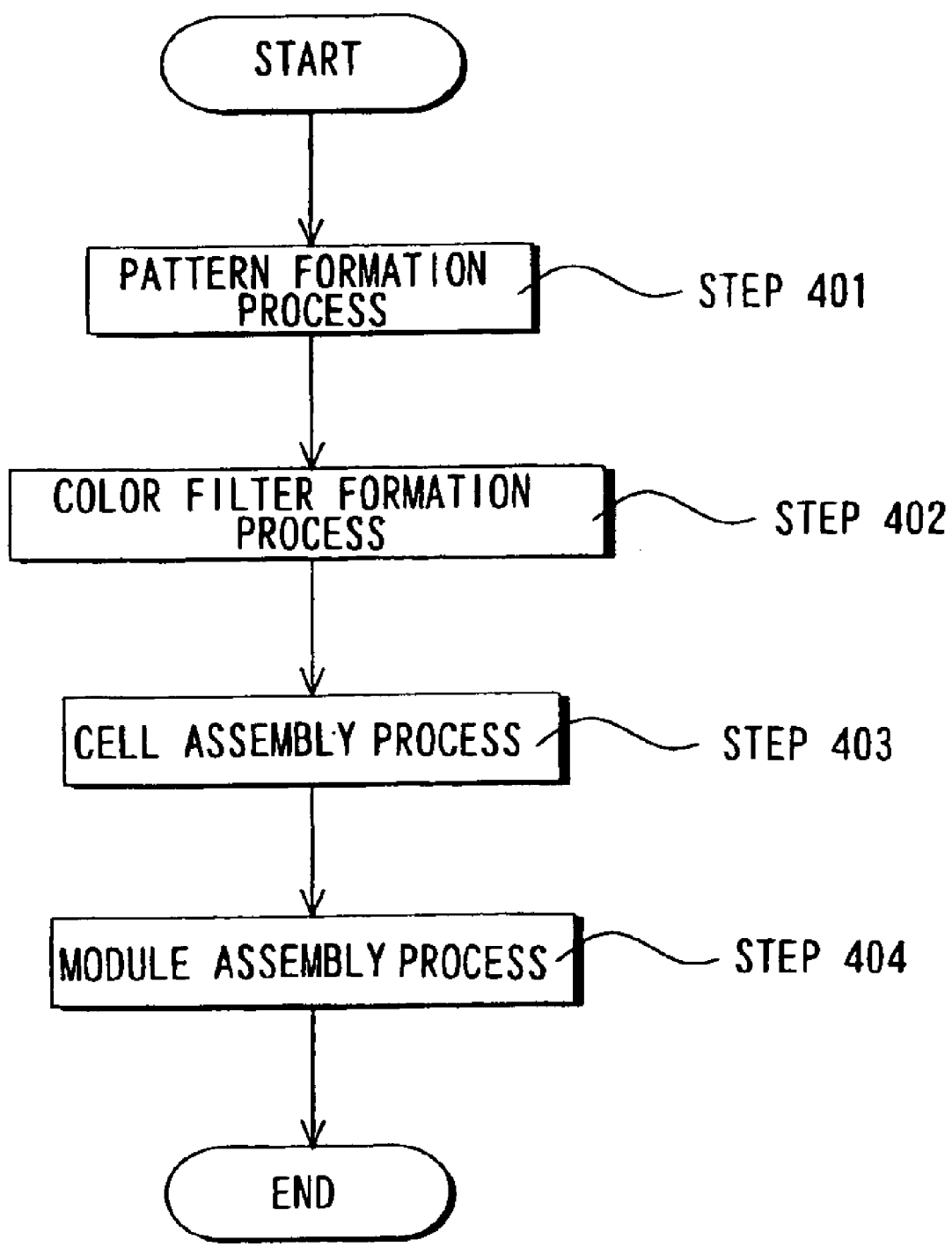
FIG. 27 presents a flowchart of a method adopted to obtain a micro device constituted of a liquid crystal display element.

In addition, the exposure apparatus in any of the embodiments can be employed to manufacture micro devices, e.g., liquid crystal display elements, by forming a specific pattern (a circuit pattern, an electrode pattern, etc.) onto a plate (a glass substrate). The following is an explanation of an example of a manufacturing method that may be adopted, given in reference to the flowchart presented in FIG. 27. In a pattern formation process 401 in FIG. 27, a photolithography process is executed to transfer and expose the pattern at the reticle onto a photosensitive substrate (such as a glass substrate having resist applied thereto) with the exposure apparatus achieved in one of the embodiments. Through this photolithography process, a specific pattern which includes numerous electrodes and the like is formed on the photosensitive substrate. Subsequently, the substrate having undergone the exposure process further undergoes various processes such as a development process, an etching process and a reticle removal process and, as a result, a specific pattern is formed on the substrate. Then, the operation shifts to the next step, i.e., a color filter formation process 402.

In the color filter formation process 402, color filters are formed by arraying numerous dot sets each constituted of three dots corresponding to R (red), G (green) and B (blue) in a matrix pattern or by arraying a plurality of stripe filter sets each constituted of three stripes corresponding to R, G and B along the direction in which the horizontal scanning line extends. Following the color filters formation process 402, a cell assembly process 403 is executed. In the cell assembly process 403, a liquid crystal panel (liquid crystal cell) is assembled by using the substrate with the specific pattern obtained through the pattern formation process 401 and the color filters obtained through the color filter formation process 402. In the cell assembly process 403, a liquid crystal panel (liquid crystal cell) is manufactured by, for instance, injecting liquid crystal between the substrate with the specific pattern obtained through the pattern formation process 401 and the color filters obtained through the color filter formation process 402.

Subsequently, various parts such as an electric circuit and a backlighting system for enabling the assembled liquid crystal panel (liquid crystal cell) to perform a display operation are mounted to obtain a finished product, i.e., a liquid crystal display element, in a module assembly process 404. By adopting the liquid crystal display element manufacturing method described above, a high throughput is achieved in manufacturing liquid crystal display elements with extremely fine circuit patterns.

It is to be noted that while $F_2$ laser capable of supplying light at a wavelength of 157.6 nm is used in the embodiments described above, the present invention is not limited to this example, and it may be adopted in conjunction with a KrF excimer laser which supplies light with a 248 nm wavelength, an ArF excimer laser that supplies light with a 193 nm wavelength or an $Ar_2$ laser that supplies light with a 126 nm wavelength, for instance.

In addition, while the present invention is adopted in a projection optical system of a scanning exposure type exposure apparatus in the embodiments described above, the present invention is not limited to this example and it may be adopted in a projection optical system of a batch exposure type exposure apparatus (stepper type) or any image forming optical system that is not a projection optical system in an exposure apparatus as well.

What is claimed is:

1. A catadioptric system comprising:
a first image forming optical system including, at least, a first reflecting mirror and a second reflecting mirror with the first reflecting mirror set further toward a first plane, in which light from the first plane travels around an outside of the first reflecting mirror and is incident to the second reflecting mirror, light reflected at the second reflecting mirror is incident to the first reflecting mirror and, after light is reflected at the first reflecting mirror, light travels around an outside of the second reflecting mirror so as to form a first intermediate image of the first plane;
a second image forming optical system including, at least, a third reflecting mirror and a fourth reflecting mirror with the third reflecting mirror set further toward the first plane, in which light having traveled via the first image forming optical system travels around an outside of the third reflecting mirror and is incident to the fourth reflecting mirror, light reflected at the fourth reflecting mirror is incident to the third reflecting mirror and, after light is reflected at the third reflecting mirror, light travels around an outside of the fourth reflecting mirror so as to form a second intermediate image of the first plane; and
a refractive type of third image forming optical system that forms a final image of the first plane onto a second plane with light having traveled via the second image forming optical system, wherein:
optical members constituting the first image forming optical system, the second image forming optical system and the third image forming optical system are all disposed along a single linear optical axis.

2. A catadioptric system according to claim 1, wherein:
a field lens is provided in an optical path between the first image forming optical system and the second image forming optical system.

3. A catadioptric system according to claim 1, wherein:
the first image forming optical system includes the two reflecting mirrors and at least one lens element.

4. A catadioptric system according to claim 2, wherein:
a combined optical system comprising the first image forming optical system and the field lens achieves telecentricity toward the first plane and toward the second plane.

5. A catadioptric system according to claim 1, wherein:
the first image forming optical system includes at least one negative lens element provided in an optical path between the first and second reflecting mirrors.

6. A catadioptric system according to claim 1, wherein:
the second image forming optical system includes at least one negative lens element provided in an optical path between the third and fourth reflecting mirrors.

7. A catadioptric system according to claim 1, wherein:
the first image forming optical system and the second image forming optical system are provided so as to achieve substantial symmetry relative to a position at which the first intermediate image is formed.

8. A catadioptric system according to claim 7, wherein:
the intermediate images are formed at positions off the optical axis.

9. A catadioptric system according to claim 1, wherein:
an image over a rectangular or a circular arc-shaped area off the optical axis on the first plane is formed at the second plane.

10. A catadioptric system according to claim 1, further comprising:
a field stop that defines an image area formed at the catadioptric system; and
an aperture stop that defines a numerical aperture of the catadioptric system.

11. A catadioptric system comprising:
a first image forming optical system including, at least, a first reflecting mirror and a second reflecting mirror with the first reflecting mirror set further toward a first plane, in which light from the first plane travels around an outside of the first reflecting mirror and is incident to the second reflecting mirror, light reflected at the second reflecting mirror is incident to the first reflecting mirror and, after light is reflected at the first reflecting mirror, light travels around an outside of the second reflecting mirror so as to form a first intermediate image of the first plane;
a second image forming optical system including, at least, a third reflecting mirror and a fourth reflecting mirror with the third reflecting mirror set further toward the first plane, in which light having traveled via the first image forming optical system travels around an outside of the third reflecting minor and is incident to the fourth reflecting mirror, light reflected at the fourth reflecting mirror is incident to the third reflecting mirror and, after light is reflected at the third reflecting mirror, light travels around an outside of the fourth reflecting mirror so as to form a second intermediate image of the first plane; and
a refractive type of third image forming optical system that forms a final image of the first plane onto a second plane with light having traveled via the second image forming optical system, wherein:
optical members constituting the first image forming optical system, the second image forming optical system and the third image forming optical system are all disposed along a single linear optical axis; and
at least one negative lens is provided immediately before each of two reflecting mirrors among the first reflecting mirror, the second reflecting mirror, the third reflecting mirror and the fourth reflecting mirrors, on a reflecting surface side.

12. A catadioptric system according to claim 11, wherein:
a magnification factor chromatic aberration is corrected by providing the at least one negative lens immediately before each of the two reflecting mirrors on the reflecting surface side; and
a magnification factor chromatic aberration coefficient LAT satisfies a condition expressed as $|LAT|<5\times10^{-6}$.

13. A catadioptric system according to claim 11, wherein:
an on-axis chromatic aberration is corrected by providing the at least one negative lens immediately before each of the two reflecting mirrors on the reflecting surface side; and
an on-axis chromatic aberration coefficient AX satisfies a condition expressed as $|AX|<2\times10^{-4}$.

14. An exposure apparatus comprising:
a projection optical system that forms an image of a pattern onto a photosensitive substrate, wherein:
the projection optical system comprises a catadioptric system according to claim 1; and
the pattern is arranged at the first plane in the catadioptric system and the photosensitive substrate is arranged at the second plane in the catadioptric system.

15. An exposure apparatus according to claim 14, further comprising:
a drive system that causes a mask having the pattern and the photosensitive substrate to move relative to the catadioptric system in order to scan the pattern of the mask to expose onto the photosensitive substrate.

16. A micro device manufacturing method, comprising:
an exposure step in which the pattern is exposed onto the photosensitive substrate with an exposure apparatus according to claim 14; and
a development step in which the photosensitive substrate having undergone the exposure step is developed.

17. An exposure apparatus comprising:
a projection optical system that forms an image of a pattern onto a photosensitive substrate, wherein:
the projection optical system comprises a catadioptric system according to claim 11; and
the pattern is arranged at the first plane in the catadioptric system and the photosensitive substrate is arranged at the second plane in the catadioptric system.

18. An exposure apparatus according to claim 17, further comprising:
a drive system that causes a mask having the pattern and the photosensitive substrate to move relative to the catadioptric system in order to scan the pattern of the mask to expose onto the photosensitive substrate.

19. A micro device manufacturing method, comprising:
an exposure step in which the pattern is exposed onto the photosensitive substrate with an exposure apparatus according to claim 17; and
a development step in which the photosensitive substrate having undergone the exposure step is developed.

20. A catadioptric system which forms an image of a first plane onto a second plane, comprising:
a first image forming optical system;
a second image forming optical system;
a third image forming optical system;
a first intermediate image of the first plane is formed in an optical path between the first image forming optical system and the second image forming optical system;
a second intermediate image, as an image of the first intermediate image, is formed in an optical path between the second image forming optical system and the third image forming optical system; and
a final image, as an image of the second intermediate image, is formed on the second plane,
wherein optical members constituting the first image forming optical system, the second image forming optical system and the third image forming optical system are all disposed along a single linear optical axis,
wherein the optical members include a plurality of mirrors, and
the catadioptric system further comprises an optical path where light travels around an outside of at least one of the plurality of mirrors.

21. A catadioptric system according to claim 20, wherein the optical members include at least four mirrors.

22. A catadioptric system according to claim 21, wherein the first imaging optical system includes at least two mirrors among the at least four mirrors, and the second imaging optical system includes at least two mirrors among the at least four mirrors.

23. A catadioptric system according to claim 22, wherein the optical members include a field lens which is arranged in an optical path between the first imaging optical system and the second imaging optical system.

24. A catadioptric system according to claim 22, wherein the first imaging optical system includes at least one negative lens provided in an optical path between the two mirrors of the first imaging optical system.

25. A catadioptric system according to claim 22, wherein the second imaging optical system includes at least one negative lens provided in an optical path between the two mirrors of the second imaging optical system.

26. A catadioptric system according to claim 20, further comprising another optical path where light travels around an outside of at least another one of the plurality of mirrors.

27. A catadioptric system according to claim 26, wherein the first imaging optical system includes at least two mirrors among at least four mirrors of the catadioptric system, and the second imaging optical system includes at least two mirrors among the at least four mirrors.

28. A catadioptric system according to claim 27, wherein the optical members include a field lens which is arranged in an optical path between the first imaging optical system and the second imaging optical system.

29. A catadioptric system according to claim 27, wherein the first imaging optical system includes at least one negative lens provided in an optical path between the two mirrors of the first imaging optical system.

30. A catadioptric system according to claim 27, wherein the second imaging optical system includes at least one negative lens provided in an optical path between the two mirrors of the second imaging optical system.

31. A catadioptric system according to claim 20, wherein the third imaging optical system has no mirrors.

32. An exposure apparatus comprising:

a projection optical system that forms an image of a pattern onto a photosensitive substrate, wherein:

the projection optical system comprises a catadioptric system according to claim 20; and the pattern is arranged at the first plane in the catadioptric system and the photosensitive substrate is arranged at the second plane in the catadioptric system.

33. An exposure apparatus according to claim 32, further comprising:

a drive system that causes a mask having the pattern and the photosensitive substrate to move relative to the catadioptric system in order to scan the pattern of the mask to expose onto the photosensitive substrate.

34. A micro device manufacturing method, comprising:

an exposure step in which the pattern is exposed onto the photosensitive substrate with an exposure apparatus according to claim 32; and a development step in which the photosensitive substrate having undergone the exposure step is developed.

* * * * *